(12) United States Patent
Blackwell et al.

(10) Patent No.: US 7,495,220 B2
(45) Date of Patent: *Feb. 24, 2009

(54) UNCOOLED INFRARED SENSOR

(75) Inventors: Richard Blackwell, Andover, MA (US); Neal R. Butler, Acton, MA (US); Jacek Mroczkowski, Lexington, MA (US)

(73) Assignee: BAE Systems Information and Electronics Systems Integration Inc., Nashua, NH (US)

( * ) Notice: Subject to any disclaimer, the term of this patent is extended or adjusted under 35 U.S.C. 154(b) by 14 days.

This patent is subject to a terminal disclaimer.

(21) Appl. No.: 11/414,513

(22) Filed: Apr. 28, 2006

(65) Prior Publication Data

US 2007/0120058 A1    May 31, 2007

Related U.S. Application Data

(63) Continuation of application No. 11/211,149, filed on Aug. 24, 2005, now abandoned, which is a continuation of application No. 11/010,826, filed on Dec. 13, 2004, now abandoned, which is a continuation of application No. 10/787,836, filed on Feb. 25, 2004, now abandoned, which is a continuation of application No. 10/444,500, filed on May 23, 2003, now abandoned, which is a continuation of application No. 10/254,444, filed on Sep. 25, 2002, now abandoned, which is a continuation of application No. 10/036,098, filed on Nov. 9, 2001, now abandoned, which is a continuation of application No. 09/797,424, filed on Mar. 1, 2001, now abandoned, which is a continuation of application No. 09/584,939, filed on Jun. 1, 2000, now abandoned, which is a continuation of application No. 09/434,893, filed on Nov. 5, 1999, now abandoned, which is a continuation of application No. 09/291,836, filed on Apr. 14, 1999, now abandoned, which is a continuation of application No. 09/162,977, filed on Sep. 28, 1998, now abandoned, which is a continuation of application No. 08/994,247, filed on Dec. 19, 1997, now abandoned, which is a continuation-in-part of application No. 08/751,516, filed on Nov. 15, 1996, now Pat. No. 5,811,815, and a continuation-in-part of application No. 08/760,240, filed on Dec. 4, 1996, now Pat. No. 5,760,398, and a continuation-in-part of application No. 08/547,344, filed on Oct. 24, 1995, now abandoned, and a continuation-in-part of application No. 08/574,815, filed on Dec. 19, 1995, now Pat. No. 5,763,885, and a continuation-in-part of application No. 08/921,725, filed on Aug. 27, 1997, now abandoned, and a continuation-in-part of application No. 08/914,703, filed on Aug. 19, 1997, now abandoned, and a continuation-in-part of application No. 08/919,889, filed on Aug. 28, 1997, now abandoned.

(60) Provisional application No. 60/007,909, filed on Dec. 4, 1995.

(51) Int. Cl.
*G01J 5/00* (2006.01)
(52) U.S. Cl. .................................. 250/338.1
(58) Field of Classification Search ............... 250/338.1
See application file for complete search history.

(56) References Cited

U.S. PATENT DOCUMENTS

| | | |
|---|---|---|
| 4,651,001 A | 3/1987 | Harada et al. |
| 4,754,139 A | 6/1988 | Ennulat et al. |
| 4,922,116 A | 5/1990 | Grinberg et al. |
| 5,010,251 A | 4/1991 | Grinberg et al. |
| 5,021,663 A | 6/1991 | Hornbeck |
| 5,113,076 A | 5/1992 | Schulte |
| 5,171,733 A | 12/1992 | Hu |
| 5,286,976 A * | 2/1994 | Cole ........................ 250/349 |
| 5,288,649 A | 2/1994 | Keenan |
| 5,300,915 A * | 4/1994 | Higashi et al. ............ 338/22 R |
| 5,369,280 A | 11/1994 | Liddiard |
| 5,399,897 A | 3/1995 | Cunningham et al. |
| 5,401,968 A | 3/1995 | Cox |
| 5,446,284 A | 8/1995 | Butler et al. |
| 5,486,698 A | 1/1996 | Hanson et al. |
| 5,512,748 A | 4/1996 | Hanson |

| | | |
|---|---|---|
| 5,534,111 A | 7/1996 | Hocker et al. |
| 5,602,393 A | 2/1997 | Gerard |
| 5,640,013 A | 6/1997 | Ishikawa et al. |
| 5,647,946 A | 7/1997 | Belcher et al. |
| 5,654,580 A | 8/1997 | Beratan et al. |
| 5,656,848 A | 8/1997 | Beratan et al. |
| 5,672,903 A | 9/1997 | Butler et al. |
| 5,760,398 A | 6/1998 | Blackwell et al. |
| 5,763,885 A | 6/1998 | Murphy et al. |
| 5,811,815 A | 9/1998 | Marshall et al. |
| 6,392,232 B1 * | 5/2002 | Gooch et al. ............ 250/332 |

FOREIGN PATENT DOCUMENTS

| | | |
|---|---|---|
| EP | 0 384 880 A | 8/1990 |
| EP | 0 481 552 A | 4/1992 |
| EP | 0 865 672 B1 | 8/2000 |
| IL | 124691 | 9/2001 |
| JP | 61-024272 A | 6/1986 |
| JP | 06-160174 | 6/1991 |
| JP | 07-500913 | 1/1995 |
| JP | 07-43216 | 2/1995 |
| JP | 07-055558 | 3/1995 |
| JP | 07-509057 | 10/1995 |
| JP | 07-318420 | 12/1995 |
| WO | WO 93/09414 A1 | 5/1993 |
| WO | WO 93/26050 A1 | 12/1993 |
| WO | WO 94/01743 A1 | 1/1994 |
| WO | WO 97/21250 A1 | 6/1997 |

OTHER PUBLICATIONS

Butler, N. et al., "Low Cost Uncooled Microbolometer Imaging System for Dual Use," presented at SPIE, San Diego, CA, Jul. 12, 1995.

Butler, N. et al., "Advanced Microbolometer Digital Output Focal Plane Array," Lockheed Martin IR Imaging Systems, Jul. 1996.

Cole, B.E., et al., "512×512 Infrared Cryogenic Scene Projector Arrays," *Sensors and Actuators A Physical*, A 48(3):193-202 (1995).

\* cited by examiner

*Primary Examiner*—Constantine Hannaher

(74) *Attorney, Agent, or Firm*—Wolf, Greenfield & Sacks, P.C.

(57) ABSTRACT

An uncooled infrared sensor can be used for a plurality of applications such as fire fighting, surveilling a border or any desired area, and limb sounding. The uncooled infrared sensor includes manually or automatically adjustable optics that receive an electromagnetic signal, focus the electromagnetic signal and provide a focused electromagnetic signal to a focal plane array. The focal plane array includes a plurality of detector devices disposed in rows and columns to form the focal plane array. Each detector device is constructed so as to have a reduced pitch and provide a maximum number of detectors within a minimum square area of the focal plane array. Each detector device detects the focused electromagnetic signal incident upon it, converts the focused electromagnetic signal into a sensed signal and outputs the sensed signal so that the focal plane array provides a plurality of sensed signals. The sensor also includes a focal plane array processor that has a plurality of cells corresponding to the plurality of detector devices. The focal plane array processor receives the plurality of sensed signals, processes the plurality of sensed signals to correct for any gain and any offset errors between the plurality of sensed signals due to any inconsistencies between any of the detector devices of the focal plane array and any inconsistencies within the cells of the focal plane array processor itself, and outputs a plurality of processed signals. The sensor also includes a display processor that receives the plurality of processed signals and converts the plurality of processed signals into a video signal suitable for display. The focal plane array processor, the display processor and a controller also provide temperature stabilization of the sensor, manual or automatic calibration of the sensor, manual or automatic gain and level control of the sensor and automatic or manual calibration of the sensor.

19 Claims, 45 Drawing Sheets

UNCOOLED IR SENSOR
AVAILABLE OPTICS
ADJUSTABLE FOCUS LENS ASSEMBLIES

| LOCKHEED MARTIN P/N | APERTURE (mm / in.) | FOV (H) | F/No. | EFL (mm) |
|---|---|---|---|---|
| ADJ-16 | 20.0 / 0.79 | 50.6 | 0.8 | 16.0 |
| ADJ-25 | 31.3 / 1.23 | 33.7 | 0.8 | 25.0 |
| ADJ-33 | 41.3 / 1.62 | 25.8 | 0.8 | 33.0 |
| ADJ-33A | 33 / 1.30 | 25.8 | 1.0 | 33.0 |
| ADJ-50 | 68.5 / 2.70 | 17.2 | 0.8 | 50.0 |
| ADJ-75 | 121.0 / 4.76 | 11.6 | 0.62 | 75.0 |
| ADJ-75A | 93.8 / 3.69 | 11.6 | 0.8 | 75.0 |
| ADJ-100 | 147.1 / 5.79 | 8.7 | 0.68 | 100.0 |
| ADJ-100A | 100.0 / 3.93 | 8.7 | 1.0 | 100.0 |
| ADJ-150 | 150.0 / 5.90 | 5.8 | 1.0 | 150.0 |
| ADJ-200 | 250.0 / 9.84 | 4.3 | 0.8 | 200.0 |

MOTORIZED FOCUS LENS ASSEMBLIES

| P/N | APERTURE (mm / in.) | FOV (H) | F/No. | EFL (mm) |
|---|---|---|---|---|
| MOT-16 | 20.0 / 0.79 | 50.6 | 0.8 | 16.0 |
| MOT-25 | 31.3 / 1.23 | 33.7 | 0.8 | 25.0 |
| MOT-33 | 41.3 / 1.62 | 25.8 | 0.8 | 33.0 |
| MOT-33A | 33 / 1.30 | 25.8 | 1.0 | 33.0 |
| MOT-50 | 68.5 / 2.70 | 17.2 | 0.8 | 50.0 |
| MOT-75 | 121.0 / 4.76 | 11.6 | 0.62 | 75.0 |
| MOT-75A | 93.8 / 3.69 | 11.6 | 0.8 | 75.0 |
| MOT-100 | 147.1 / 5.79 | 8.7 | 0.7 | 100.0 |
| MOT-100A | 100.0 / 3.93 | 8.7 | 1.0 | 100.0 |
| MOT-150 | 150.0 / 5.90 | 5.8 | 1.0 | 150.0 |
| MOT-200 | 250.0 / 9.84 | 4.3 | 0.8 | 200.0 |

A THERMALIZED FOCUS LENS ASSEMBLIES

| P/N | APERTURE (mm / in.) | FOV (H) | F/No. | EFL (mm) |
|---|---|---|---|---|
| THE-18 | 26.2 / 1.03 | 43.0 | 0.8 | 21.0 |
| THE-18A | 23.1 / 0.91 | 40.0 | 0.8 | 18.0 |

FIG. 1A

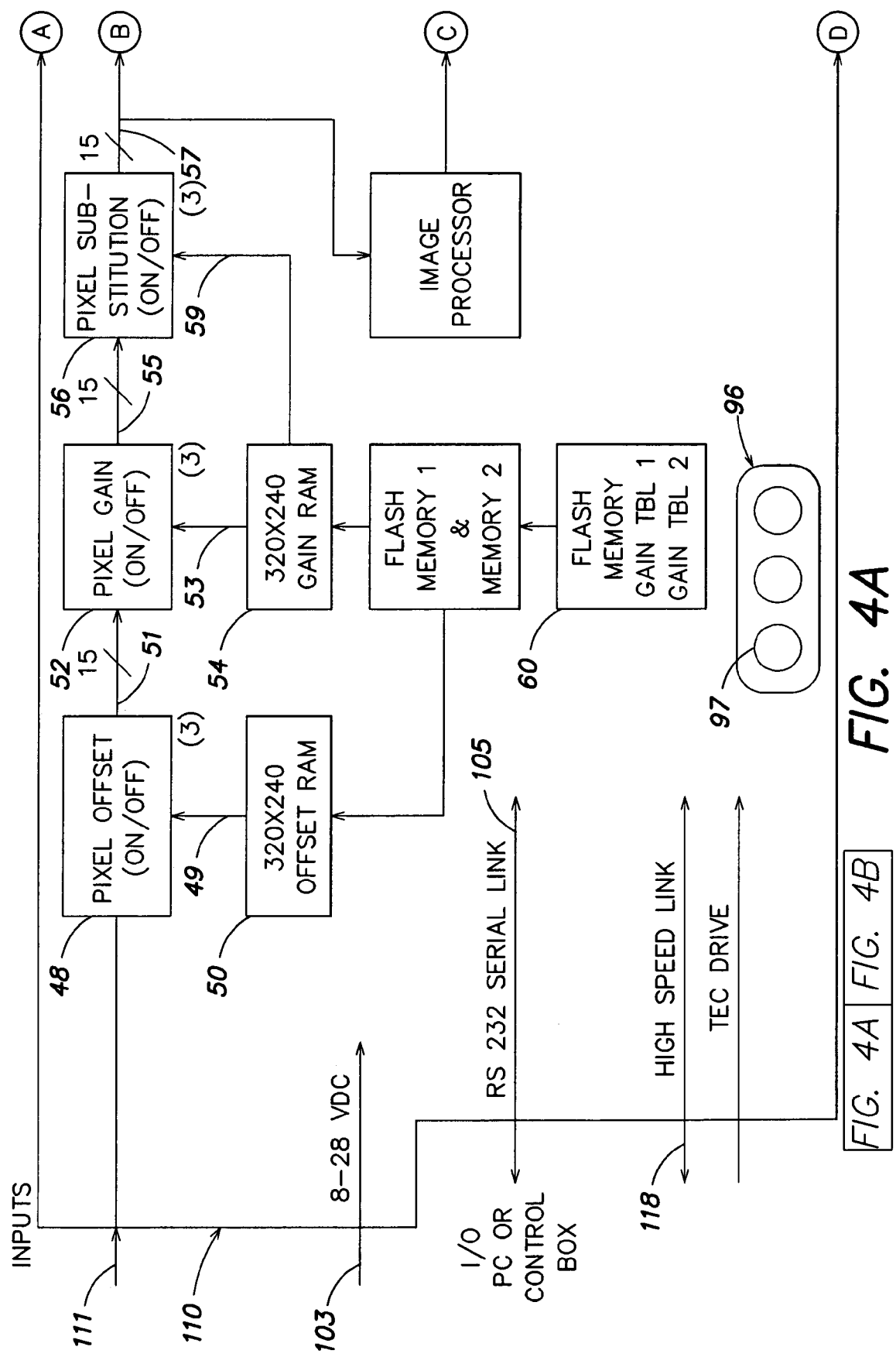

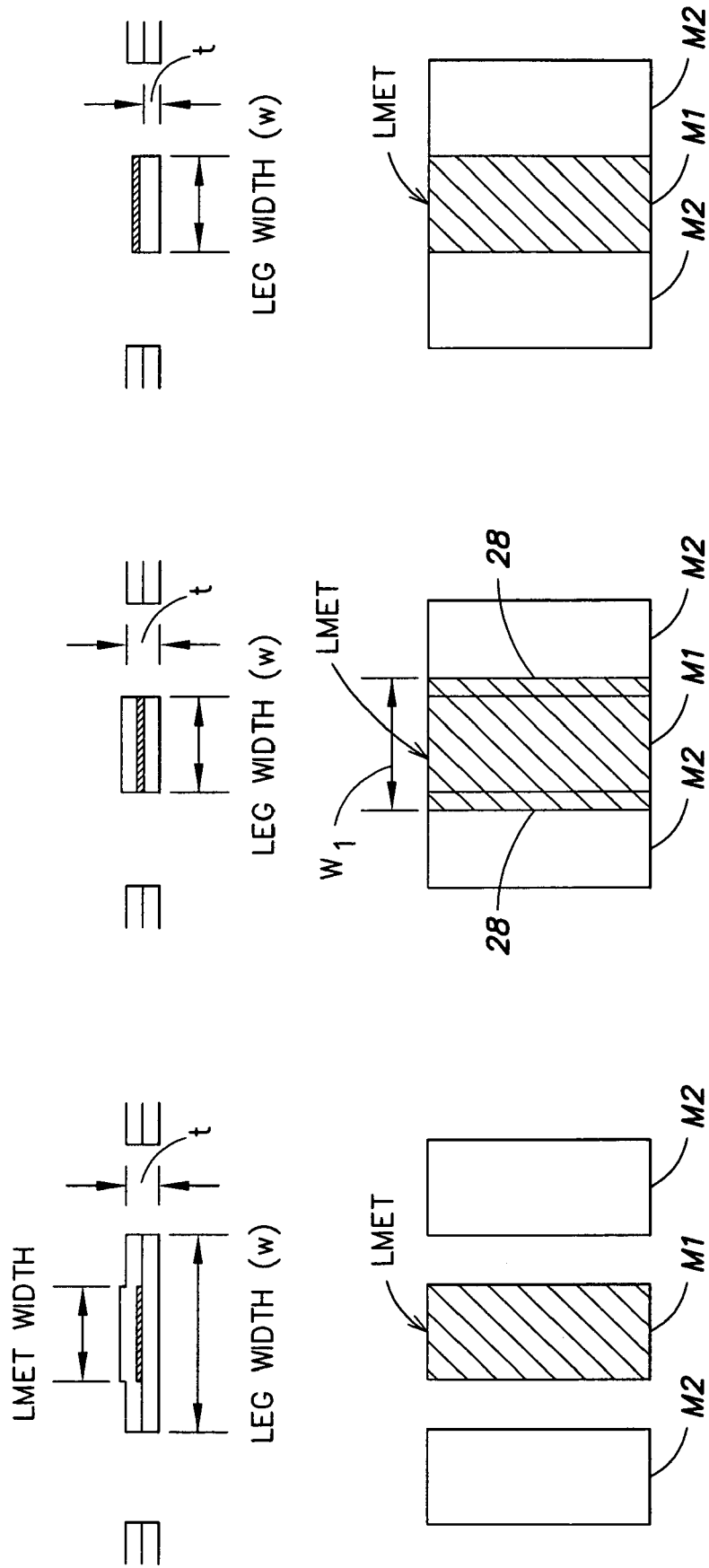

UNCOOLED INFRARED SENSOR

CROSS REFERENCES TO RELATED APPLICATIONS

This application claims the benefit under 35 U.S.C. §120 as a continuation of co-pending U.S. non-provisional application Ser. No. 11/211,149, filed Aug. 24, 2005, which is a continuation of U.S. non-provisional application Ser. No. 11/010,826, filed Dec. 13, 2004, which is a continuation of U.S. non-provisional application Ser. No. 10/787,836, filed Feb. 25, 2004, which is a continuation of Ser. No. 10/444,500, filed May 23, 2003, which is a continuation of Ser. No. 10/254,444, filed Sep. 25, 2002, entitled UNCOOLED INFRARED SENSOR, which is a continuation of Ser. No. 10/036,098, filed Nov. 9, 2001, entitled UNCOOLED INFRARED SENSOR, which is a continuation of Ser. No. 09/797,424, filed Mar. 1, 2001, entitled UNCOOLED INFRARED SENSOR, which is a continuation of Ser. No. 09/584,939, filed Jun. 1, 2000, entitled UNCOOLED INFRARED SENSOR, which is a continuation of Ser. No. 09/434,893, filed Nov. 5, 1999, entitled UNCOOLED INFRARED SENSOR, which is a continuation of Ser. No. 09/291,836 filed Apr. 14, 1999, entitled UNCOOLED INFRARED SENSOR, which is a continuation of Ser. No. 09/162,977 filed Sep. 29, 1998, entitled UNCOOLED INFRARED SENSOR, which is a continuation of Ser. No. 08/994,247 filed Dec. 19, 1997, entitled UNCOOLED INFRARED SENSOR, which in turn is a continuation-in-part (CIP) of the following U.S. non-provisional applications or patents:

Ser. No. 08/751,516 filed Nov. 15, 1996, entitled A DUAL-BAND MULTI-LEVEL MICROBRIDGE DETECTOR, now U.S. Pat. No. 5,811,815;

Ser. No. 08/760,240, filed Dec. 4, 1996, entitled INFRARED RADIATION DETECTOR HAVING A REDUCED ACTIVE AREA, now U.S. Pat. No. 5,760,398;

Ser. No. 08/547,344, filed Oct. 24, 1995 entitled UNCOOLED FOCAL PLANE ARRAY SENSOR;

Ser. No. 08/574,815, filed Dec. 19, 1995, entitled METHOD AND APPARATUS FOR THERMAL GRADIENT STABILIZATION OF MICROBOLOMETER FOCAL PLANE ARRAYS, now U.S. Pat. No. 5,763,885;

Ser. No. 08/921,725, filed Aug. 27, 1997, entitled MONOLITHIC ANALOG-TO-DIGITAL CONVERTER;

Ser. No. 08/914,703, filed Aug. 19, 1997, entitled DIGITAL OFFSET CONVERTER; and Ser. No. 08/919,889, filed Aug. 28, 1997, entitled BOLOMETRIC FOCAL PLANE ARRAY.

This application also claims the benefit under 35 U.S.C. §120 of each of the following U.S. Non-Provisional Applications, as at least one of the above-identified U.S. Non-provisional Applications similarly is entitled to the benefit of at least one of the following Non-provisional Applications:

Ser. No. 08/450,339, filed May 25, 1995, entitled MONOLITHIC ANALOG-TO-DIGITAL CONVERTER;

Ser. No. 08/496,026, filed Jun. 28, 1995, entitled DIGITAL OFFSET CONVERTER; and Ser. No. 08/521,266, filed Aug. 30, 1995, entitled BOLOMETRIC FOCAL PLANE ARRAY.

Each of the foregoing applications or patents is hereby incorporated herein by reference.

BACKGROUND OF THE INVENTION

1. Field of the Invention

The invention relates generally to uncooled infrared sensors, and in particular, the invention relates to various features and applications of an infrared uncooled sensor.

2. Discussion of the Related Art

A radiation detector is a device that produces an output signal which is a function of an amount of radiation that is incident upon an active region of the radiation detector. Infrared detectors are those radiation detectors which are sensitive to radiation in the infrared region of the electromagnetic spectrum. An infrared detector may be, for example, a thermal detector. A thermal detector detects radiation based upon a change in the temperature of an active region of the detector due to absorption of the radiation to be detected.

Thermal imaging sensors having a plurality of thermal detectors that detect a representation of an object by the objects' thermal emissions. In particular, energy emitted by an object is dependent on numerous quantities such as, for example, the emissitivity and the temperature of the object. Infrared thermal sensors typically detect one or both of these quantities and use the detected information to produce an image capable of being visualized by a user of the sensor.

Infrared detectors may be classified as, for example, either cryogenic (typically liquid nitrogen temperatures) or uncooled detectors. Cryogenic infrared detectors are typically made of small band gap (about 0.1-0.2 eV) semiconductors such as HgCdTe and operate as photo diodes or photo-capacitors by photon absorption to produce electron-hole pairs. In contrast, uncooled infrared detectors do not make use of the small band gap semiconductor device because the band gap is too small at, for example, room temperature such that any signal swamps the detector. Consequently uncooled infrared detectors may be less sensitive than cryogenic detectors but do not require a cooling apparatus or its associated energy consumption. For portable, low-power applications where the sensitivity of cryogenic detectors is not needed, the preferred choice is an uncooled thermal detector. A thermal detector may be any of three types typically: a pyroelectric detector, a thermocouple or a bolometer.

An array of bolometer detector devices may be formed integrally with an integrated circuit. The integrated circuit may be used to process electrical signals produced by the array of bolometers in response to the infrared energy impinging on the array of bolometers. In such an array, each of the bolometers includes an infrared energy receiving surface which is made of a material that has its resistivity change as its temperature changes, in response to the infrared energy impinging on and being absorbed by the material. Thus as the bolometer absorbs radiation, both its temperature and electrical resistance change. A measure of radiation absorbed by a bolometer can be made by measuring changes in its electrical resistance. For example, by placing the bolometer in series with a voltage supply, the current in the bolometer will vary in accordance with the infrared energy sensed by the bolometer. An electronic read-out circuit connected to the voltage supply and serially connected to the bolometer may be used to produce an output signal representative of the infrared energy impinging on the material. An array of such bolometers will produce a plurality of output electrical signals that may be fed to a processor and used to provide the electronic image of the source of the infrared energy.

Such infrared sensors have numerous applications such as missile guidance, thermal imaging, target acquisition, target tracking and law enforcement surveillance. Several prior art references disclose infrared imaging systems, methods, and arrays that make up such infrared sensors. The present invention is an improvement to an uncooled infrared imaging sensor.

SUMMARY OF THE INVENTION

An embodiment of an infrared sensor of the present invention includes an optical element that receives an electromagnetic signal, focuses the electromagnetic signal and provides a focused electromagnetic signal to a focal plane array. The focal plane array of the sensor includes a plurality of detector devices disposed in columns and rows to form the focal plane array. Each detector within the focal plane array detects the focused electromagnetic signal incident upon the detector device, converts the focused electromagnetic signal into a sensed signal and outputs the sensed signal so that the focal plane array provides a plurality of sensed signals at an output of the focal plane array. The sensor also includes a focal plane array processor having a plurality of cells associated with corresponding detector devices of the focal plane array. The focal plane array processor receives the plurality of sensed signals, processes the plurality of sensed signals to correct any gain and any offset errors between each of the plurality of sensed signals due to any inconsistencies between each of the detector devices and the cells of the focal plane array processor, and provides a plurality of corrected signals at an output of the focal plane array processor. The sensor further includes a display processor that receives the plurality of corrected signals and converts the plurality of corrected signals into a video signal suitable for output to a display.

BRIEF DESCRIPTION OF THE DRAWINGS

Other objects and features of the present invention will become apparent from the following detailed description when taken in connection with the following drawings. It is to be understood that the drawings are for the purpose of illustration only and are not intended as a definition of the limits of the invention.

Figure 2:
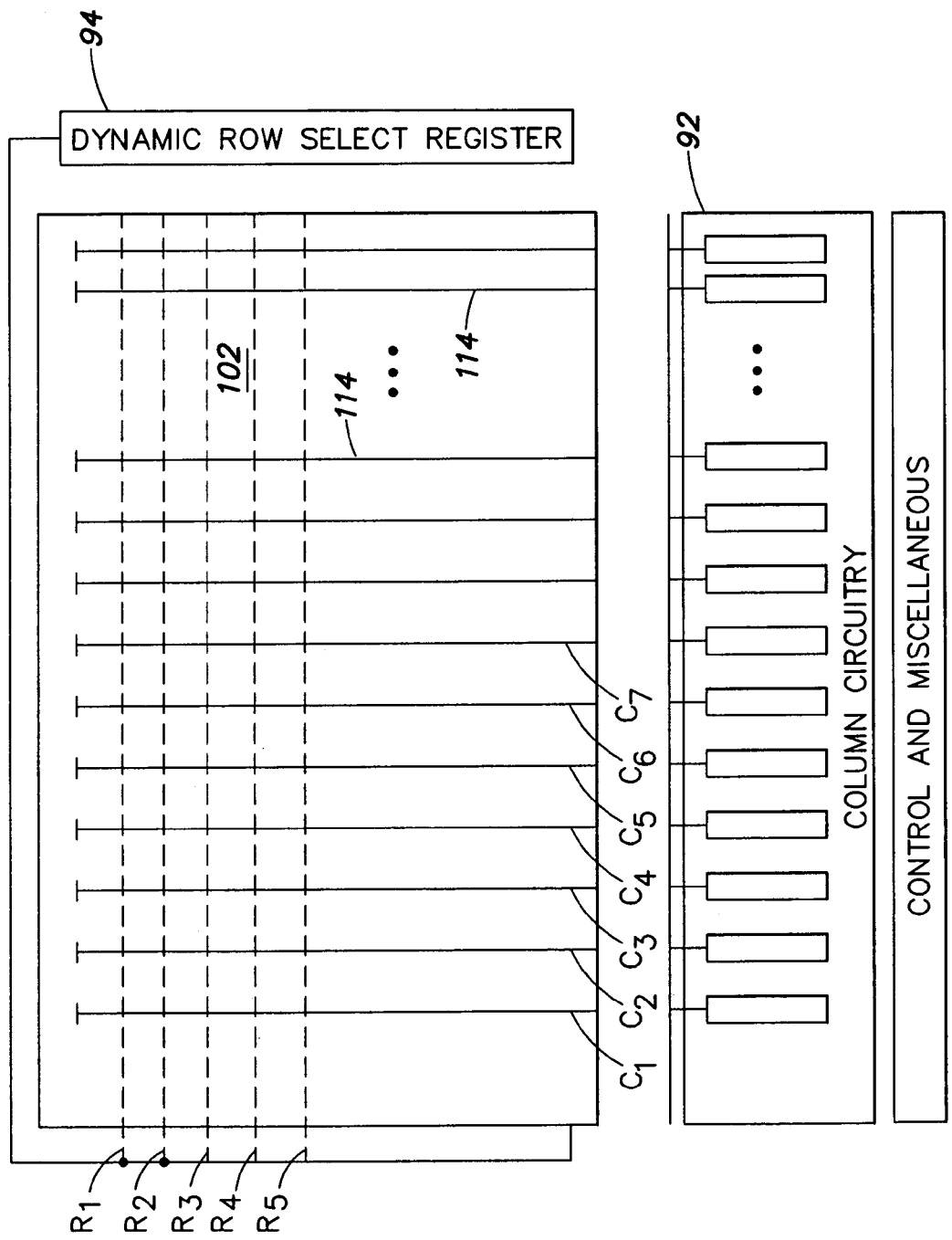
Figure 3:
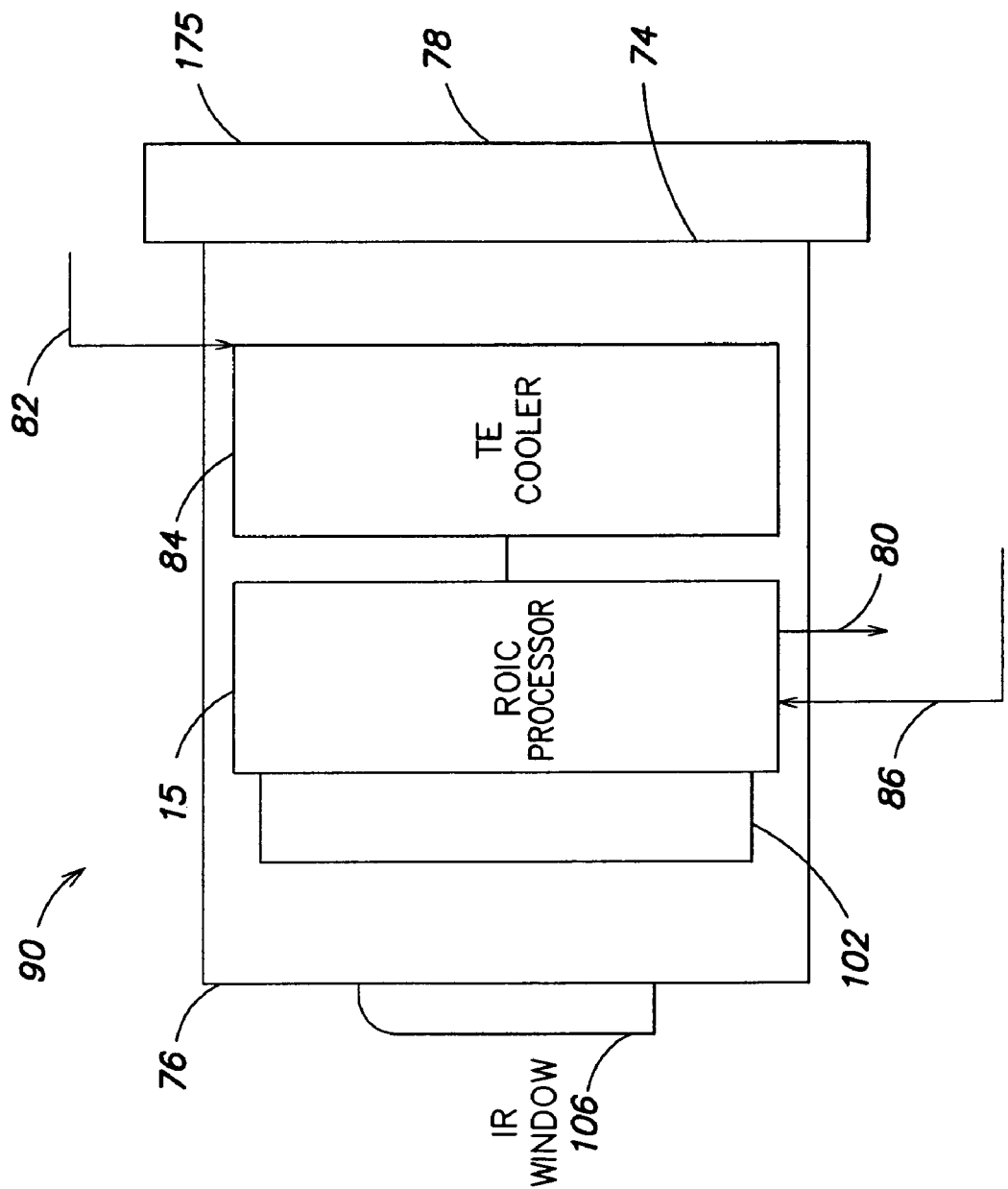
Figure 4B:
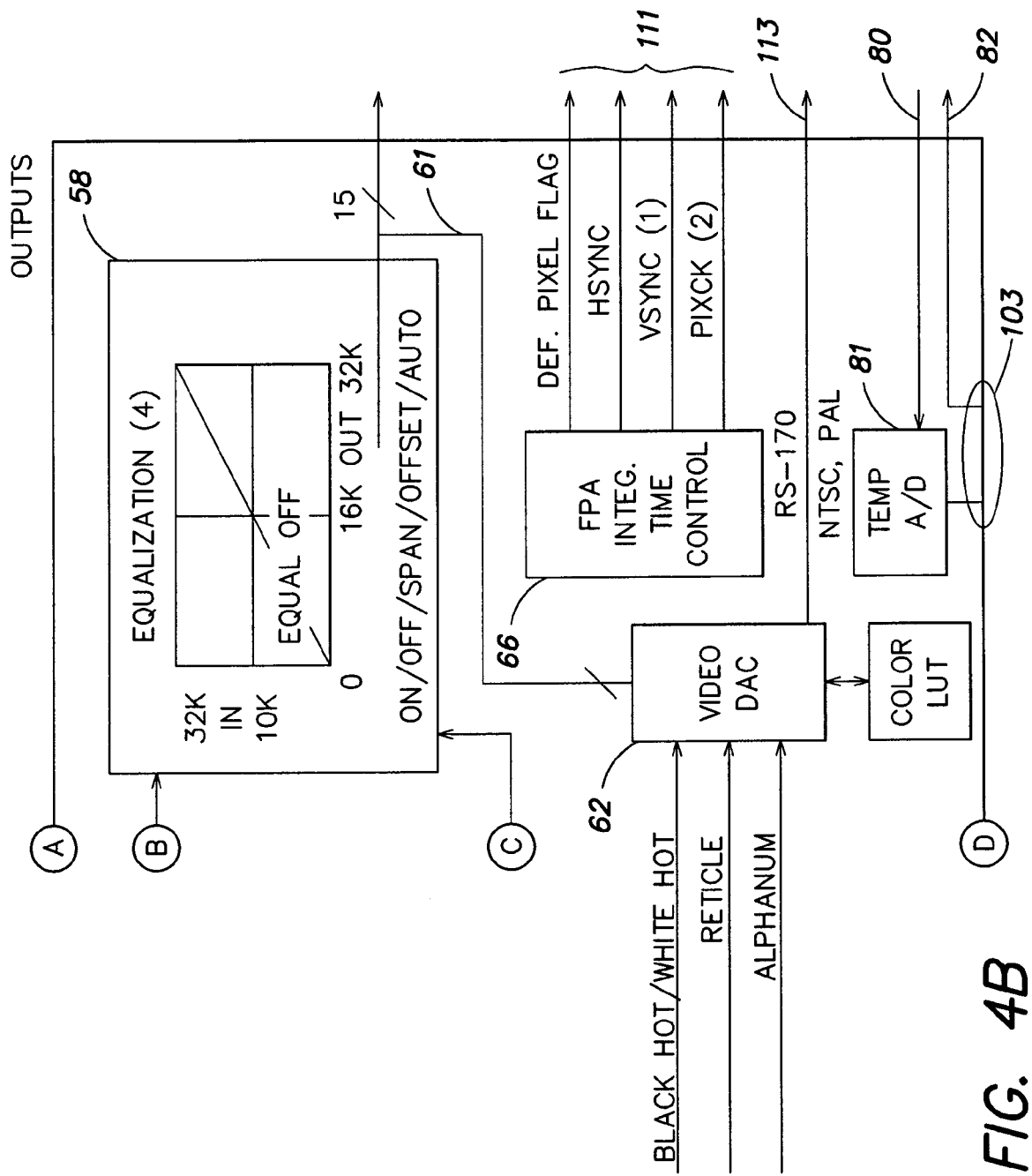
Figure 5:
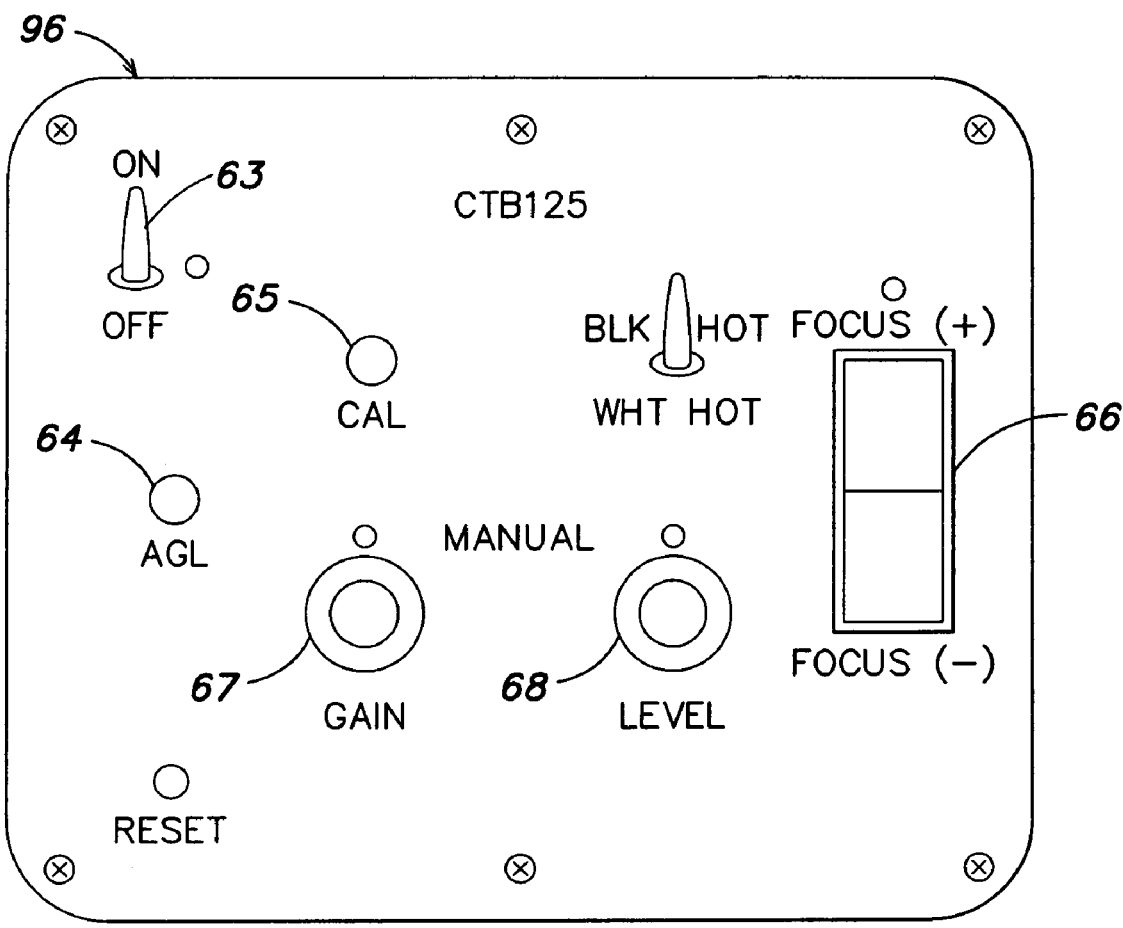
Figure 6:
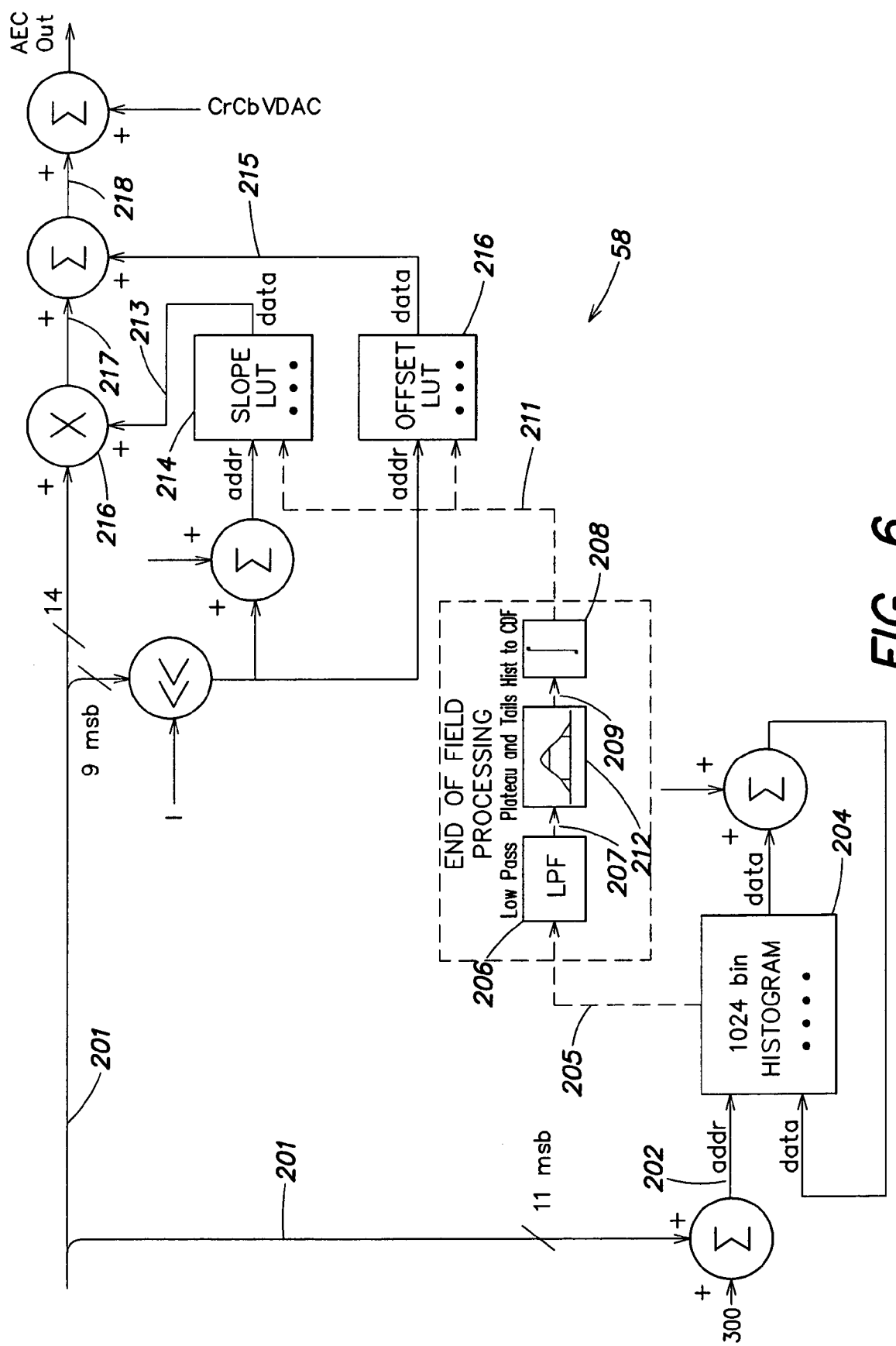
Figure 7:
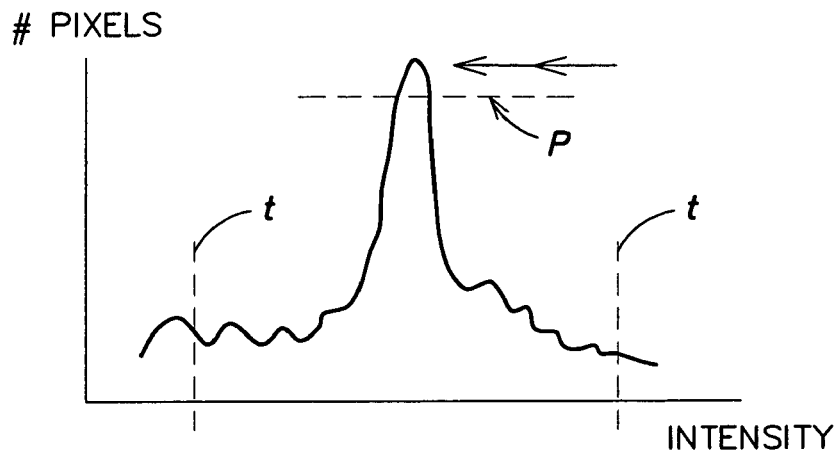
Figure 8:
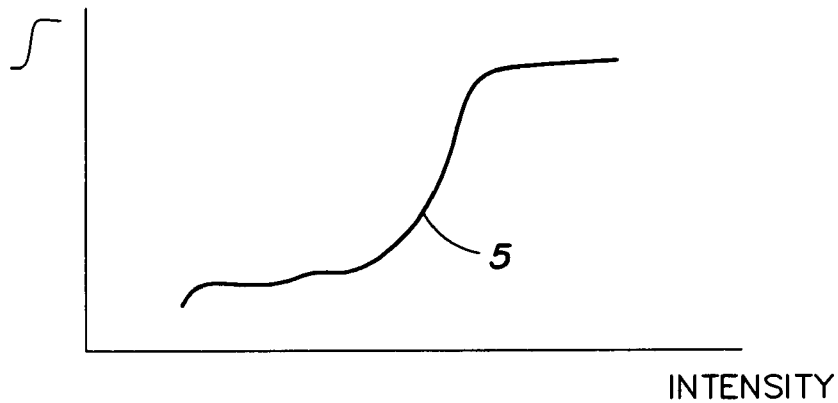
Figure 9:
Figure 10:
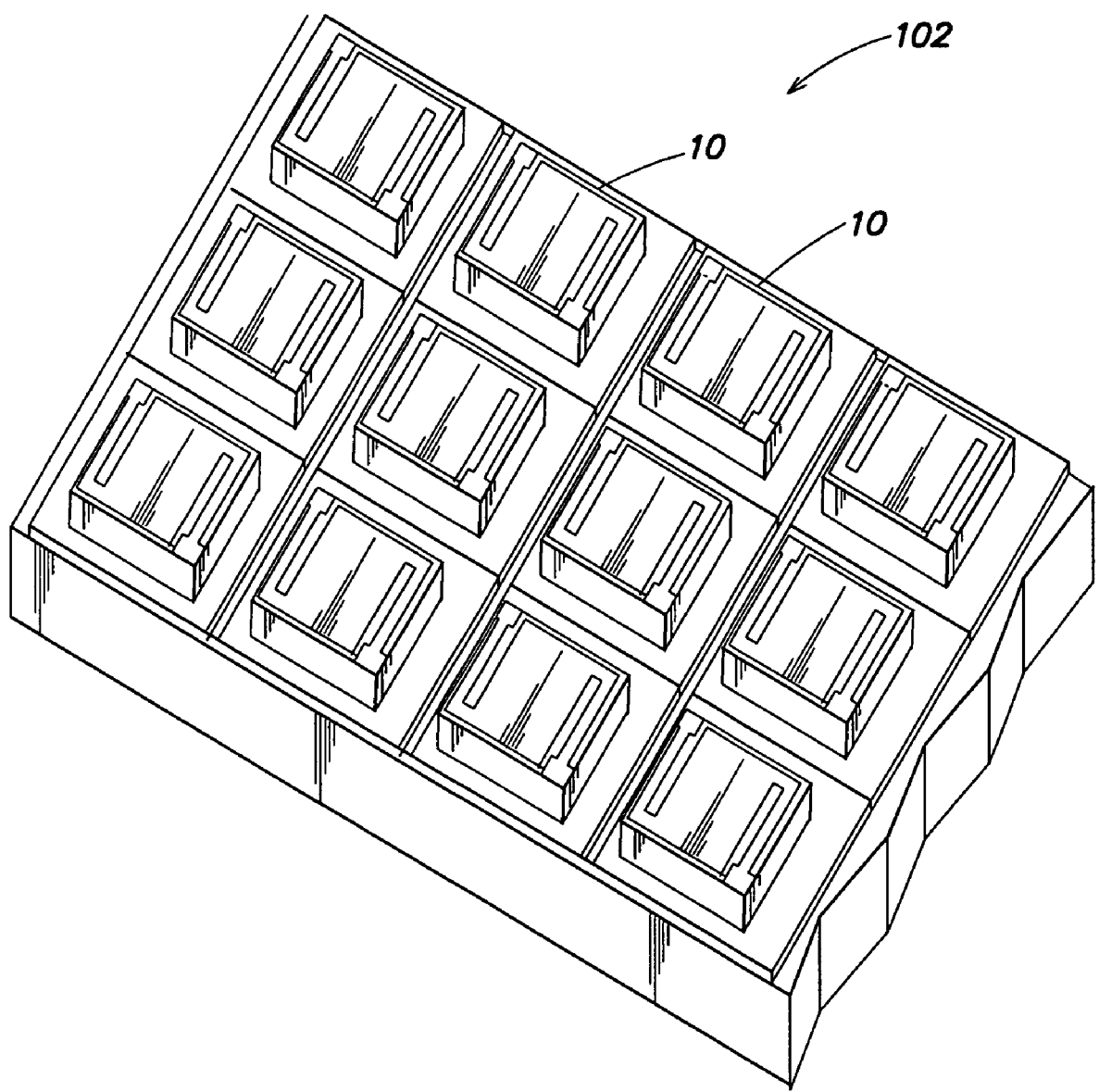
Figure 11:
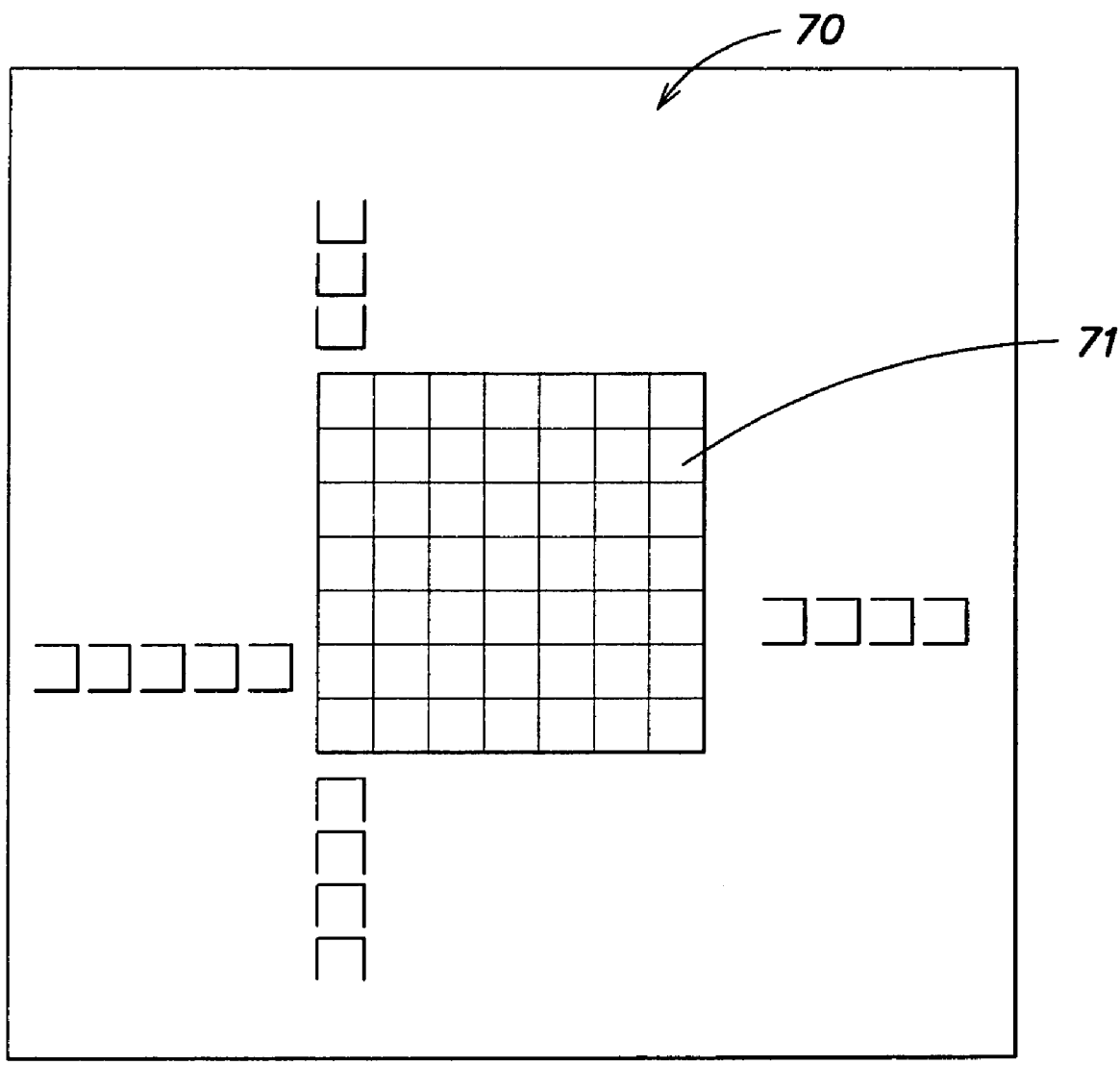
Figure 12:
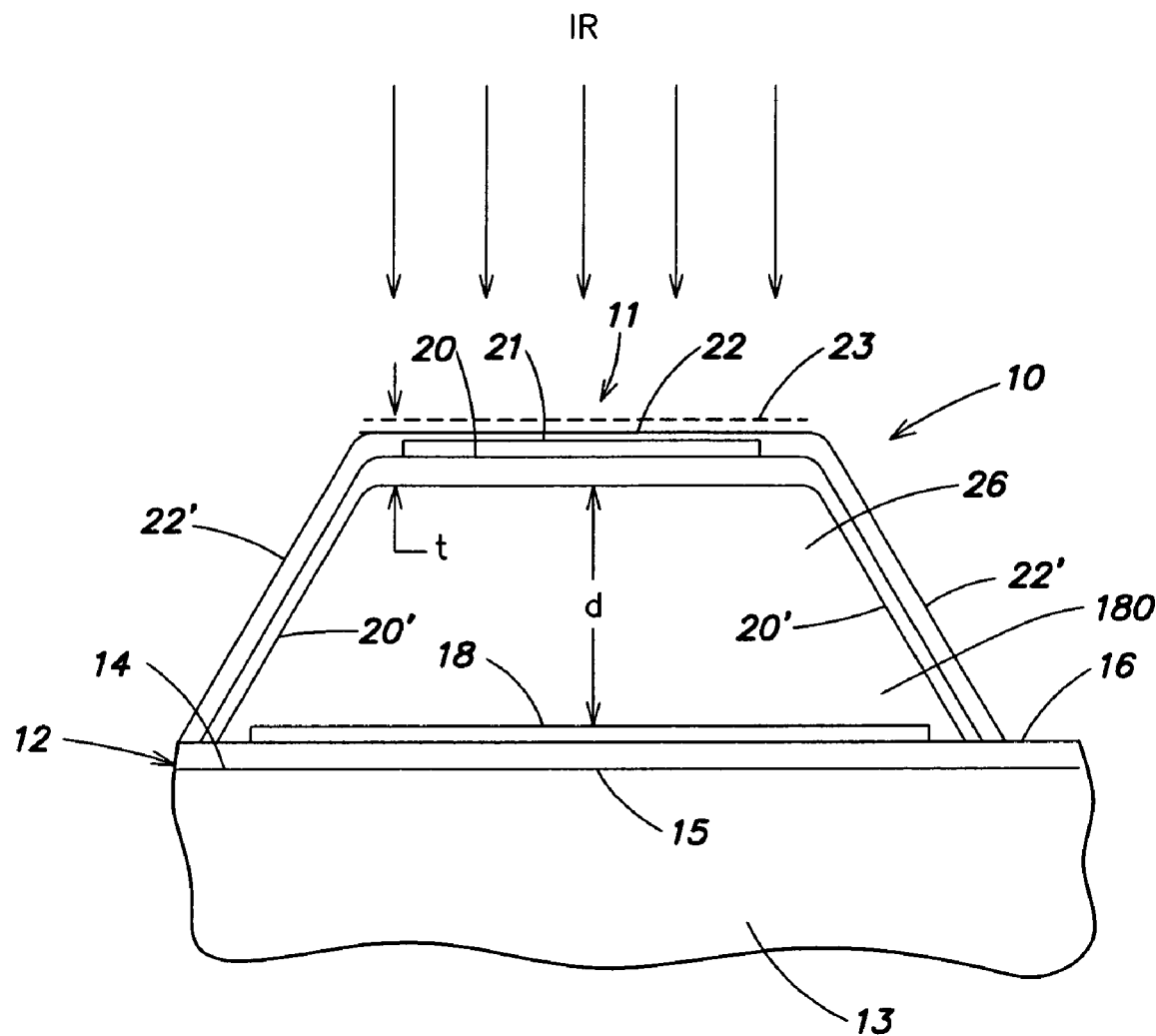
Figure 13:
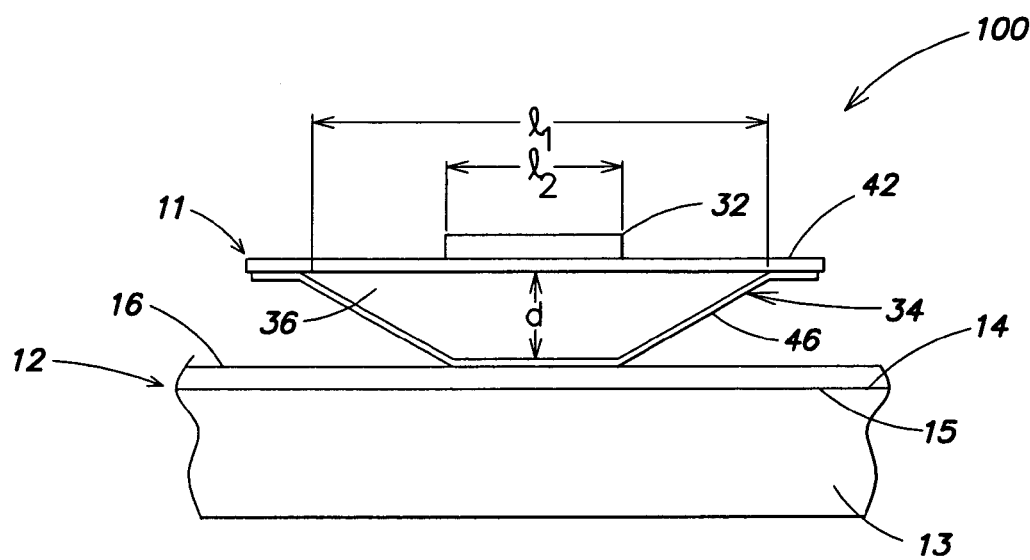
Figure 14:
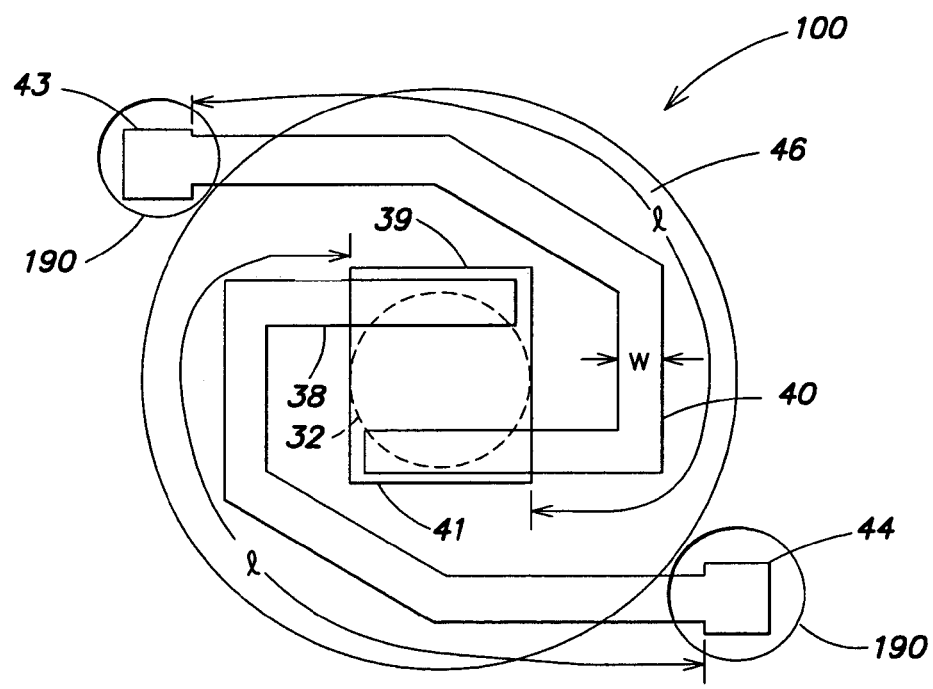
Figure 16A:
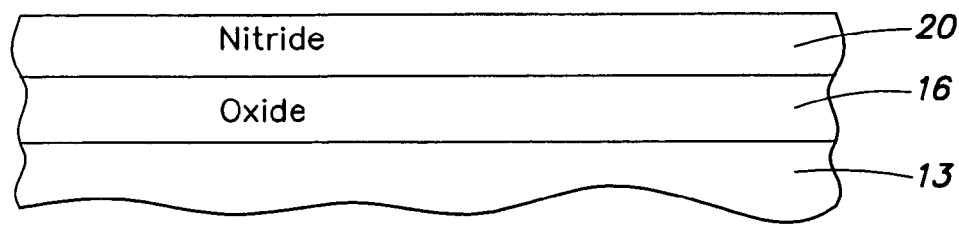
Figure 16B:
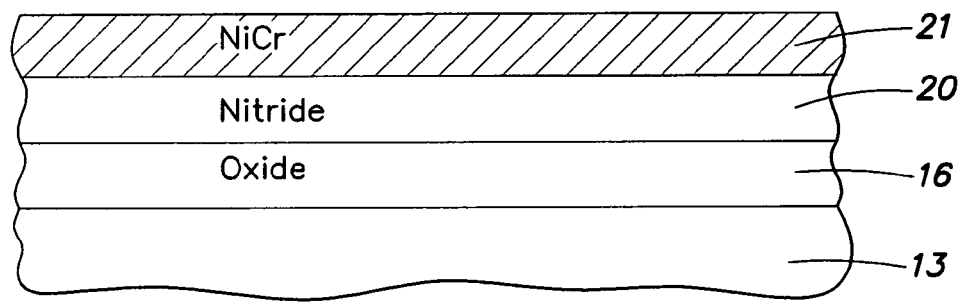
Figure 16C:
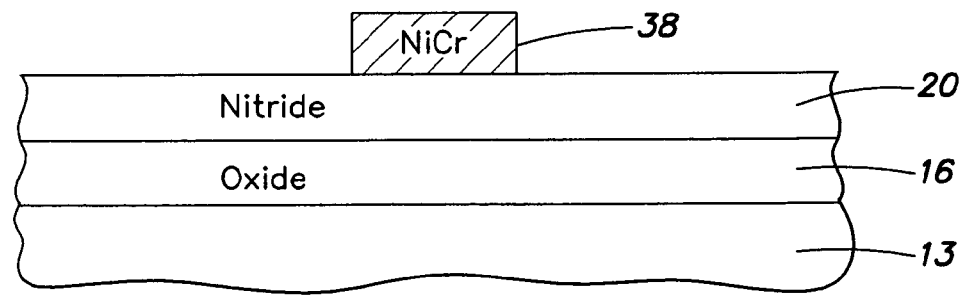
Figure 16D:
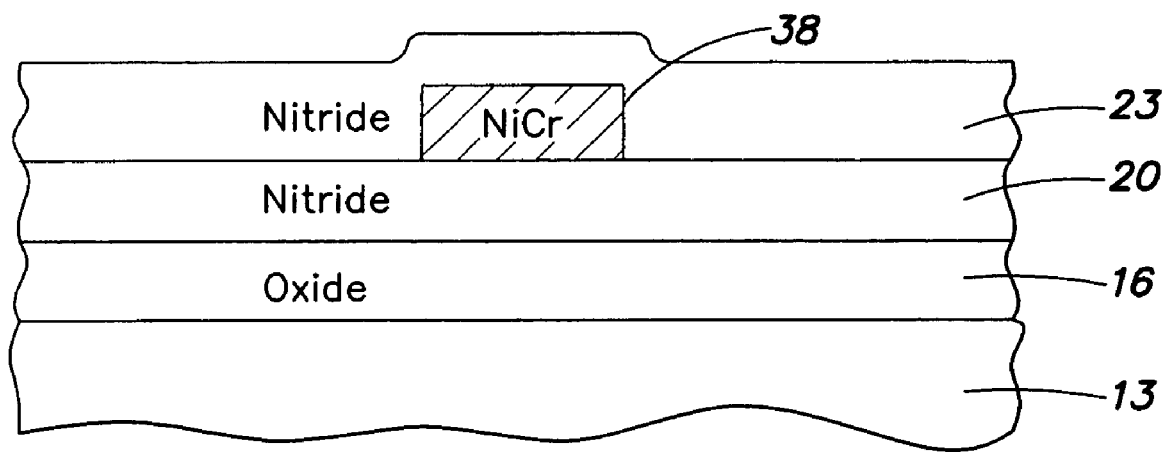
Figure 16E:
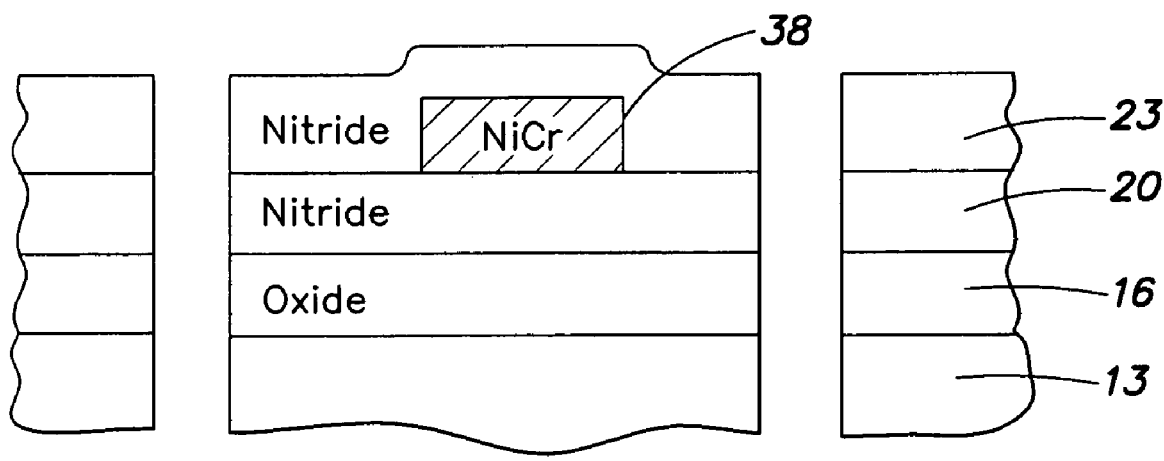
Figure 17A:
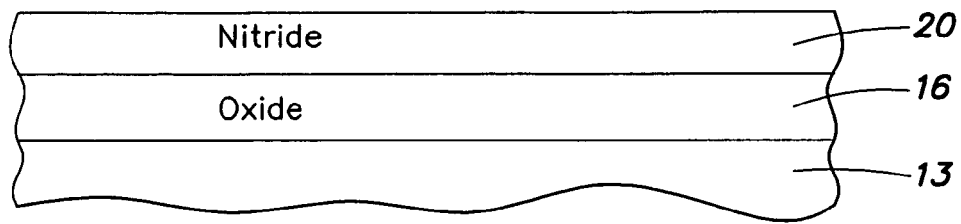
Figure 17B:
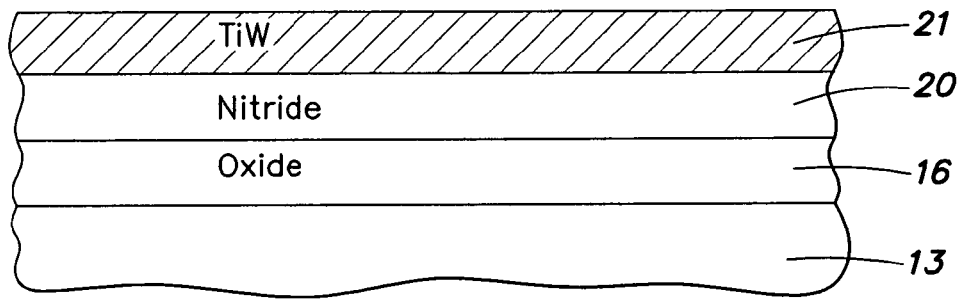
Figure 17C:
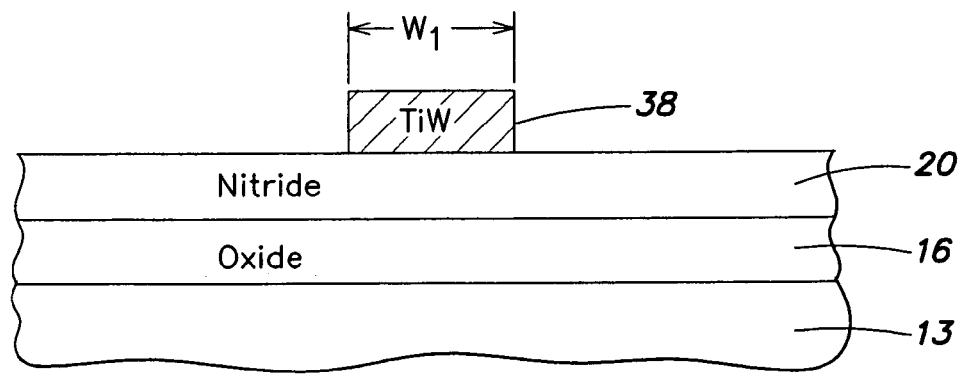
Figure 17D:
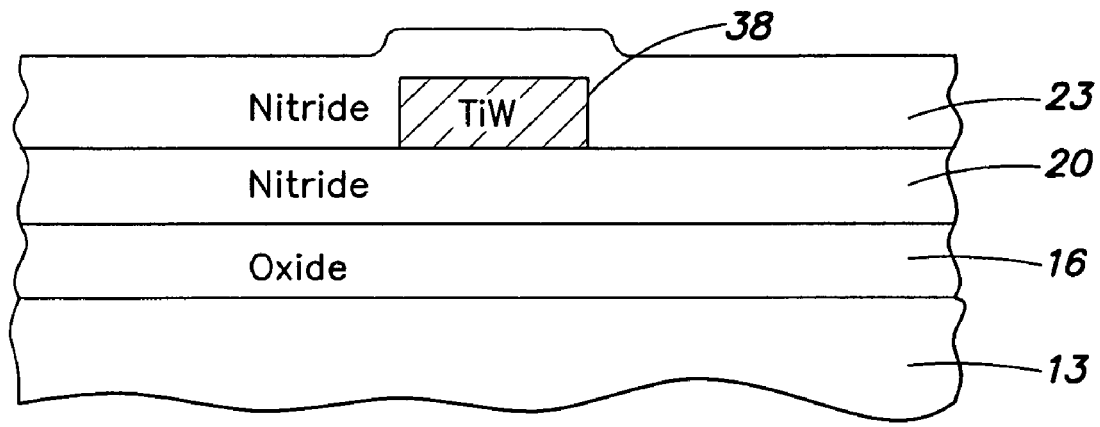
Figure 17E:
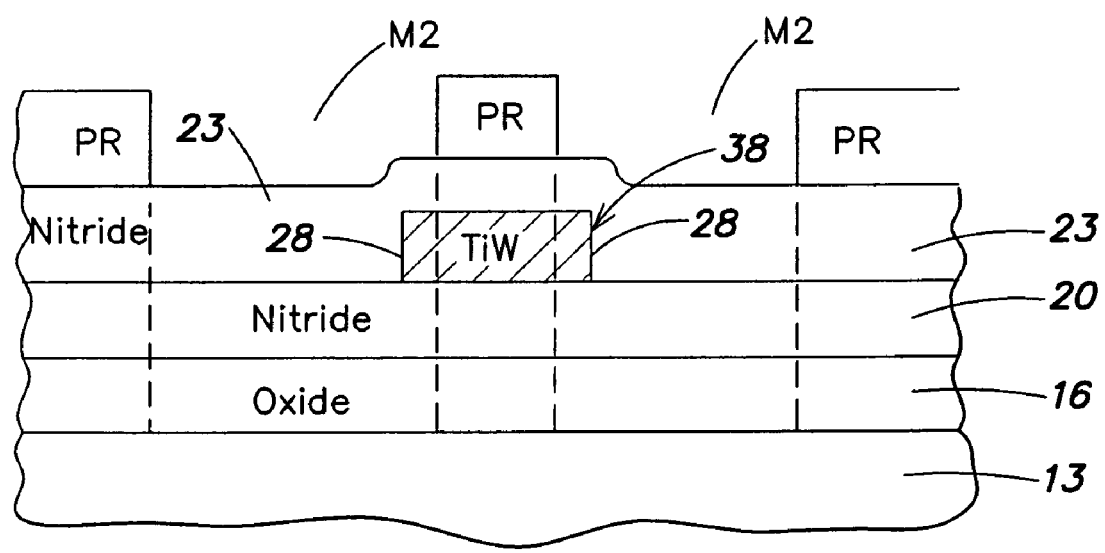
Figure 18A:
Figure 18B:
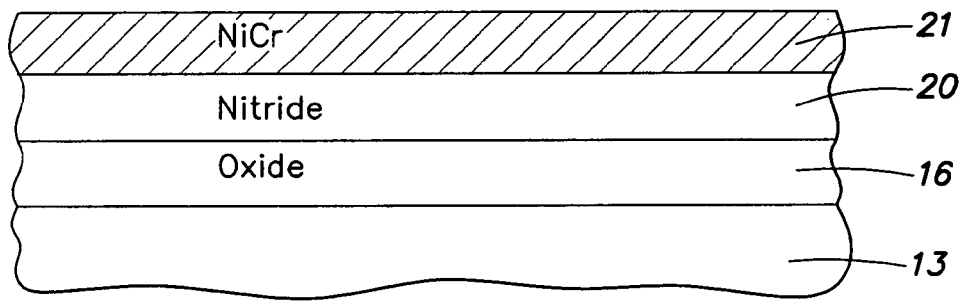
Figure 18C:
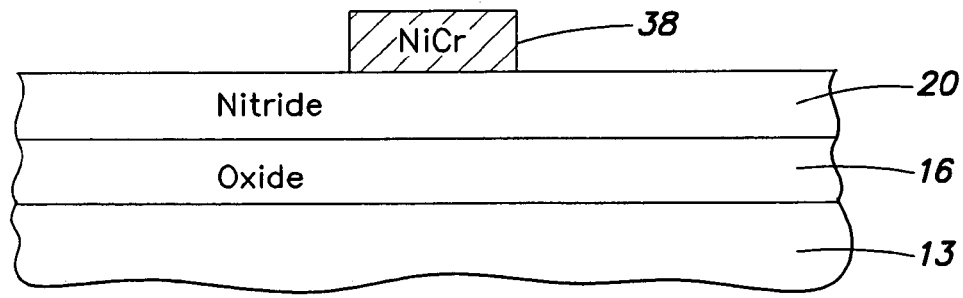
Figure 18D:
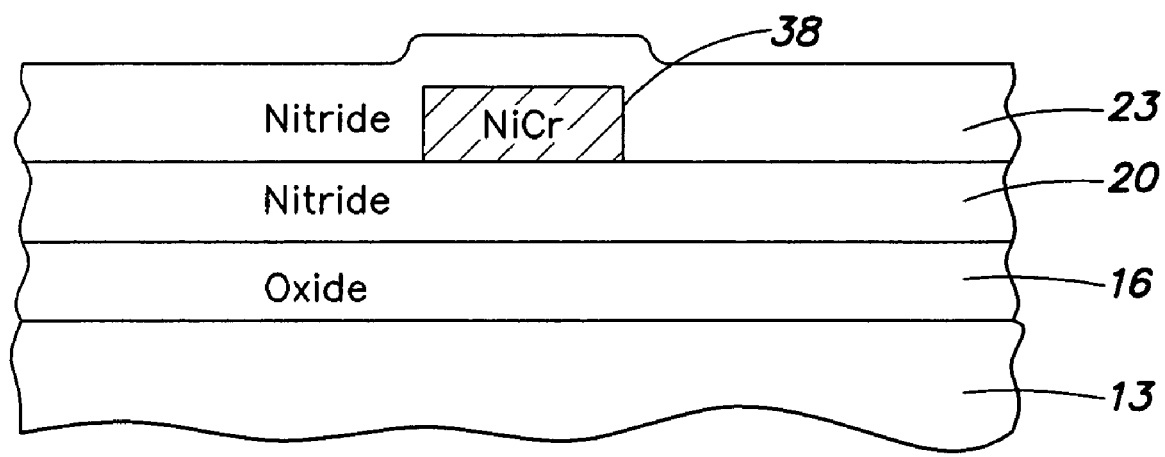
Figure 18E:
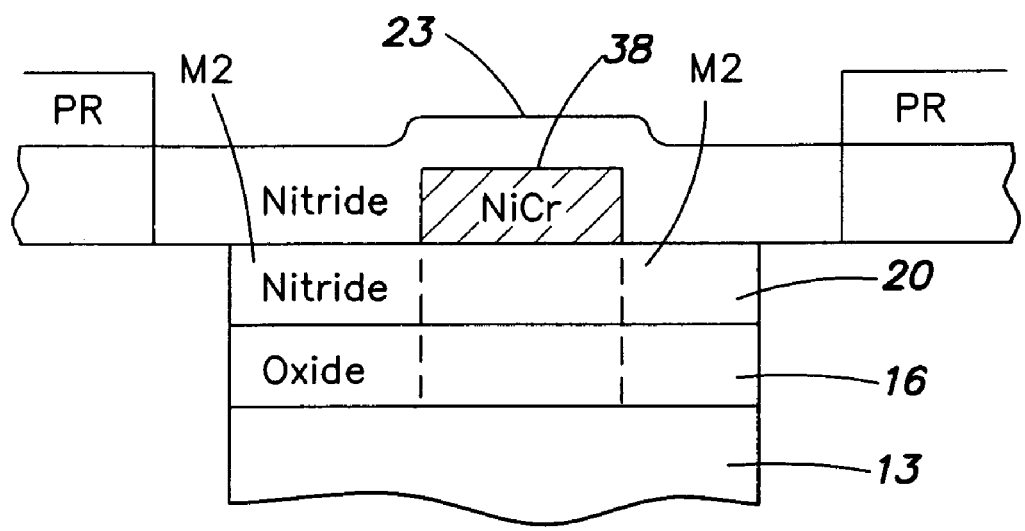
Figure 19:
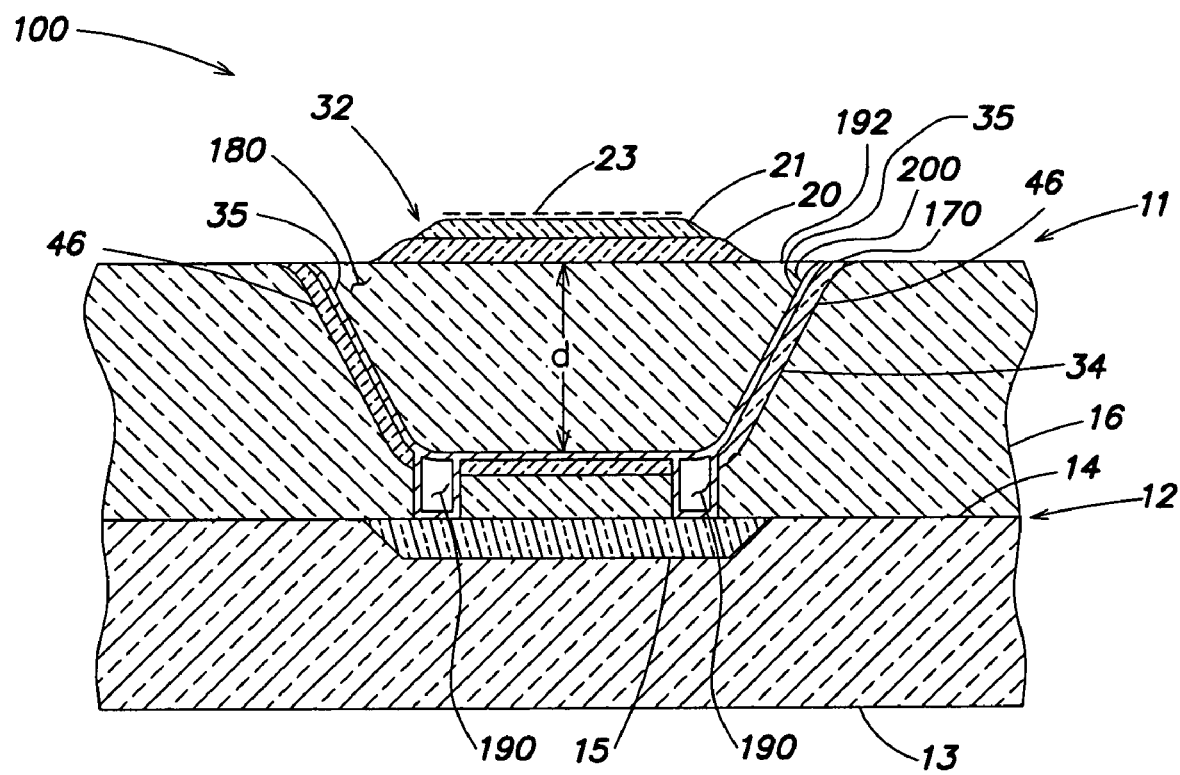
Figure 20:
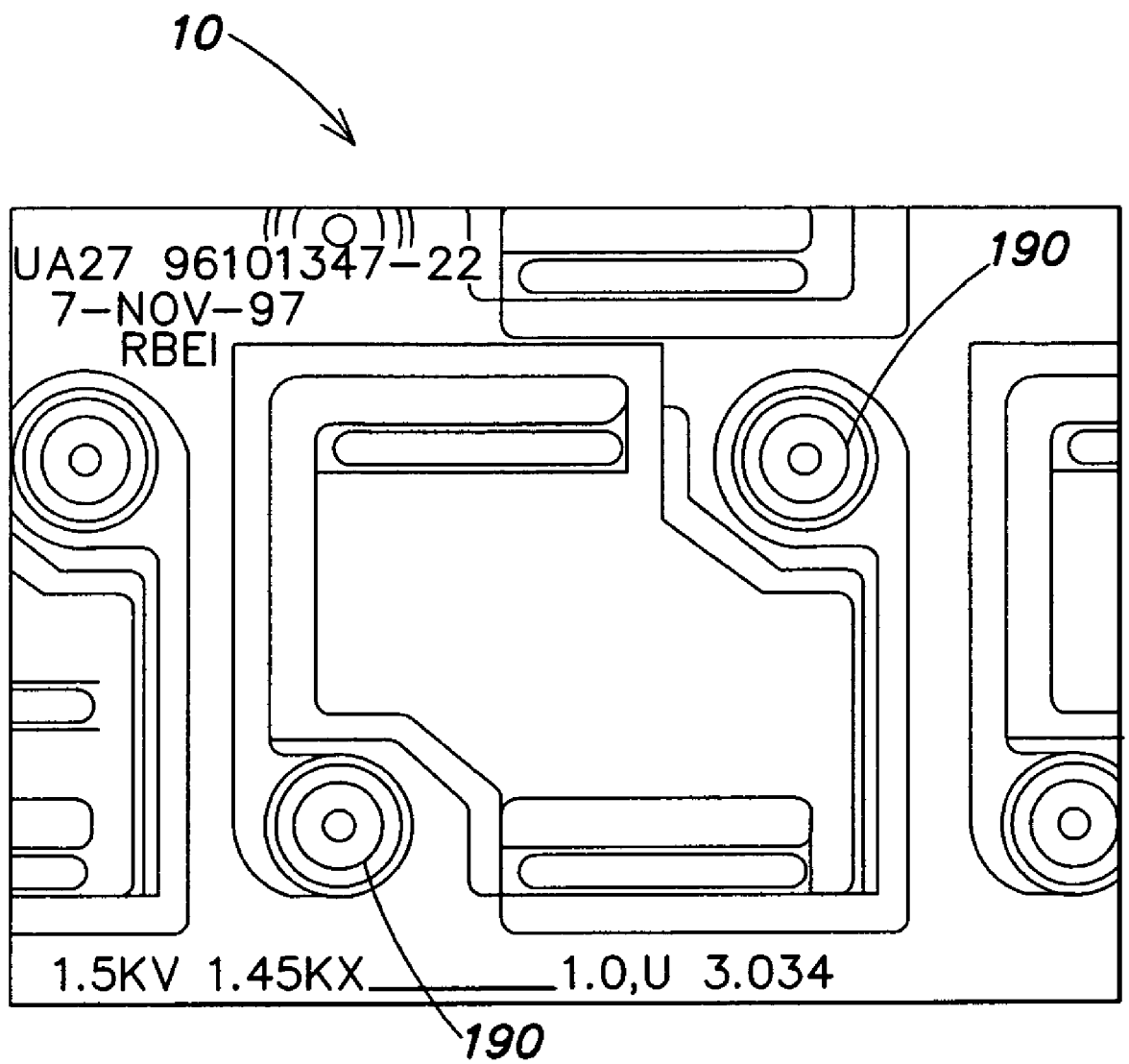
Figure 21:
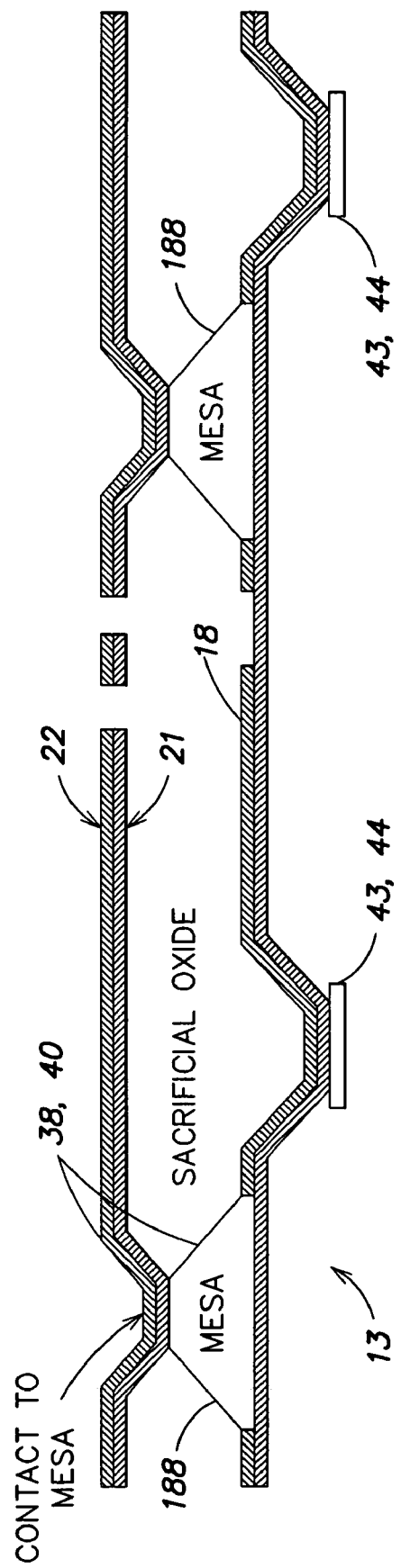
Figure 22A:
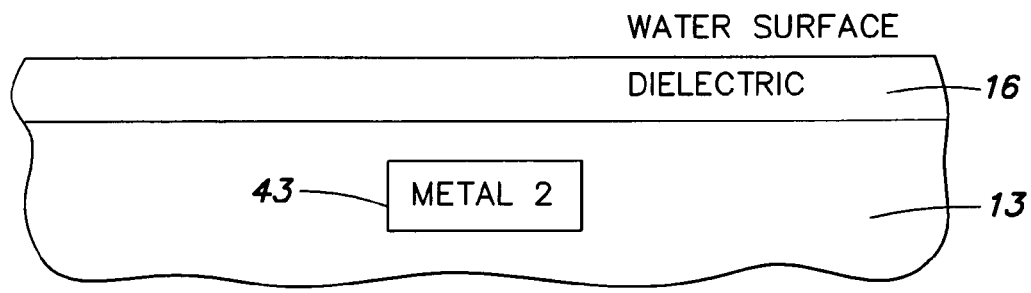
Figure 22B:
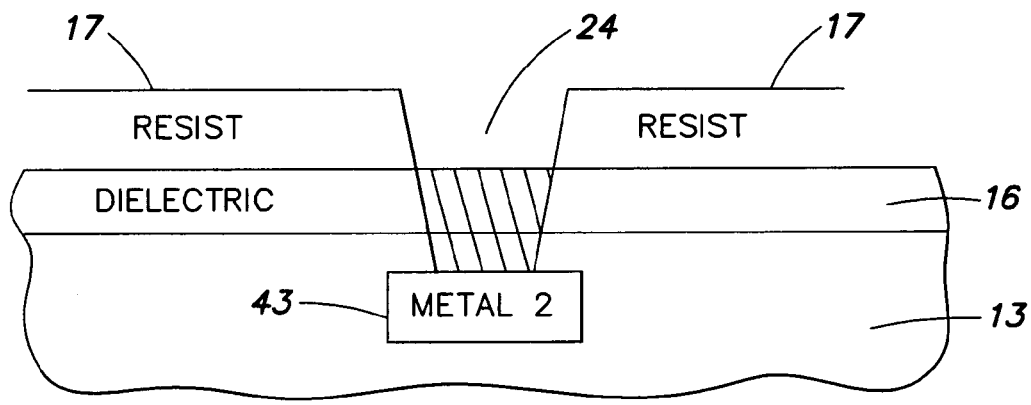
Figure 22C:
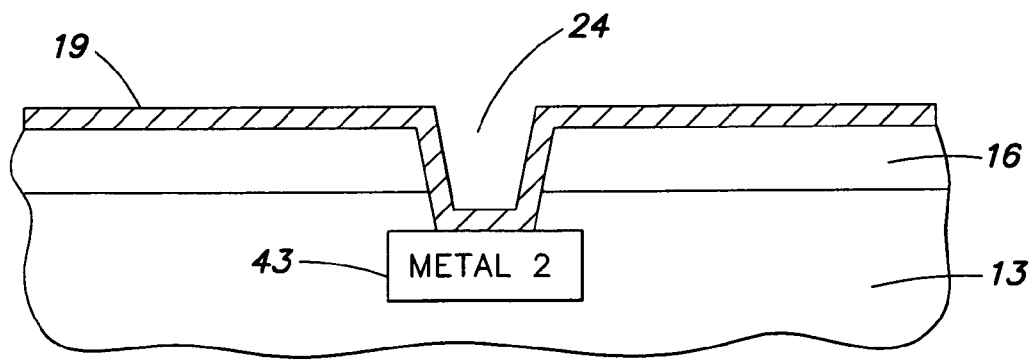
Figure 22D:
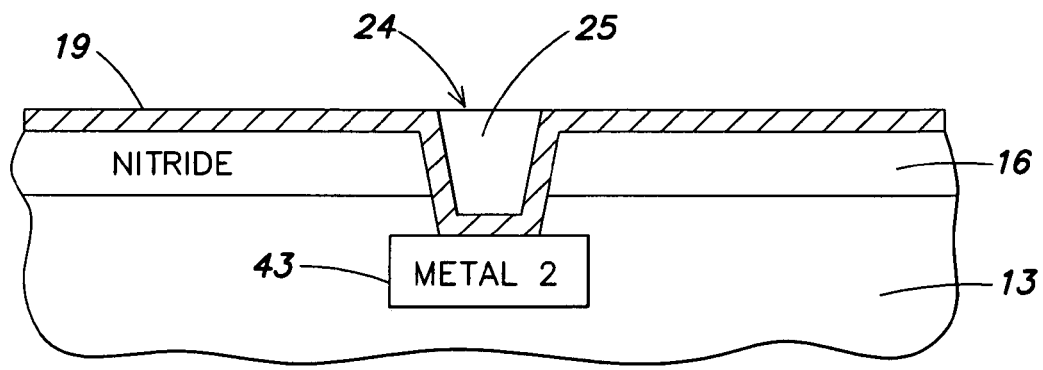
Figure 22E:
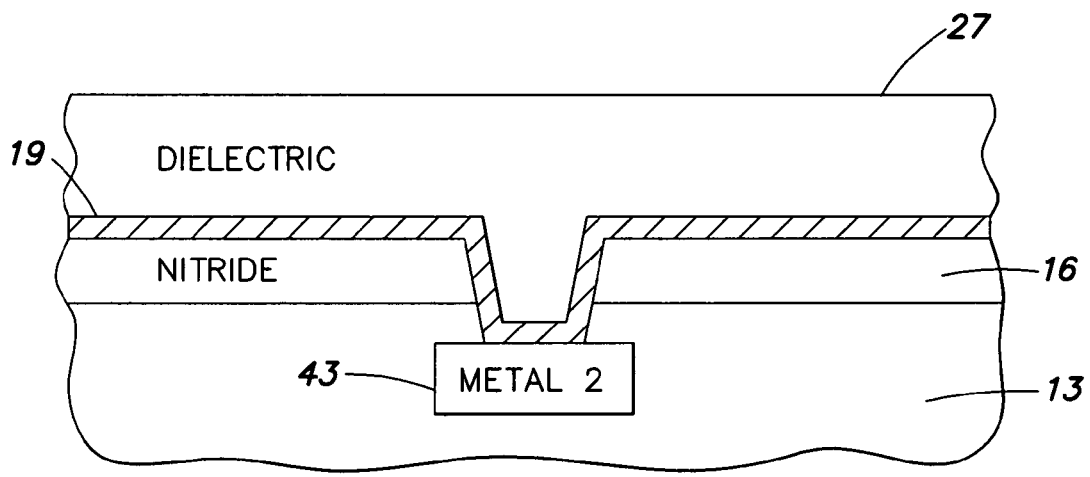
Figure 22F:
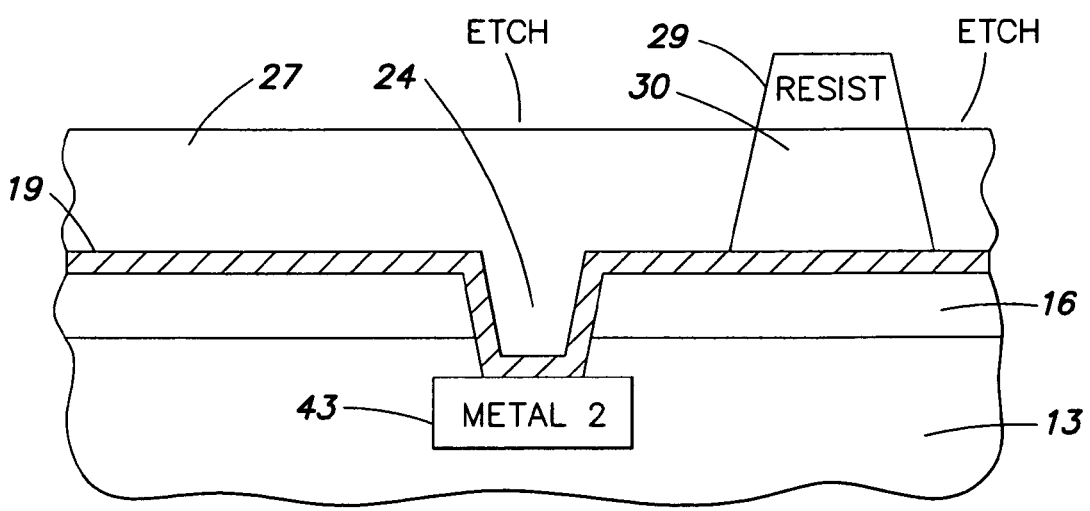
Figure 22G:
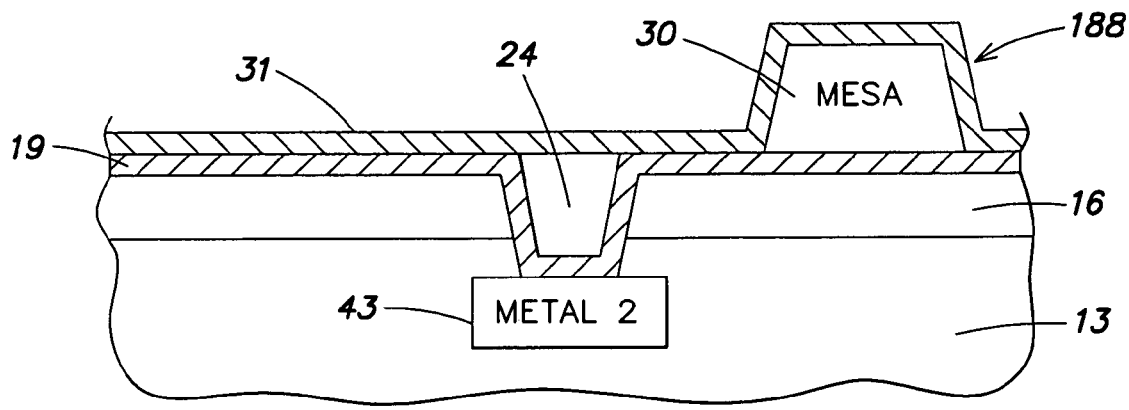
Figure 22H:
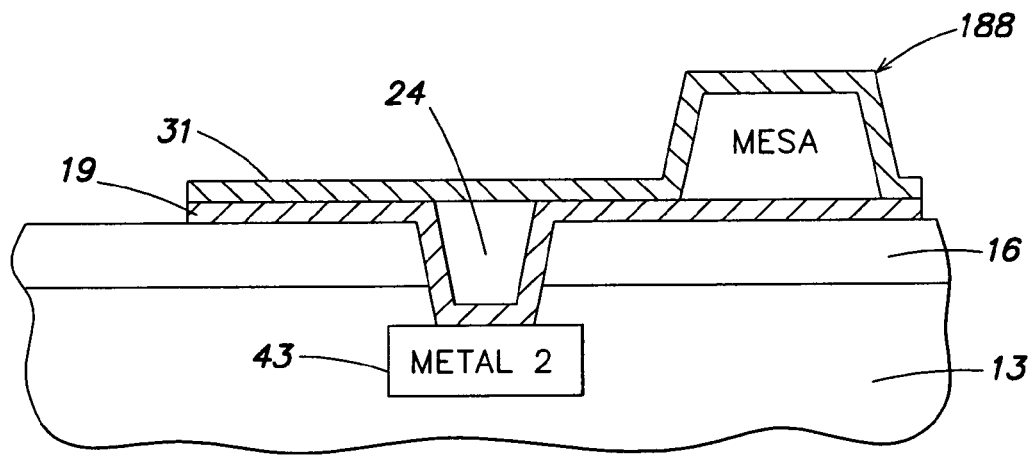
Figure 22I:
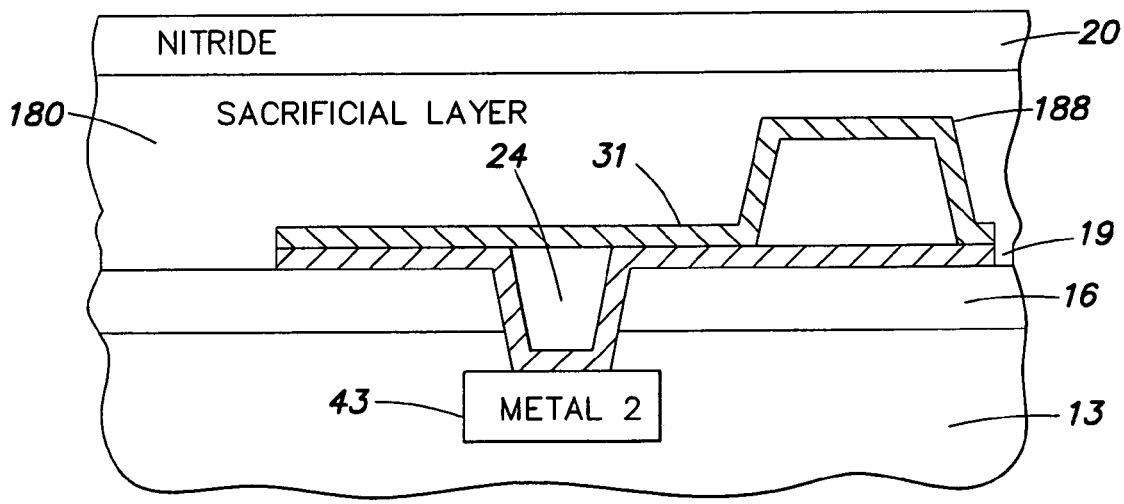
Figure 22J:
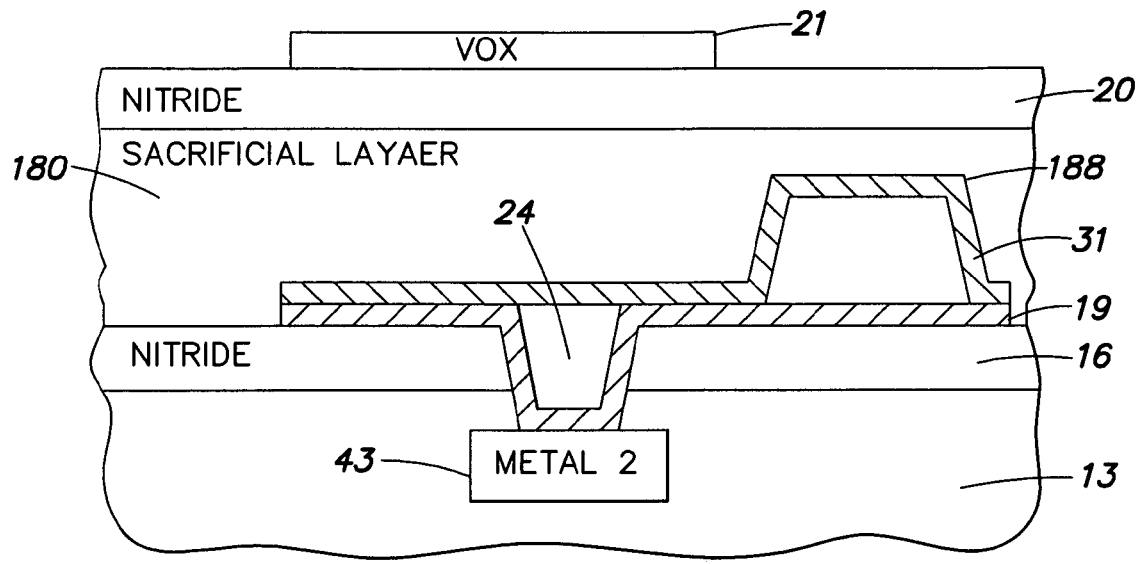
Figure 22K:
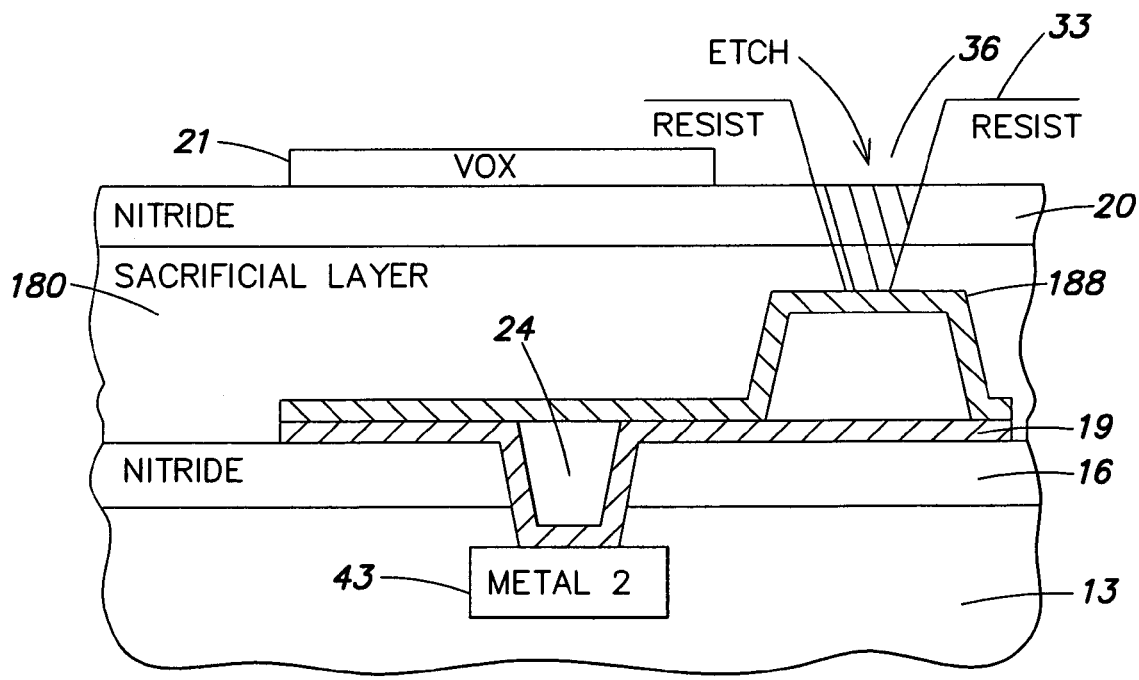
Figure 22L:
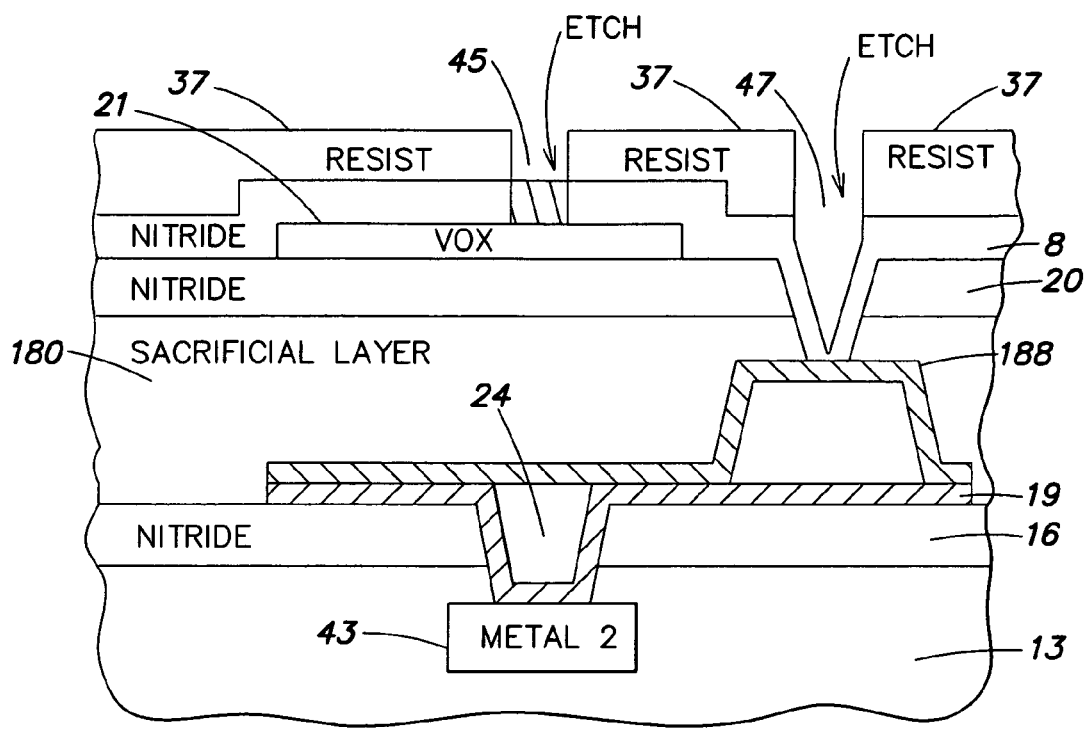
Figure 22M:
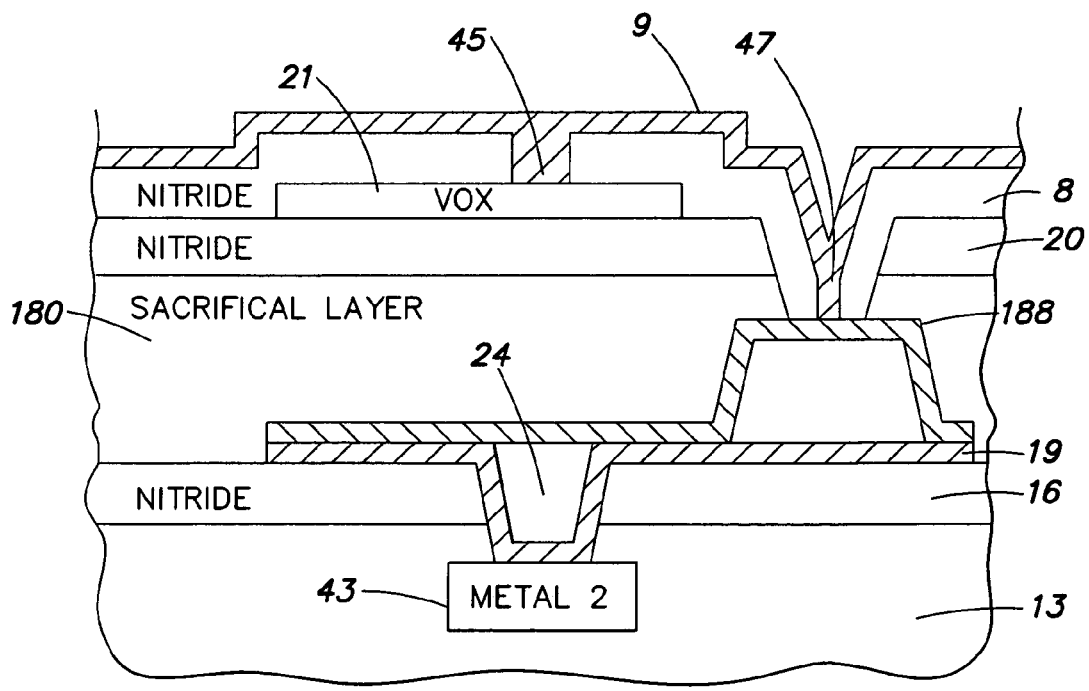
Figure 22N:
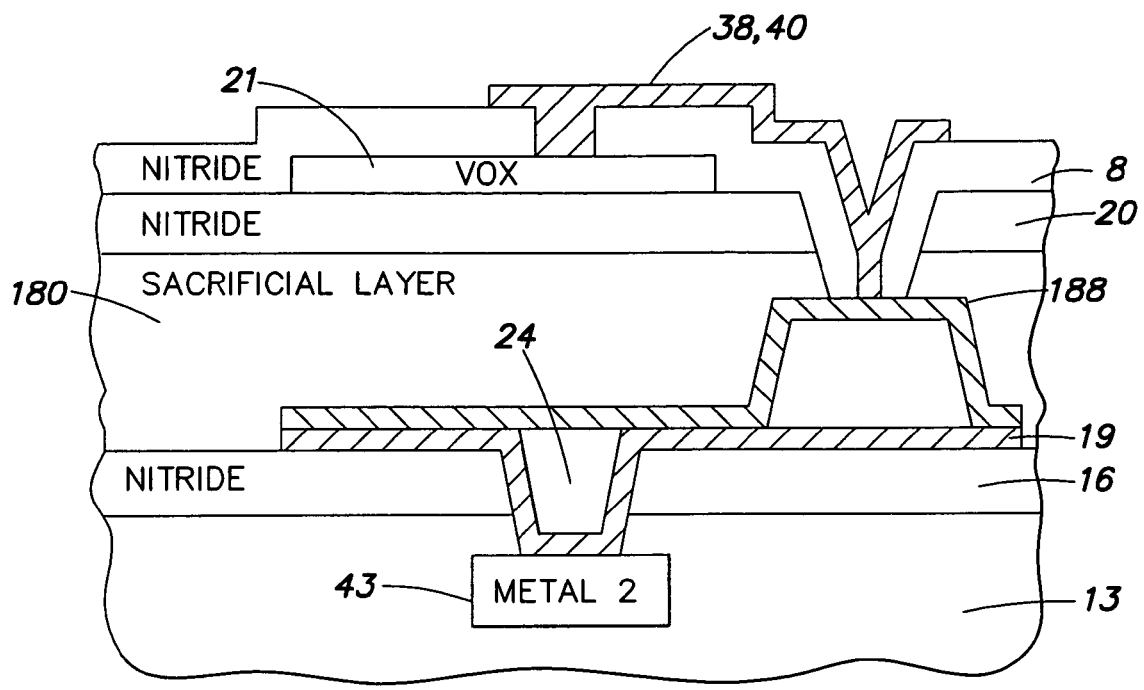
Figure 22O:
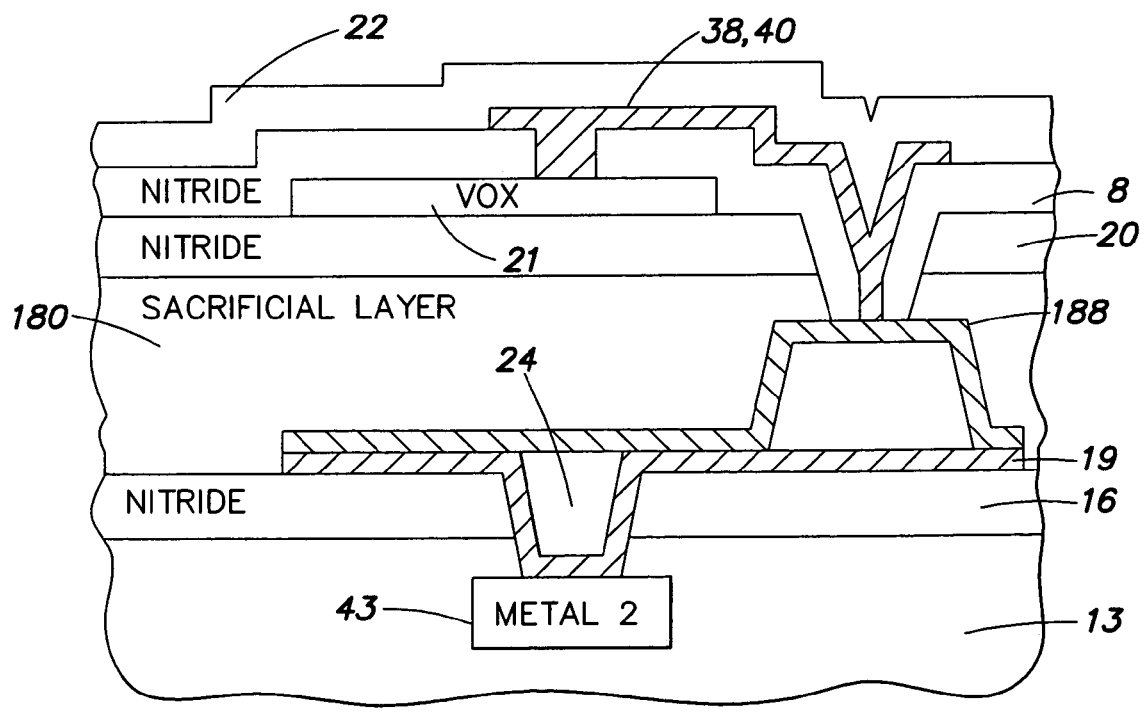
Figure 22P:
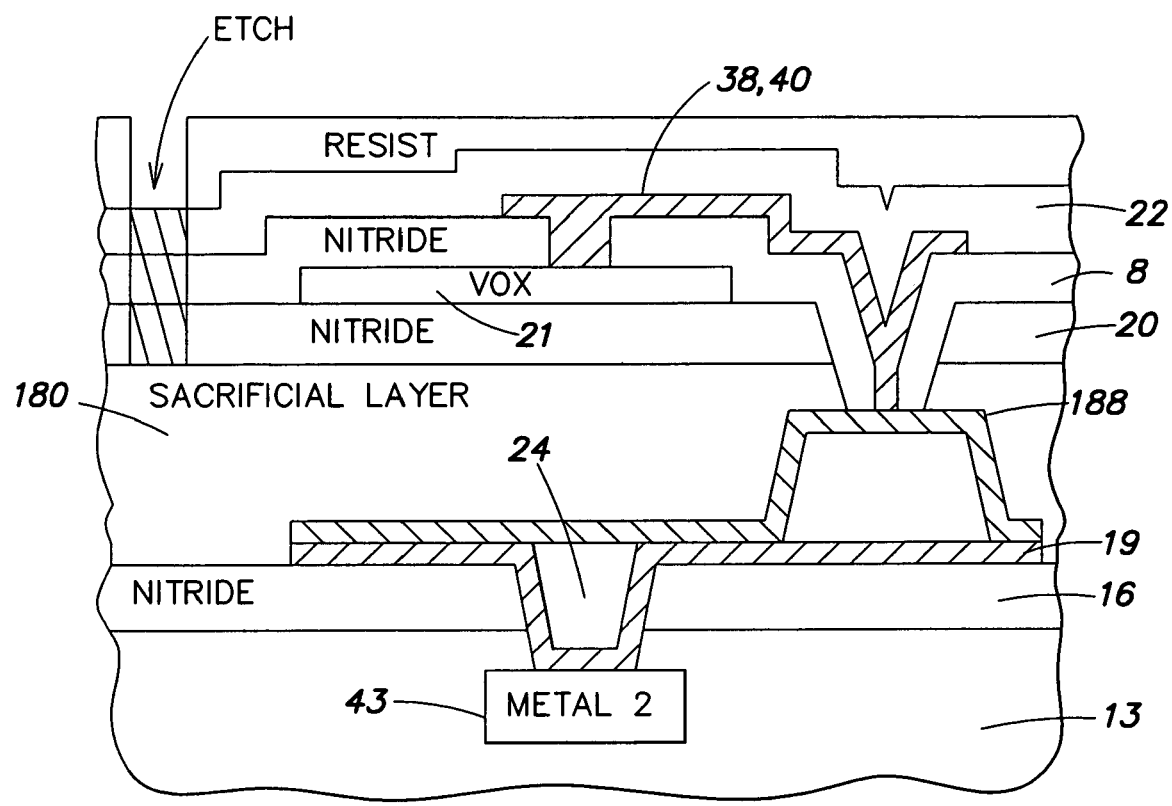
Figure 23:
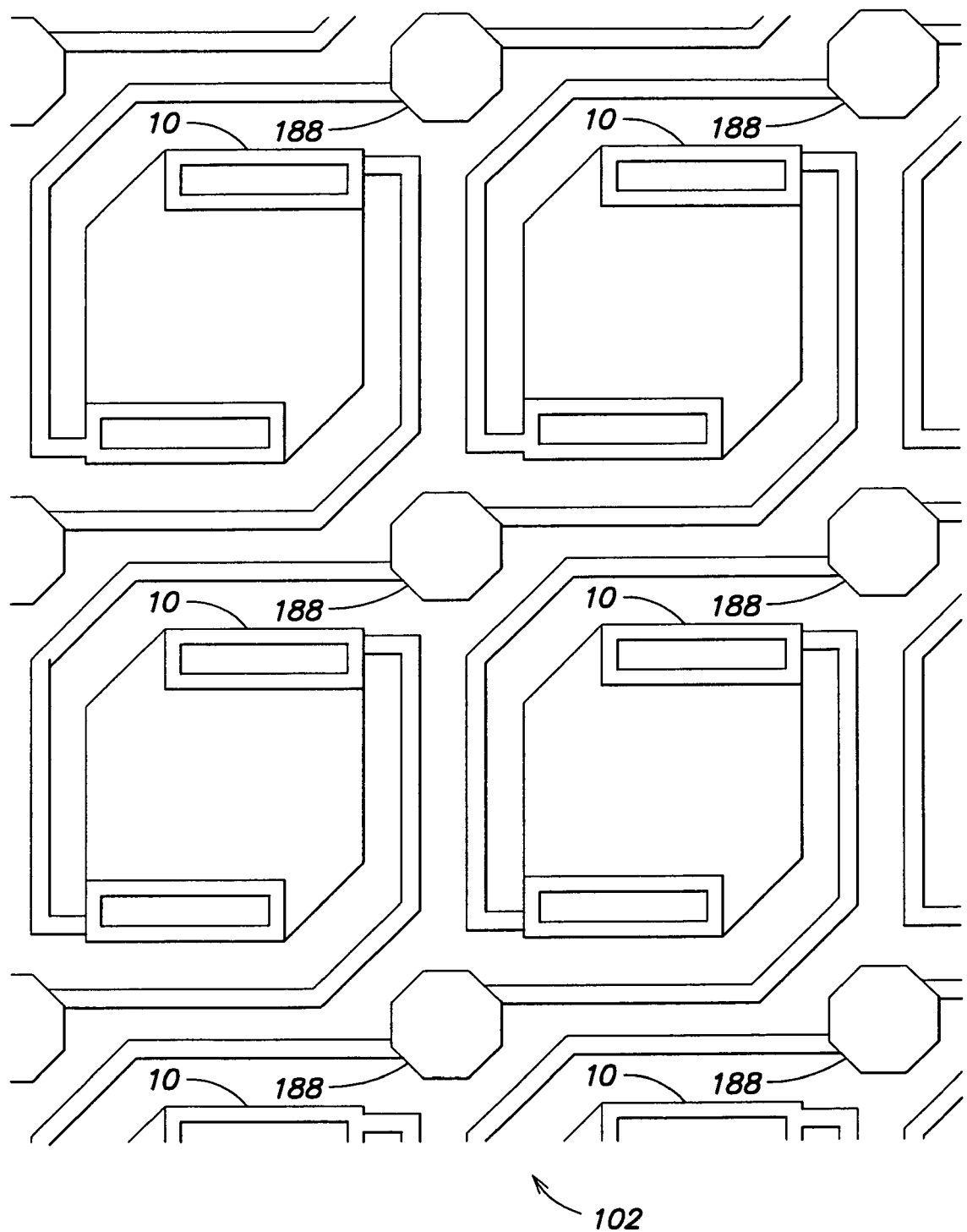
Figure 24:
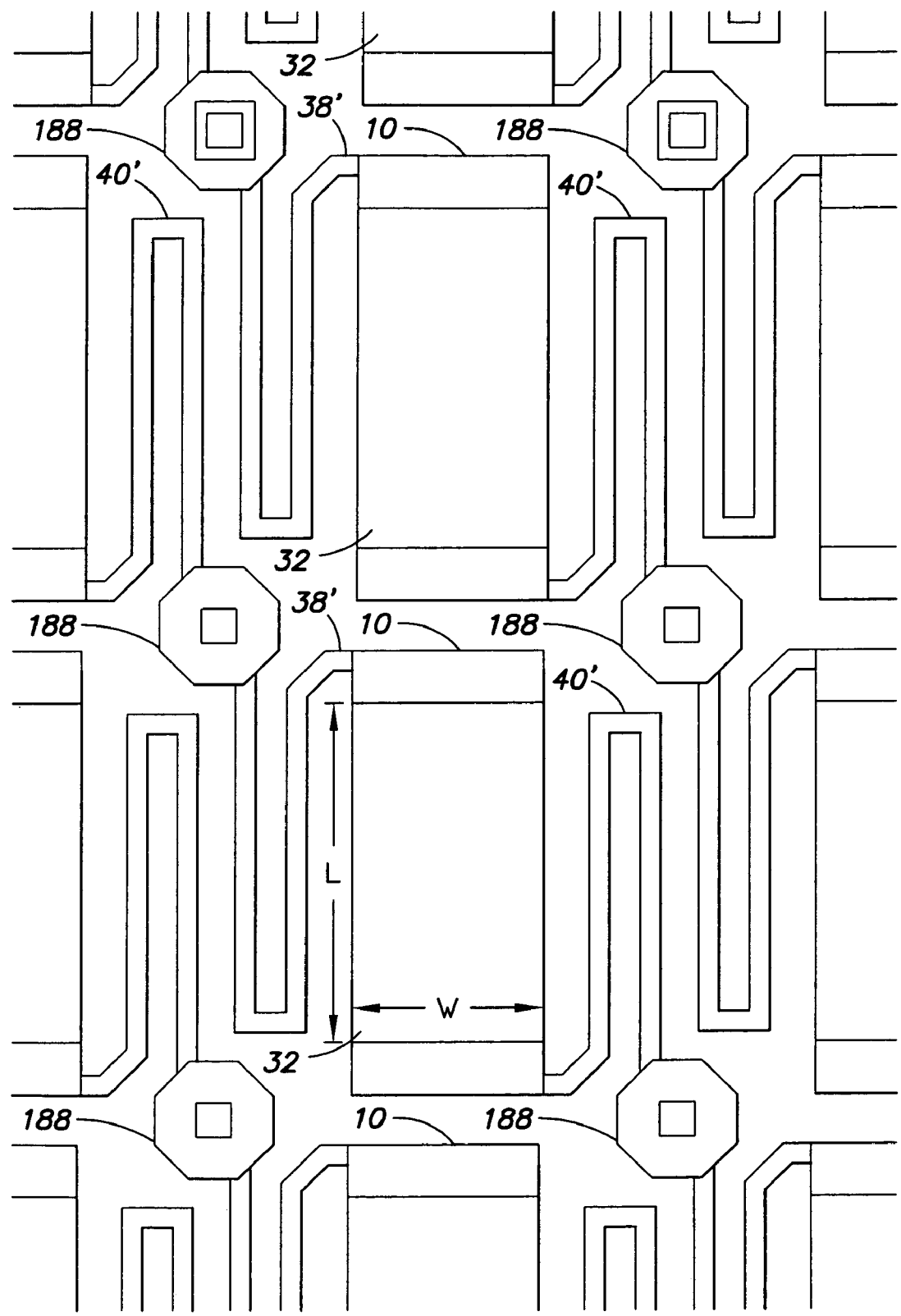
Figure 25:
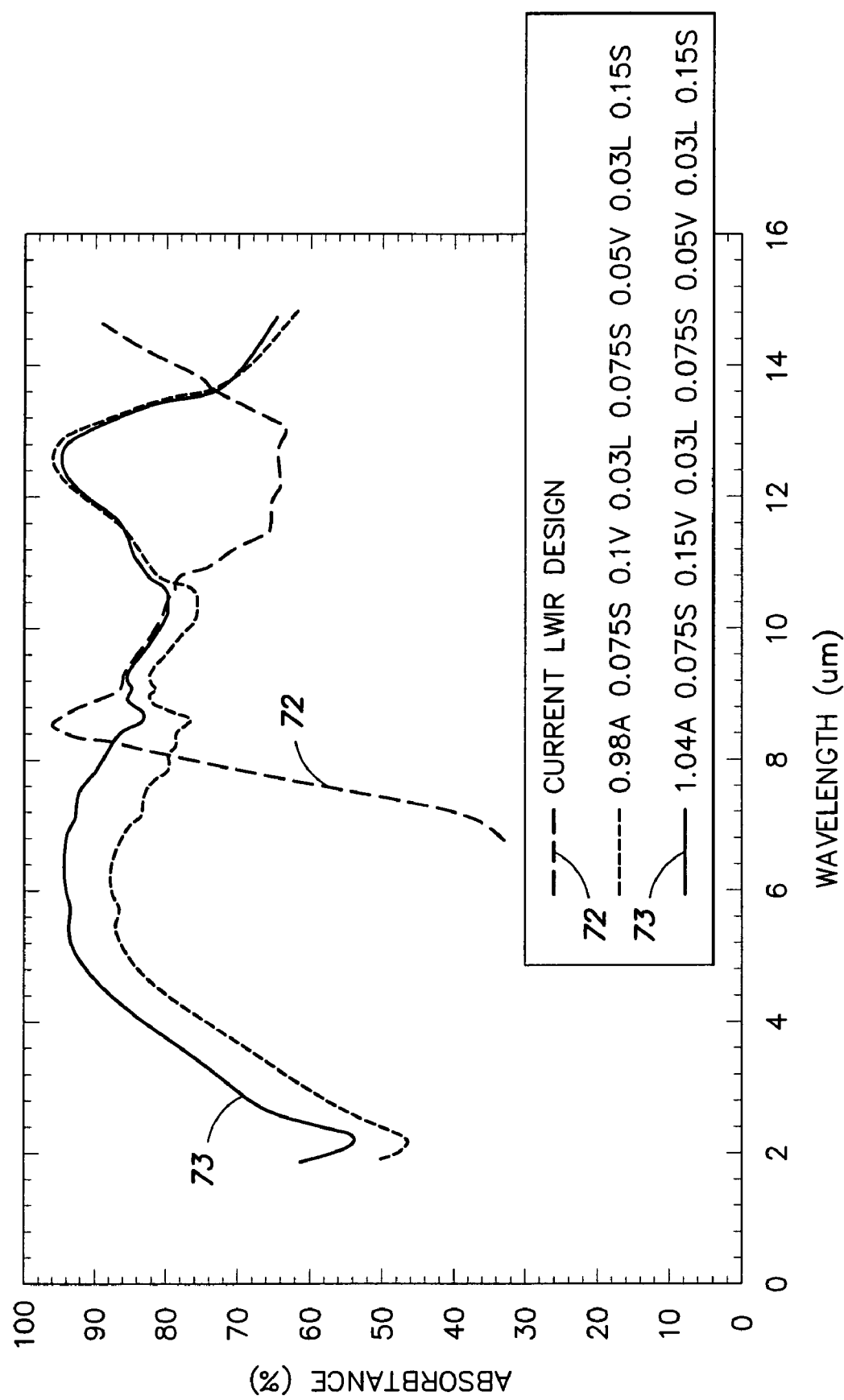
Figure 26A:
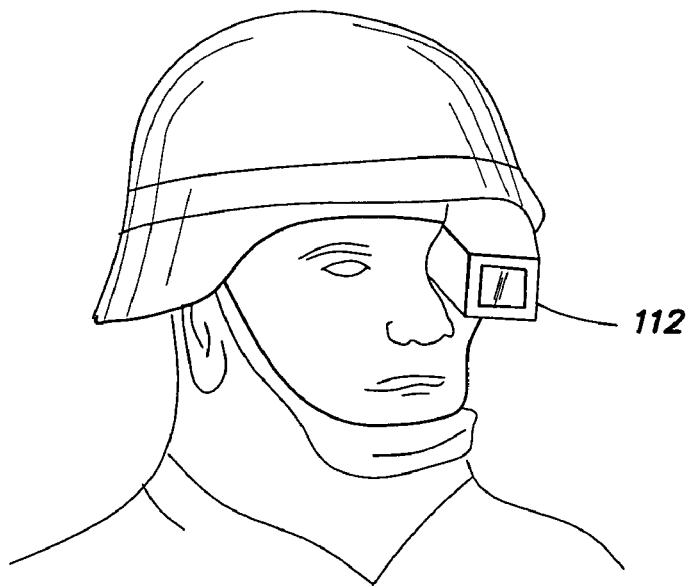
Figure 26B:
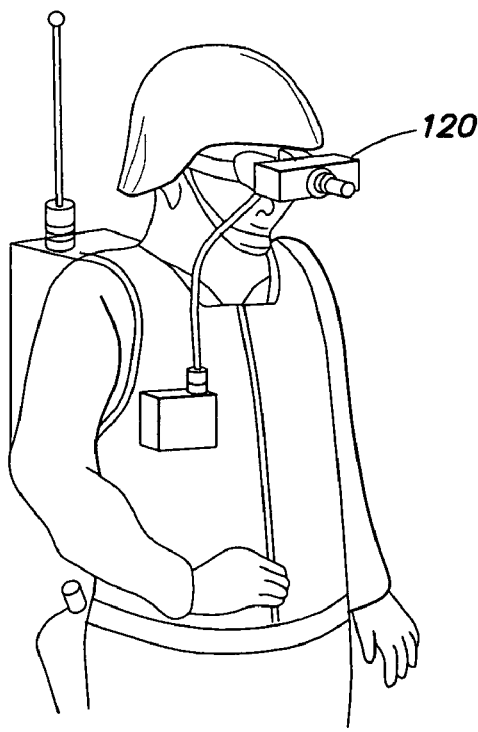
Figure 26C:
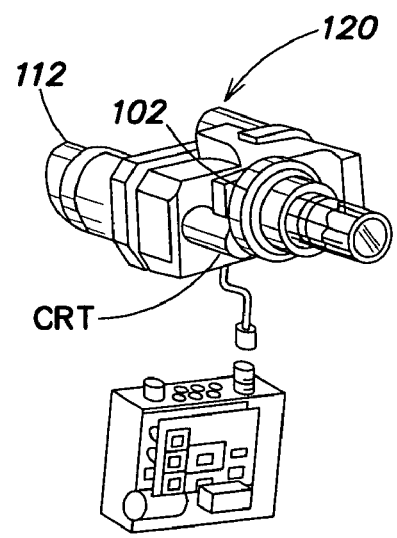
Figure 27:
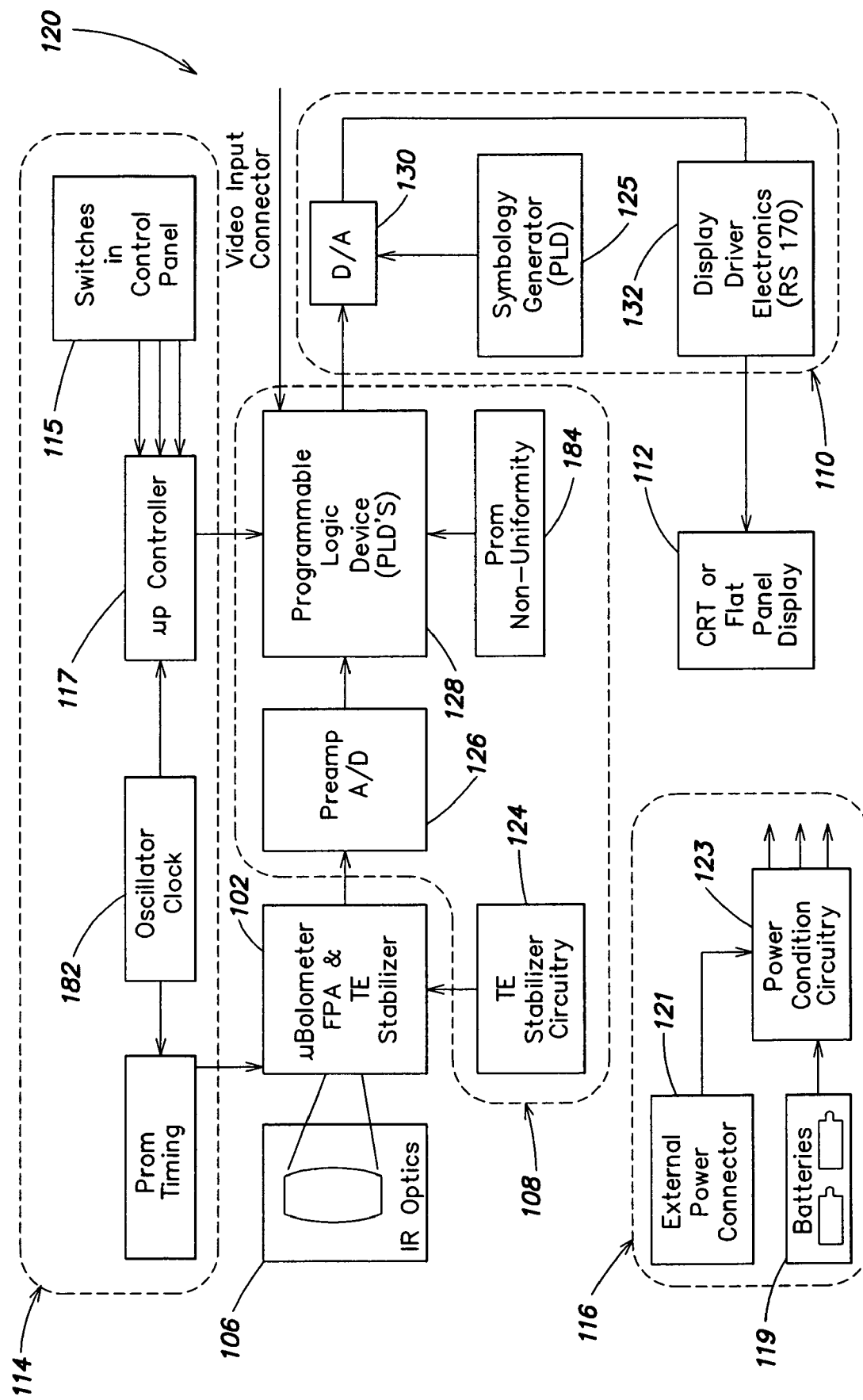
Figure 28A:
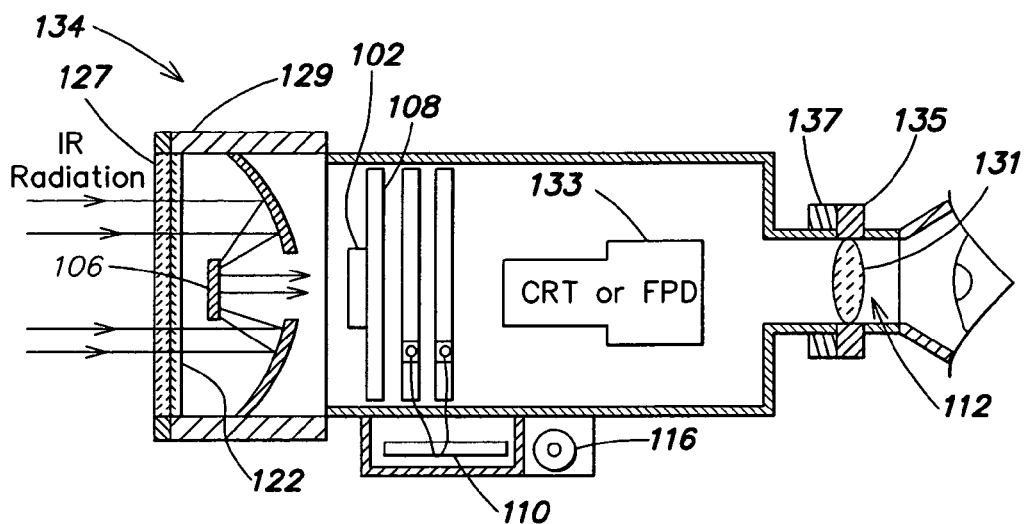
Figure 28B:
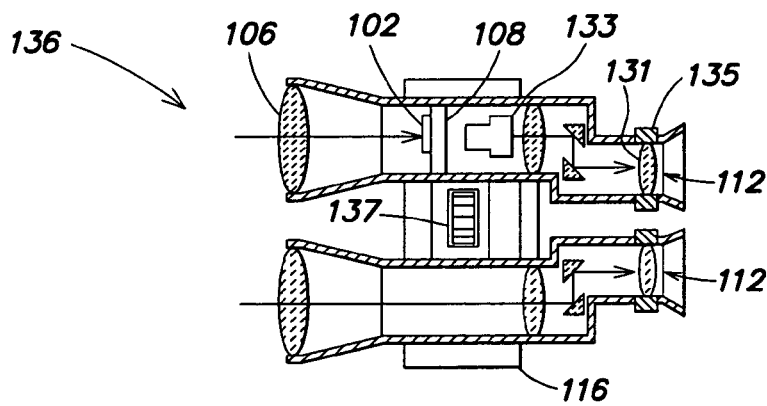
Figure 28C:
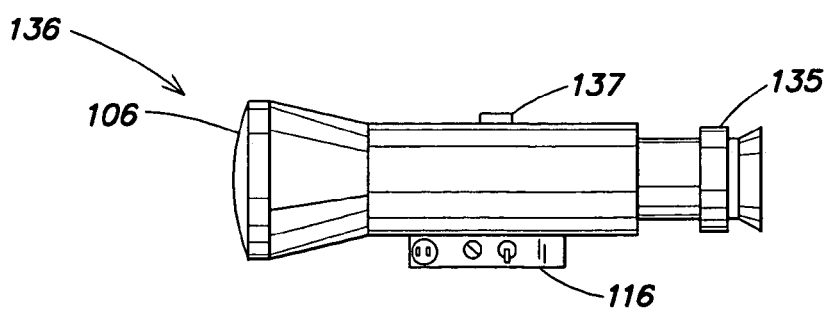
Figure 29A:
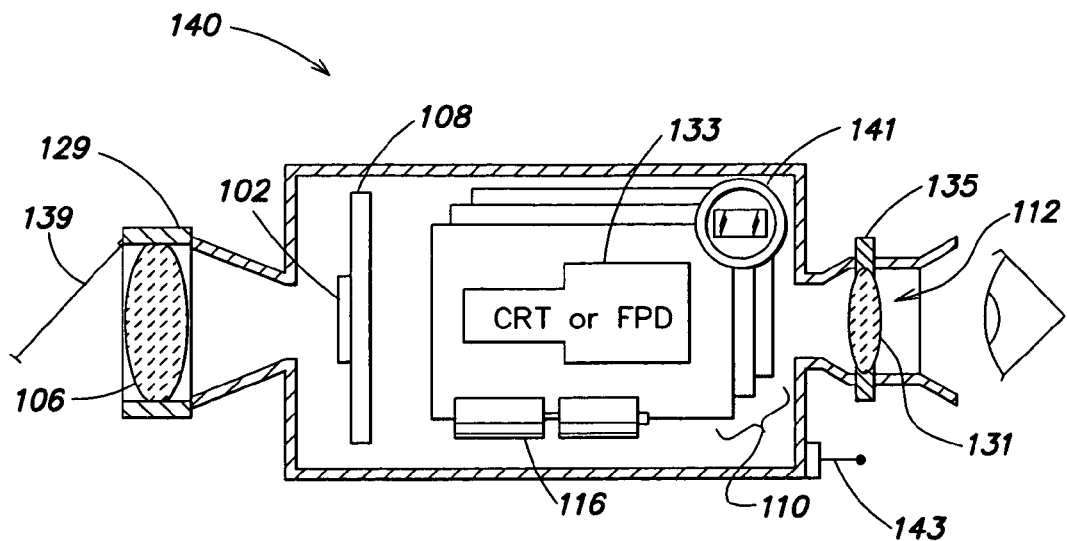
Figure 29B:
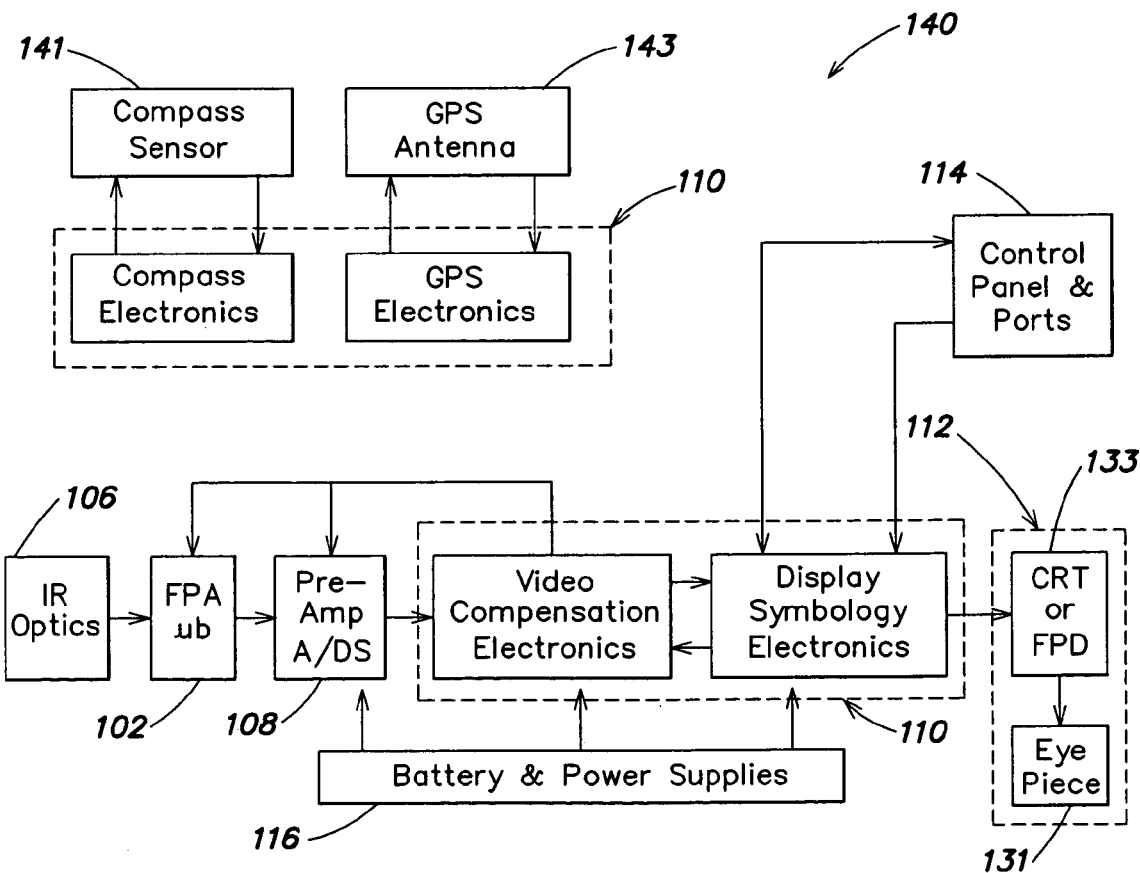
Figure 30A:
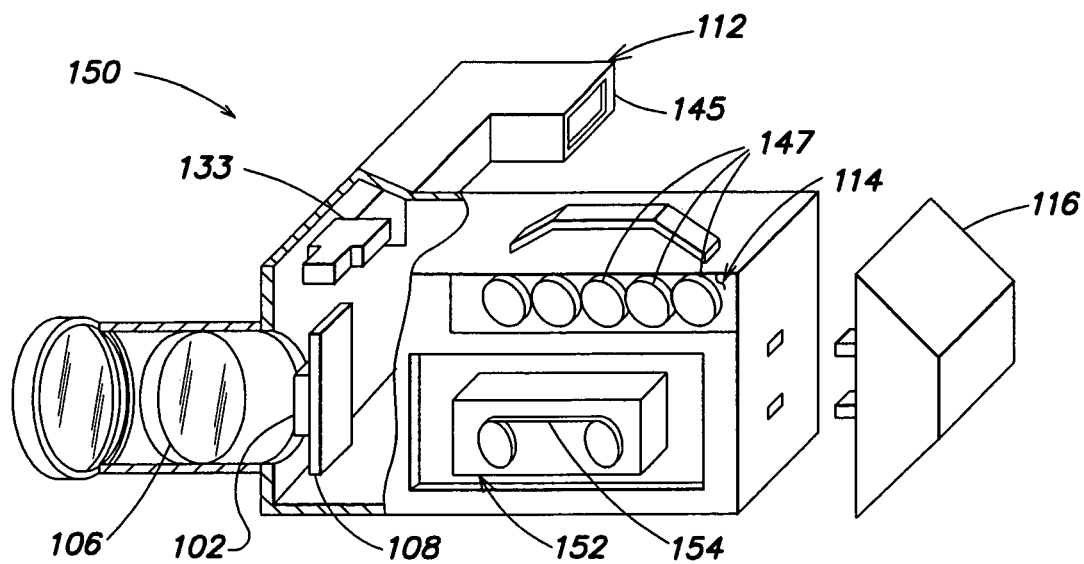
Figure 30B:
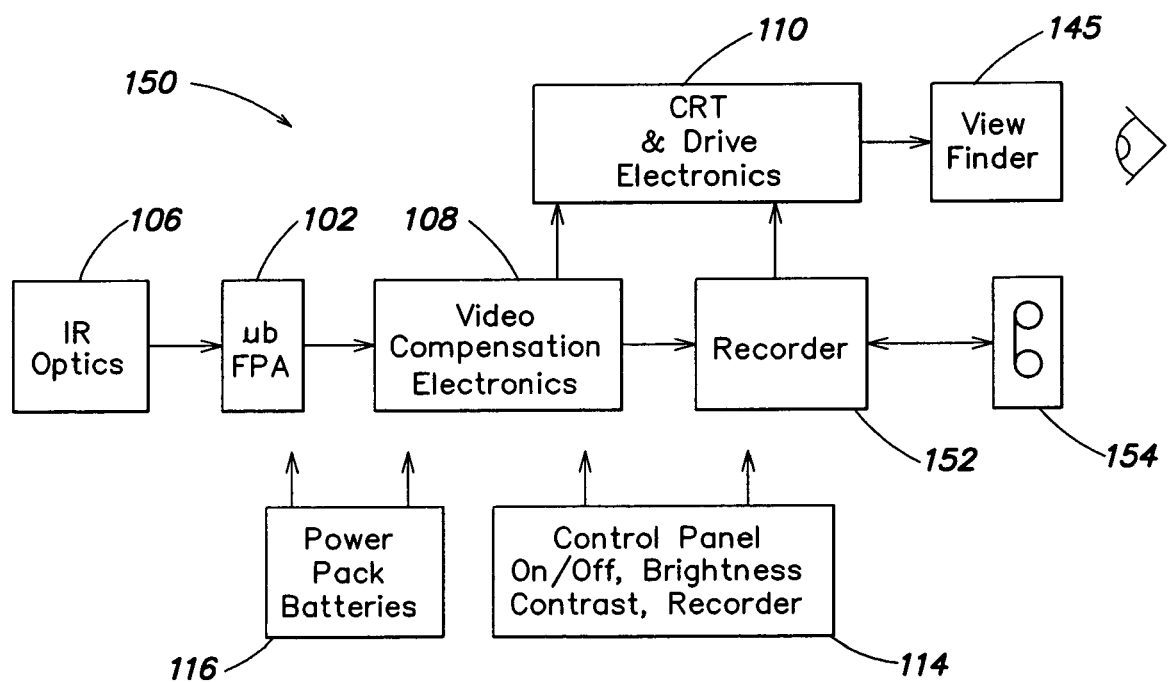
Figure 31A:
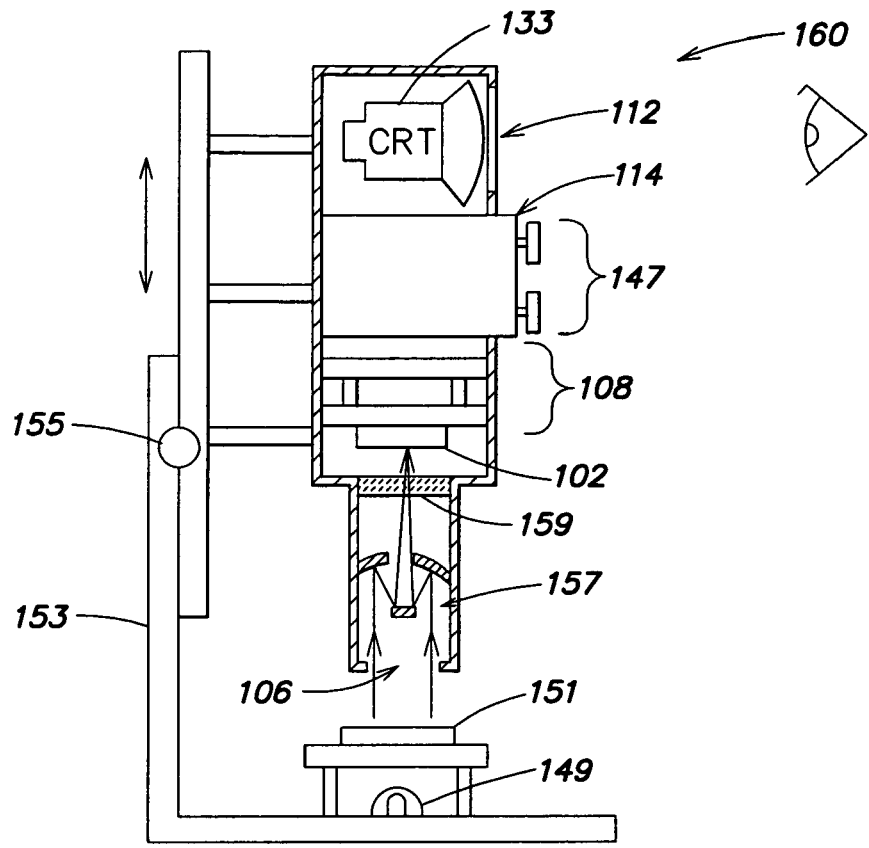
Figure 31B:
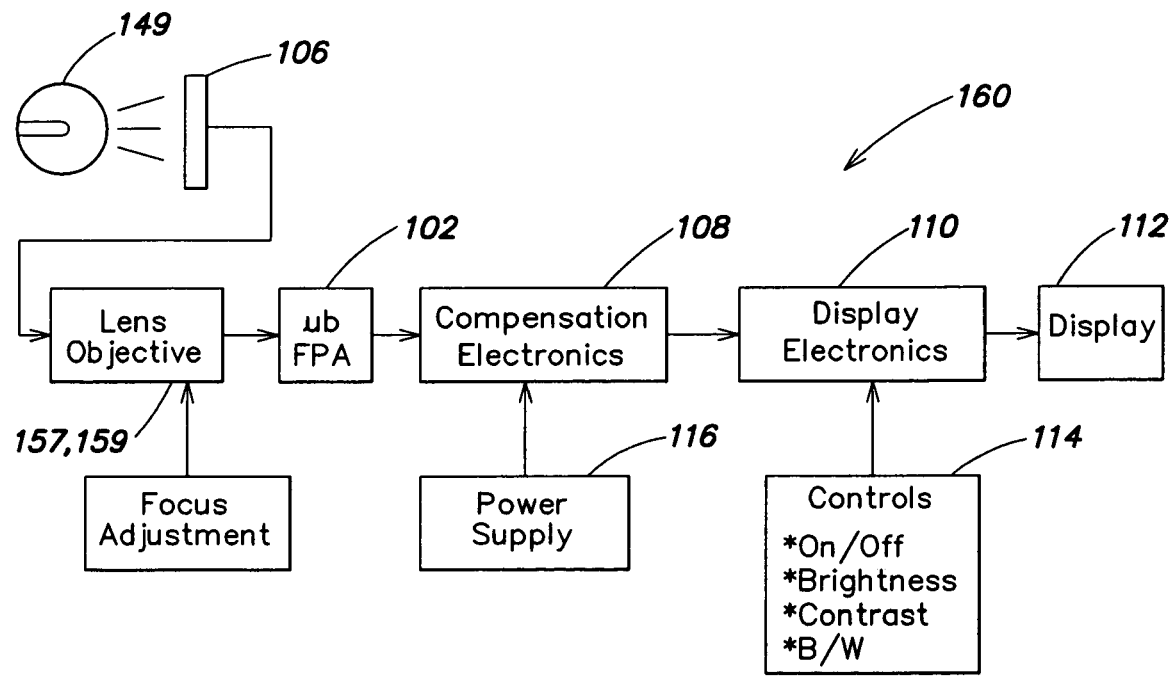
Figure 32A:
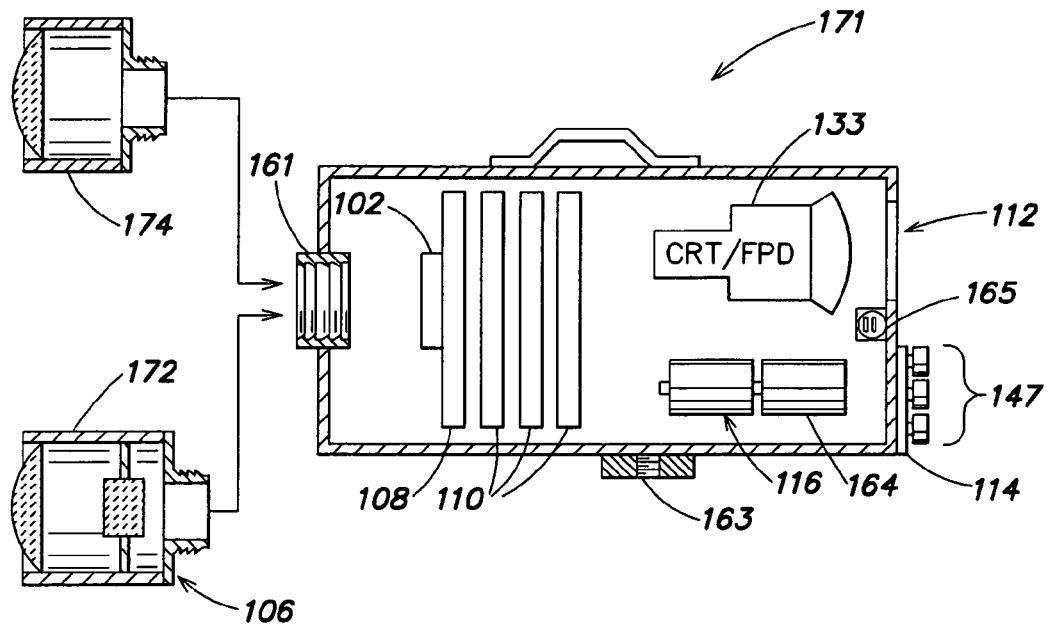
Figure 32B:
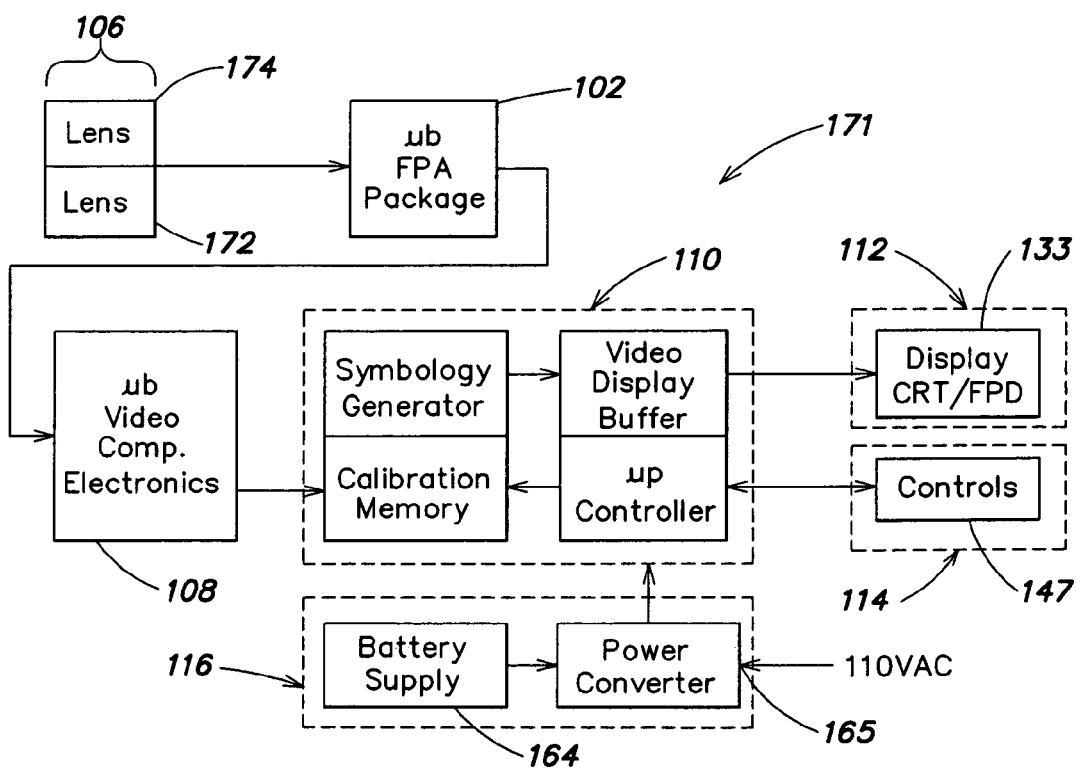
Figure 33:
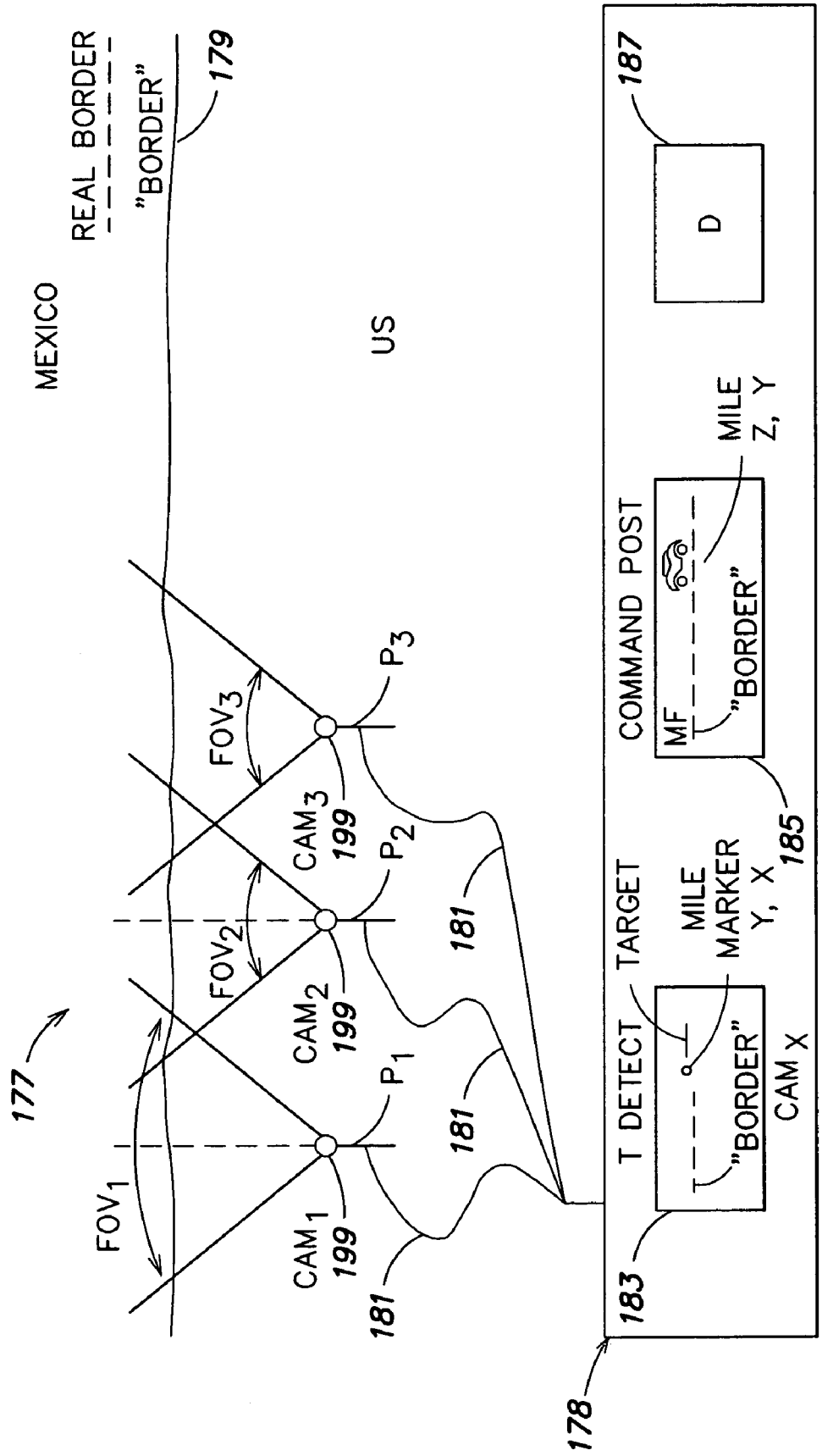
Figure 34:
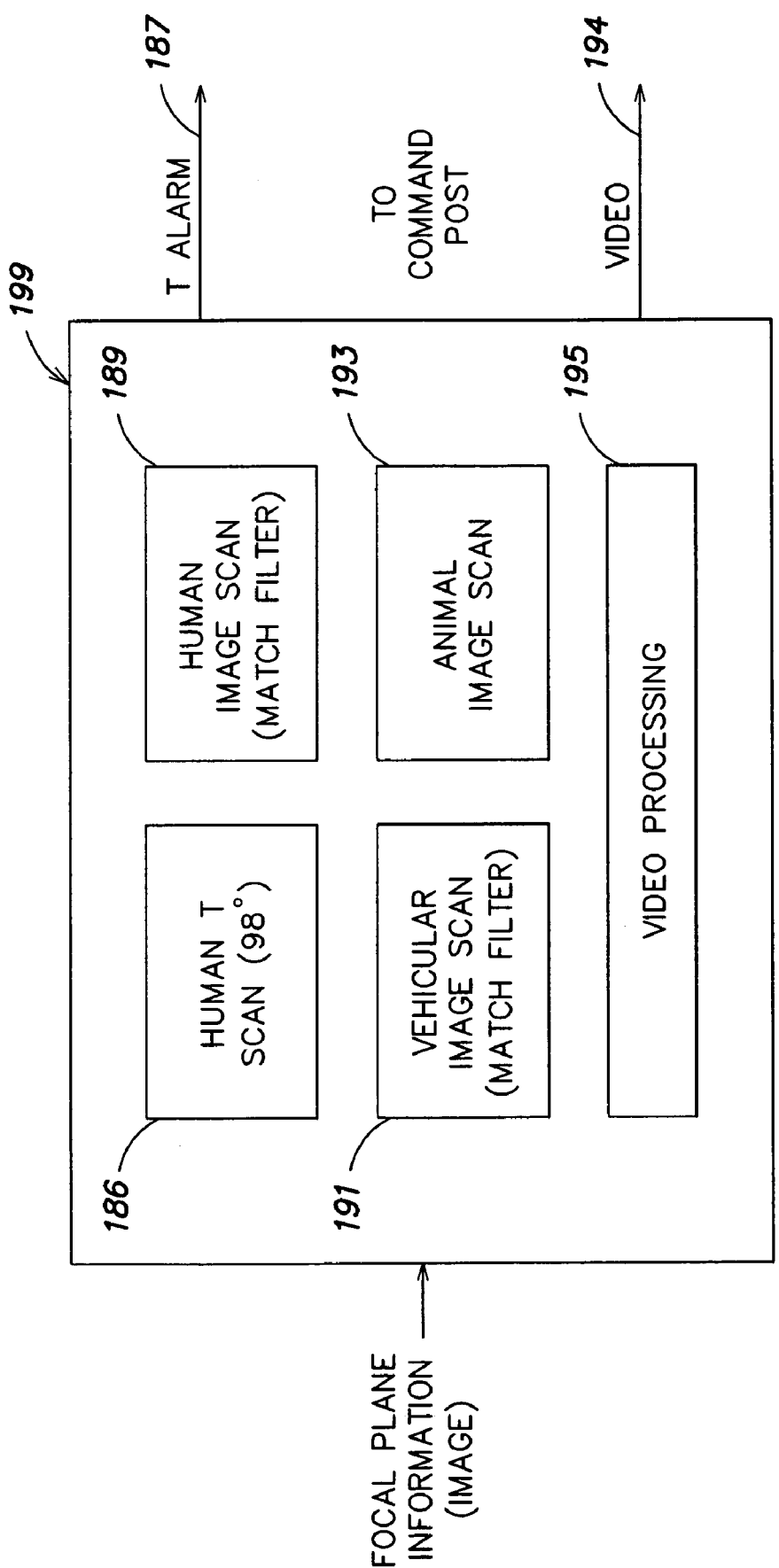
Figure 35:
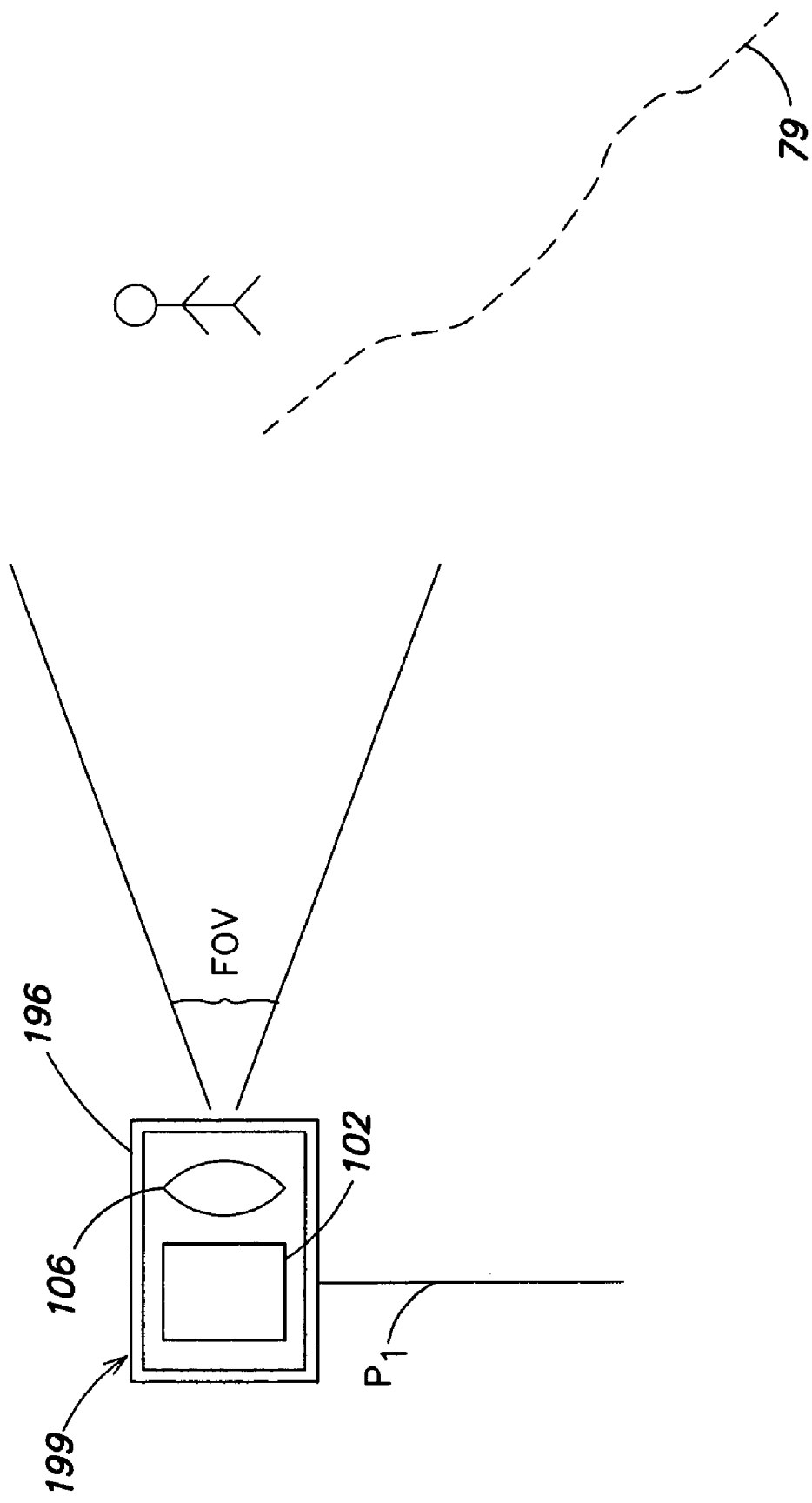
Figure 36:
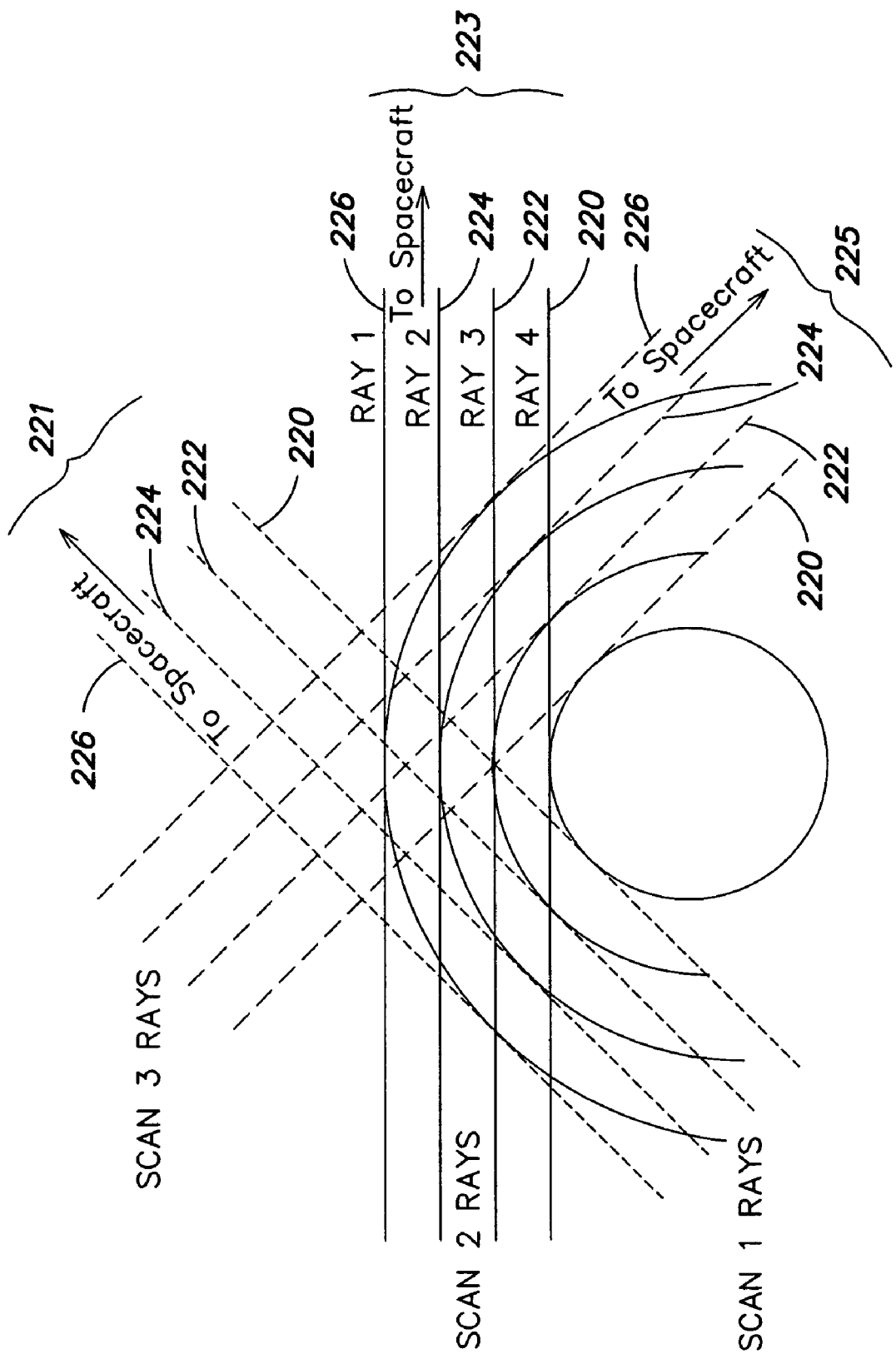
Figure 37:
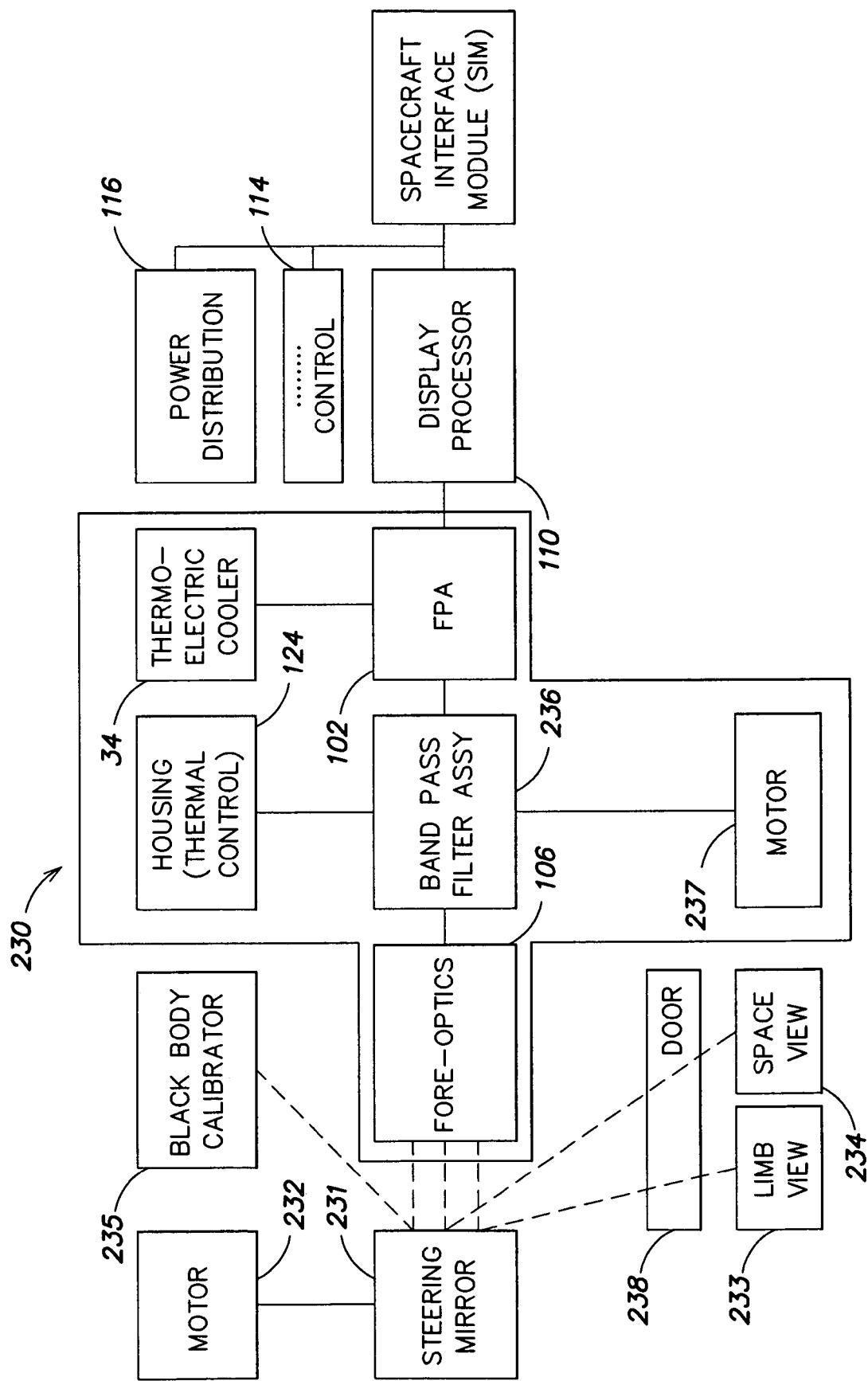

Table 1 identifies a plurality of manually adjustable lenses, motorized lenses, or athermalized lenses that may be used with the uncooled infrared sensor of the present invention;

FIG. 2 illustrates a schematic diagram of an embodiment of a focal plane array (FPA) of the uncooled IR sensor of the present invention, including circuitry for accessing rows and columns of the FPA;

FIG. 3 illustrates a block diagram of an embodiment of an FPA assembly of the uncooled IR sensor of the present invention;

FIG. 4 illustrates a schematic block diagram of an embodiment of a display processor of the uncooled IR sensor of the present invention;

FIG. 5 illustrates an embodiment of a control panel of a controller of the uncooled IR sensor of the present invention;

FIG. 6 illustrates a schematic block diagram of an embodiment of an equalization controller of the display processor of FIG. 4;

FIG. 7 illustrates a histogram plot provided by the equalization controller of FIG. 6;

FIG. 8 illustrates a plot of a transfer function provided by the equalization controller of FIG. 6;

FIG. 9 illustrates a gain and level curve provided by the equalization controller of FIG. 6;

FIG. 10 illustrates an embodiment of the FPA of the uncooled IR sensor of the present invention;

FIG. 11 illustrates an embodiment of masking the FPA of the uncooled IR sensor of the present invention;

FIG. 12 is a side elevation view of an embodiment of a detector device of the uncooled IR sensor of the present invention;

FIG. 13 is a side elevation view of another embodiment of a detector device of the uncooled IR sensor of the present invention;

FIG. 14 is top plan view of the detector device of FIG. 13;

FIGS. 15(a), 15(b) and 15(c) illustrate three respective embodiments of conductive legs of the detector device of FIGS. 12-14, and some mask layers used to fabricate the respective embodiments;

FIG. 16 illustrates some steps for forming the embodiment of conductive legs of the detector device as illustrated in FIG. 15(a);

FIG. 17 illustrates some steps for forming the leg structure of the detector device as illustrated in FIG. 15(b);

FIG. 18 illustrates some steps for forming the leg structure of the detector device as illustrated in FIG. 15(c);

FIG. 19 is a side elevation view of layers used to form the detector device of FIGS. 13-14;

FIG. 20 is a photo of the detector device of FIG. 12;

FIG. 21 illustrates a cross-sectional side elevation view of an inverted mesa point (MP) contact via hole according to an embodiment of the detector device of FIG. 12;

FIG. 22 illustrates steps for forming the detector device of FIG. 12 with the inverted MP contact of FIG. 21;

FIG. 23 illustrates an embodiment of the FPA of the uncooled IR sensor of the present invention, having a plurality of detector devices that share a single contact between the plurality of detector devices;

FIG. 24 illustrates another embodiment of the FPA of the uncooled IR sensor of the present invention, having a folded leg design for each of the detectors devices;

FIG. 25 is a plot of an absorptance versus a wavelength of operation of a plurality of embodiments of the detector device of the uncooled IR sensor of the present invention;

FIGS. 26(a), 26(b) and 26(c) illustrate, respectively, a helmet mounted, a goggle mounted configuration and an enlarged view of a head mounted embodiment of the uncooled IR sensor of the present invention;

FIG. 27 illustrates a block diagram of the head mounted uncooled IR sensor of FIGS. 26(a), 26(b) and 26(c);

FIGS. 28(a), 28(b) and 28(c) illustrate another embodiment of the uncooled IR sensor of the present invention which is a hand-held sensor, wherein FIG. 28(a) illustrates a monocular sensor and FIGS. 28(b)-28(c) illustrate a binocular sensor;

FIGS. 29(a) and 29(b) illustrate another embodiment of the uncooled IR sensor of the present invention which is a weapon sight, in particular, FIG. 29(a) illustrates a top view of the weapon sight and FIG. 29(b) illustrates a block diagram of the weapon sight;

FIGS. 30(a) and 30(b) illustrate another embodiment of the uncooled IR sensor of the present invention which is a camera/recorder (camcorder), in particular FIG. 39(a) illustrates a cross-sectional view of the camcorder and FIG. 30(b) illustrates a block is diagram of the camcorder;

FIGS. 31(a) and 31(b) illustrate another embodiment of the uncooled IR sensor of the present invention which is a microscope, in particular FIG. 31(a) is a side elevational view of the microscope and FIG. 31(b) is an operational block diagram of the microscope;

FIGS. 32(a) and 32(b) illustrate another embodiment of the uncooled IR sensor of the present invention which is a radiometer/spectrometer system, in particular FIG. 32(a) illustrates a cross-sectional view of the radiometer/spectrometer and FIG. 32(b) illustrates a block diagram of the radiometer/spectrometer;

FIG. 33 illustrates an embodiment of a border surveillance system of the present invention;

FIG. 34 illustrates an embodiment of the uncooled IR sensor that may be used in the border surveillance system of FIG. 33;

FIG. 35 illustrates the uncooled IR sensor of FIG. 34 as used in the border surveillance system of FIG. 33;

FIG. 36 illustrates limb sounding with the uncooled IR sensor of the present invention; and FIG. 37 illustrates an embodiment of the uncooled IR sensor that may be used to limb sound according to the present invention.

DETAILED DESCRIPTION

Figure 1:
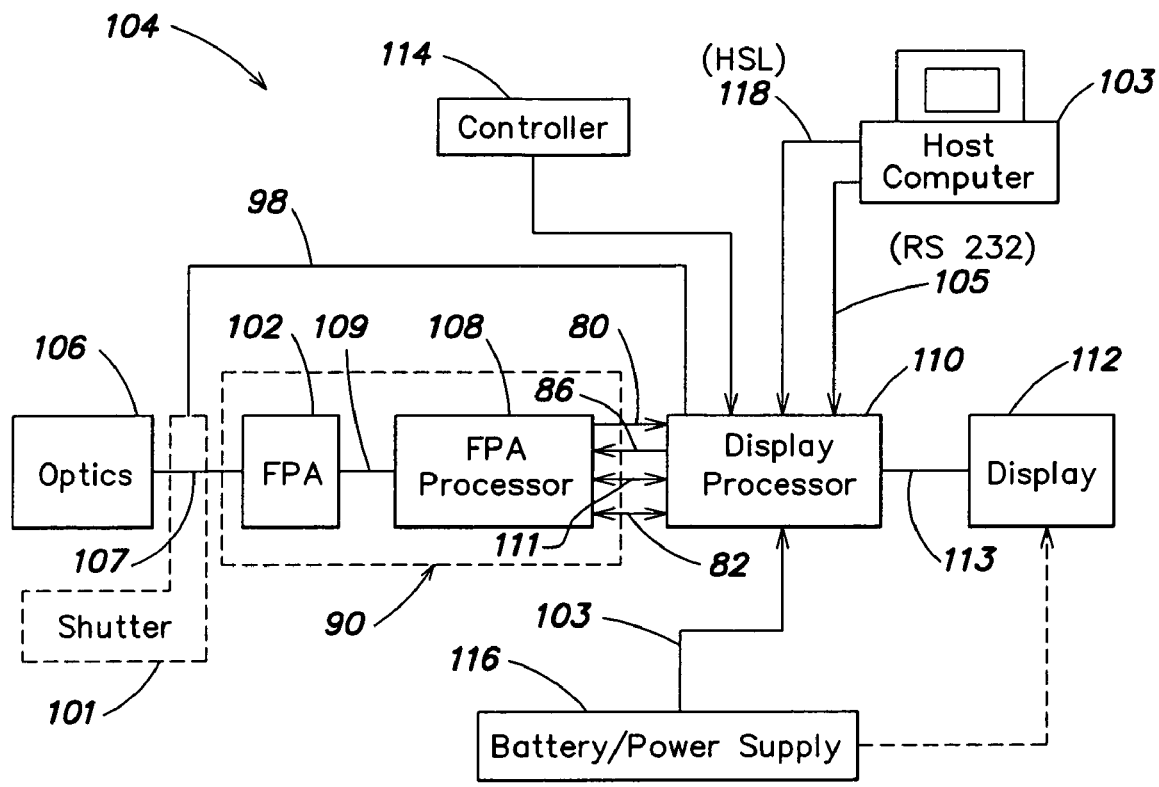
FIG. 1 is a schematic block diagram of an embodiment of an uncooled infrared (IR) sensor according to the present invention.

FIG. 1 illustrates a schematic block diagram of an embodiment of an uncooled infrared sensor according to the present invention. With the imaging system of FIG. 1, electromagnetic radiation such as, for example, infrared radiation in a wavelength range of 8-14 µm may be incident upon optics 106, focussed by the optics such as, for example, a lens to provide a focussed electromagnetic signal at output 107. The focussed electromagnetic signal is imaged onto an uncooled focal plane array (FPA) 102. The FPA converts the focussed electromagnetic signal to a plurality of sensed signals that are output on medium 109, to a focal plane array processor 108. The focal plane array processor 108 processes the plurality of sensed signals such as, for example, by digitizing the plurality of sensed signals to provide a plurality of digital signals and by adjusting the plurality of digital signals for any differences in gain or other non-uniformities between the plurality of detector devices of the focal plane array to provide a plurality of processed signals. The plurality of processed signals are then output on medium 111 to a display processor 110. The display processor reformats the plurality of processed signals into a plurality of display signals in a format suitable for display on display 112 such as, for example, NTSC, RS-170 or PAL-B color video, and outputs the display signals to the display on medium 113. As will be discussed in further detail infra, the display processor may perform a plurality of functions such as, for example, reformatting for the display signals, calibrating the uncooled infrared sensor, eliminating bad pixel data, manual or auto focus adjustment, addition of symbols and/or other information to the display signals, adjustment of brightness and/or contrast of the display signals, and the like.

A controller 114 provides automatic and/or manual control of the display processor 110 to allow automatic and/or manual adjustment of the various display parameters such as for example, the brightness, the contrast, adding symbols, and the like. Alternatively, a high speed parallel link (HSL) such as an IEEE 1284 connection 118 or a serial interface such as an RS-232 connection 105, can be coupled to a host computer 103 to control the uncooled infrared sensor 104. The uncooled infrared sensor is powered, through power connector 103, by supply electronics 116 which may include any one of a battery, an AC power supply, or a DC power supply 116.

The uncooled infrared sensor 104 of FIG. 1 generally provides a 2-dimensional real-time display of an image for an operator of the system to view. For example, in a preferred embodiment of the uncooled IR system of the present invention, the FPA processor 108, includes an uncooled focal plane array 102 that, as will be discussed in more detail below, is configured to operate over at least one infrared (IR) wavelength band of interest. With this system, the operator can view thermal signatures of objects and/or scenery under conditions where the human eye would not normally be able to see the objects and/or scenery. For example, the imaging system may be used at night, in the day without washout conditions, in the presence of smoke, or in degraded weather conditions and the like.

The uncooled infrared sensor of FIG. 1 may also include a shutter 101 (shown in phantom). When the shutter is opened, incident IR energy impinges upon the FPA 102 and when the shutter is closed, no incident IR energy is allowed to impinge upon the FPA. The shutter may be controlled by a shutter controller (not illustrated) disposed within the display processor 110 and controlled via a control signal on line 98. However, it is to be appreciated that the uncooled IR sensor need not include the shutter mechanism and may alternatively include, for example, any standard hand adjustable, motorized or athermalized optics 106. The adjustable optics 106 of the uncooled IR sensor may be manually or automatically focused to either focus or defocus a scene to be viewed by the uncooled IR sensor. A user can simply manually adjust the manual focus of the optics, or the display processor may include an auto focus mechanism (not illustrated) to move the optics to focus and defocus the scene. As will be discussed in greater detail below, the display processor may also include a panel of control buttons 96, wherein one control button 97 may be used to control the focus mechanism of the optics in the manual mode.

The optics 106 of the IR sensor 104 may be any of a plurality of standard optics that are hand-adjustable, motorized, or athermalized. In particular, Table I illustrates a plurality of manually adjustable lenses, motorized lenses or athermalized lenses having various apertures (mm/in), field of views (FOV), F/No.(H), EFL (mm). Any of these lens assemblies may be attached to the uncooled IR sensor.

As will be discussed in greater detail infra, the FPA 102 includes a plurality of detector devices that make up a plurality of pixel elements of the FPA wherein each pixel element provides a signal representative of an amount of energy incident upon the individual detector. It is to be understood that for this specification a detector device is any device that includes a sensing element that provides an electrical signal in response to a sensed signal such as, for example, an electromagnetic signal by the sensing element. The detector device can be, for example, a bolometer detector, a photon detector, a ferroelectric detector, a diode detector, and the like. It is also to be understood that the sensing element may measure any physical parameter such as, for example, temperature, stress, signal amplitude, signal frequency, and the like. As will be discussed in greater detail infra, in one embodiment of the uncooled infrared sensor of the present invention, the FPA may comprise an array of microbridge bolometer detectors organized in rows and columns, having over 80,000 individual bolometer detectors.

As is illustrated in FIG. 2 the FPA 102 may be arranged in a grid of detectors including a plurality of columns ($C_1$, $C_2$, $C_3$, $C_4$, $C_5$, $C_6$, $C_7$ ...) and a plurality of rows ($R_1$, $R_2$, $R_3$, $R_4$, $R_5$ ...) wherein the individual detectors may be addressed using a row select register 94 and column circuitry 92. The column circuitry may address any column within the array and the row select registers may address any row within the array so that access may be had to any detector within the array. In FIG. 2, each individual detector provides a sensed signal that is coupled to the column circuitry, wherein each column is accessible by the associated column circuitry and each detector within each column is selected by the row select register. However it is to be appreciated that the circuitry may be provided so that each row of detectors provide a sensed signal that is coupled to row circuitry, wherein the row circuitry is substantially the same as the column circuitry above, and each detector may be selected with a column by a column select register that is substantially identical to the row select register discussed above. As will be discussed in greater detail below, a preferred embodiment of the FPA comprises a plurality of microbridge bolometer detectors.

FIG. 3 illustrates a block diagram of a focal plane array package 90, that includes the combination of the FPA 102 and the FPA processor 108 (see FIG. 1). The FPA receives IR signals through an IR window 88. The IR window may be made of a material transparent to the IR operating band such as, for example, germanium (GE) or the shutter 101 may replace the IR window. The FPA provides a detected signal for each detector within the FPA. The signal output by each detector within the FPA is typically small so that amplification of the signal is required. The read-out integrated circuit (ROIC) 15 houses the FPA and provides circuitry to amplify the detected signals, into amplified signals, a plurality of analog-to-digital converters (A/D) to convert the amplified signals to digital signals and circuitry to subtract an offset from each of the digital signals to correct for any non-uniformities that exist between each of the detectors, amplifiers, and A/D converters. As will be discussed in greater detail below, the offset value is provided by the display processor 110 on line 86. However, it is to be appreciated that the offset value may also be provided by the FPA processor and such modification is intended. The offset value is provided by the ROIC to do a course data substraction to offset any manufacturing inconsistencies and thereby allows the analog-to-digital converter to be only 14-bits of resolution. In contrast, if no offset correction were provided, then at least 20-bit resolution A/D converters may be required. As will be discussed in detail infra, the offset data is stored in memory in the display processor. However, it is to be appreciated that this offset data may also be stored in memory in the FPA processor and that such modification is intended.

The FPA package 90 also includes a temperature stabilizer 84 that is coupled to the ROIC 15. The temperature stabilizer has an input coupled to a temperature control signal 82 output by the display processor 110, which adjusts the average temperature of the ROIC and the FPA in response to the temperature control signal. The FPA package may also include a heat sink 78, and a cold shield or a shroud 76 which can be used to stabilize the temperature of the FPA package and, as will be discussed in greater detail below, to eliminate any local radiation from interfering with operation of the FPA assembly. In one embodiment of the uncooled IR sensor of the present invention, the temperature stabilizer may be a Thermoelectric (TE) cooler. The ROIC may include a temperature sensor such as, for example, a diode (not illustrated) on the ROIC which senses the temperature of the ROIC and outputs a temperature sense signal 80. The digitized temperature sense signal and the temperature control signal are communicated to the power supply module 116 (see FIG. 1) over the power supply connector 103. The FPA package outputs the temperature sense signal to the display processor which includes a temperature A/D converter 81 (see FIG. 4) for digitizing the temperature sense signal. The power supply module includes a high current bridge and filter for driving the TE cooler; these also form part a closed temperature control loop. The temperature control loop provides the TE cooler drive signal to the FPA package through the display processor. It is to be appreciated that although the bridge and filter have been illustrated as being within the power supply module, they may also reside within, for example, within the display processor and that such modification is intended. With this arrangement, the temperature of the ROIC and the FPA can be stabilized by adjusting the temperature with the temperature stabilizer. One method and apparatus for stabilizing the temperature of the FPA and the ROIC may include reading of the temperature from the ROIC in the FPA package; providing the temperature sense signal that is proportional to the temperature of the ROIC; generating the temperature control signal proportional to a desired temperature of the FPA and the ROIC with the TE driver; and stabilizing the temperature of the ROIC and the FPA by adjusting the temperature of the ROIC with the temperature stabilizer.

One problem with an uncooled IR sensor 104 such as illustrated in FIG. 1, is that it typically responds to all radiation incident upon the FPA 102, including radiation from its immediate surroundings. However, the predominant IR radiation entering the uncooled infrared sensor comes from the immediate surroundings and not from the scene that the uncooled IR sensor is focused upon. Because the uncooled IR sensor is sensitive to the radiation from its immediate surroundings, it may be that a change in the ambient temperature of the uncooled IR sensor may result in a loss of operating dynamic range of the IR sensor. For example, a change in the ambient operating temperature of the IR sensor may result in a reduced operating range of the IR sensor due to the local radiation swamping out any signals from the scene of interest. For example, a +/−20° ambient temperature change may be the entire ambient operating temperature dynamic range over which the IR sensor can operate. Accordingly, there is a need to compensate the uncooled IR sensor for varying ambient temperature changes to improve the operating dynamic range of the uncooled IR sensor.

One way to compensate for changes in the ambient temperature is to use the temperature compensation loop circuitry, including the TE cooler 84 discussed above. In particular, the ambient temperature at the ROIC 15 and the FPA 102 can be measured as discussed above; this assumes that the ROIC and the FPA package are at the ambient temperature. With this temperature compensating loop circuitry, the ROIC and the FPA can be compensated for any change in the ambient operating temperature of the uncooled IR sensor. In one embodiment of the invention, this open loop circuitry adjusts the ROIC and the FPA temperature approximately 1° for every 50° in ambient temperature change. In other words, if the ambient temperature goes up by, for example 100°, the ROIC and the FPA are lowered by 2° in temperature. Alternatively, if the ambient temperature falls by, for example, 50° then the ROIC and the FPA are increased by approximately 1° in temperature. Thus, the temperature compensating loop circuitry looks at the ambient temperature of the ROIC and the FPA and decides in which direction and by how much to adjust the temperature of the ROIC and the FPA for the changes in the ambient operating temperature of the uncooled IR sensor.

Another way in which to control the temperature of the FPA 102 and the ROIC 15 to help mitigate any effects of changes in the ambient operating temperature of the uncooled IR sensor 104 is to control the temperature of the shroud or cold shield 76 around the FPA assembly 90. Referring to FIGS. 1 and 3, the shroud or cold shield may be placed, for example, around the optics 106 and, if provided the shutter 101, and enclose the FPA assembly 90 so as to shield the FPA and the ROIC from any radiation other than the radiation from the scene in the field of view of the optics. The cold shield or shroud blocks any radiation from the immediate surroundings of the FPA and the ROIC and the unoccupied space within the FPA assembly can be pumped out and sealed to eliminate any further local source of radiation. In addition, the cold shield or shroud can be temperature controlled via the above-described temperature compensating loop to stabilize its temperature in an environment where the ambient operating temperature may change. This will result in the FPA and the ROIC seeing a constant temperature from the immediate surroundings and will increase the dynamic operating range and sensitivity of the uncooled IR sensor. For example, if the uncooled IR sensor only operates over the +/−20° dynamic range of ambient temperature described above, then with either of methods and apparatus discussed above, the dynamic operating range may be increased to, for example +/−60° in ambient operating temperature.

Still another way to control the temperature of the FPA 102 and the ROIC 15 for any changes in the operating ambient temperature of the uncooled IR sensor 104, may be to adjust either of the detector bias voltage or the detector bias current. Typically, each of the detectors in the FPA is biased with a bias current and a bias voltage. By changing either one of or both of these values, in response to a sensed temperature change with the above-described temperature compensating loop, each individual detector can be compensated for the change in operating temperature. This may require a calibration of the circuitry for each sensor within the FPA, but, as will be described in detail infra, the uncooled IR sensor has the capability to perform a calibration of each detector within the FPA. Thus, the calibration of each detector for changes in ambient temperature of the uncooled infrared sensor can be incorporated into this calibration data.

Another embodiment of a temperature compensating loop of the present invention is a closed loop implementation where instead of measuring the ambient temperature on, for example, the ROIC, the temperature of the FPA and the ROIC can be determined from the sensed signals output by the FPA and processed by the FPA processor 108 and the display processor 110. Otherwise, the circuitry of the closed loop temperature compensating loop will be the same as discussed above with respect to the open loop temperature compensating loop. The closed loop temperature compensating loop may comprise a signal averager coupled to the digitized output signal from the FPA processor. The signal averager may determine an average signal representative of an average temperature of the FPA and provide this average signal on an output line. The average signal then may be used to control the temperature stabilizer in the manner discussed above. The closed loop implementation of the temperature stabilizing loop may also be set so that a 50° change in ambient temperature in one direction will result in a 1° change provided by the TE cooler to the ROIC and the FPA in an opposite direction. One advantage of the closed loop implementation is that it exploits the temperature sensitivity of the FPA, as opposed to a diode or other temperature monitoring device disposed, for example, on the ROIC to temperature stabilize the FPA according to an average temperature of each of the detectors in the FPA.

As discussed above with respect to the open loop temperature compensating loop, the closed loop temperature compensating loop may adjust the temperature of the FPA 102 and the ROIC 15 or may adjust the temperature of the shroud or cold shield 76 surrounding the optics, the shutter and the FPA package, as discussed above. Alternatively, this closed loop temperature compensating loop may be used to vary one or both of the detector bias voltage and the detector bias current to control the operating point of each detector within the FPA.

It is to be appreciated that although it has been disclosed that a shroud or cold shield may be used to enclose the optics 106, the shutter mechanism 101 and the FPA assembly 90, that another manner for shielding the FPA 102 and the ROIC 15 from local radiation is to control the temperature of the housing that surrounds the FPA assembly. In particular, instead of providing a shroud or cold shield, one can simply stabilize the temperature of the housing to the desired temperature and thus eliminate the need to provide an extra cold shield or shroud.

FIG. 4 illustrates a schematic block diagram of an embodiment of the display processor 110 of the uncooled IR sensor of the invention. The FPA processor outputs a digitized data signal on line 111 to the display processor. (See FIG. 1). The display processor performs non-uniformity correction and defective pixel substitution processing on the digitized data. It was previously discussed above that coarse offset values are provided on line 86 (see FIG. 1) by the display processor to the FPA processor to correct for any non-uniformities in the FPA 102 and the ROIC 15. The display processor also includes a pixel (fine) offset corrector 48 that receives fine offset values on line 49 from an offset memory 50 and subtracts the fine offset values from the received digitized data. Offset corrected data is then provided on line 51 to a gain controller 52. The gain controller receives gain correction values on line 53 from a gain memory 54 and subtracts the gain correction values from the offset corrected data to perform gain equalization on the offset corrected data and provide gain corrected data on line 55. The gain correction data in gain RAM 54 is preprogrammed gain values stored in the gain memory to account for any manufacturing differences. The gain corrected data is provided to a pixel substitution controller 56. The pixel substitution controller may correct the gain corrected data for a defective pixel by averaging a plurality of pixels adjacent to the defective pixel and substituting an average value for the defective pixel to yield corrected data on line 57. The pixel substitution controller may receive defective pixel information from the gain memory on line 59 that has been pre-programmed at the factory. It is to be appreciated that any of the pixel offset corrector, the gain controller and the pixel substitution controller may be turned on or off, for example, by a bit within a control word provided by host computer 103 (see FIG. 1). As will be discussed in greater detail below, the corrected data may be supplied to an equalization controller 58 to convert the corrected data to a format suitable for display. In particular, as will be discussed in detail infra, the equalization control loop may compute an intensity histogram and from this intensity histogram determine a non-linear transfer function to be applied to the corrected data to map the corrected data to, for example, an 8-bit display format. As will be discussed below, this non-linear transfer function is a variation of a technique known to one of skill in the art as plateau equalization.

It is to be appreciated that the offset memory 50 and the gain memory 54 may be, for example, a random access memory (RAM). In one embodiment of the display processor 110 of the invention, the fine offset correction values, the gain correction values and the defective pixel information are initially stored in a non-volatile flash memory 60. The display processor reads these values from the flash memory into either a fast DRAM or a fast SRAM that make up the offset memory and the gain memory.

The display formatted data is provided on line 61 to a video digital-to-analog converter (DAC) 62 for generation of analog video data to be output by the display processor on line 113, for example, to the display 112. In particular, the display processor may include a video encoder (not illustrated) for generating a color composite video signal with blanking and sync (CVBS) and separate video (S-video). The encoder may also be programmed to supply many different formats of video. In a preferred embodiment of the uncooled IR sensor of the invention, the display processor 110 will output either NTSC, PAL-B, or RS-170, interlaced, square pixel video data. When composite color video is selected, for example, by a control word from the host computer 103 the data is supplied, color coded as YCrCb, which contains luminescence (Y), chrome red (Cr), and chrome blue (Cb) data fields within the video data. The display processor may also provide a gray-scaled data by setting the internal Cr and Cb gains to 0. This removes the color from the output video data. It is to be appreciated that another way to provide the gray-scaled video data is to provide the Y (luminance-only) video output of the encoder, which doesn't contain any color burst information. When digital video data is desired, the display processor may simply supply the Y (luminance-only) data.

The gain correction, the offset correction, and the equalization control may all be automatically done. However, one advantage of the uncooled IR sensor 104 of the invention is that all these functions may also be manually performed. For example, the uncooled IR sensor can be provided with the control panel 96 having a plurality of control buttons that allow manual adjustment of any of gain, the level, the calibration, the equalization, and the focus of the sensor. The controller 114 which interfaces to the display processor may also house the plurality of control buttons to manually control any of, for example, the gain, the level, the calibration, the equalization and the focus of the uncooled infrared sensor.

FIG. 5 illustrates an example of a controller panel 96 that allows a user to manually control the uncool IR sensor 104. The controller includes a on/off switch 63 that allows power to be supplied to the uncooled infrared sensor; an auto-gain and auto-level button 64 (AGL) that evokes the automatic gain (contrast) and automatic level (brightness) implemented with the equalization controller 58, as will be discussed in greater detail below; a calibration button 65 that allows the user to self-calibrate the uncooled infrared sensor; a focus rocker panel 66 which allows the user to manually focus the motorized lens in the optics 106; a manual gain knob 67 which allows the user to manually enter a gain amount to be applied to the video signal; and a manual level knob 68 which similarly allows the user to enter a manual level value to the video signal. The AGL button issues a command to allow the camera to automatically set the image contrast and the brightness levels on the display of the video signal. In contrast, the manual level button allows the user to vary the brightness level and the manual gain button allows the user to vary the contrast of the image. The uncooled infrared sensor may also be calibrated, for example, every ten minutes. However, by pressing the calibration button, the user can also perform a manual calibration which will place the uncooled infrared camera into an inactive state for, in example, approximately one minute while the calibration takes place.

One method for calibrating the uncooled infrared sensor 104, when the uncooled infrared sensor includes the shutter 101 (see FIG. 1) may be to close the shutter so that the camera is looking at a uniform image across the FPA. All of the detectors of the FPA are assumed to be at the same temperature such as, for example, approximately 300° K. The resulting digitized video signal for each of the detectors or pixels provided by the display processor 110 can be stored in the offset memory 50 (see FIG. 4) as the fine offset memory values. The fine offset values, as discussed above, can be subtracted from the individual detector signals when the camera focuses upon a scene. According to another embodiment of the uncooled IR sensor of the invention, a calibration can be performed, for example, when the uncooled infrared sensor is not provided with a shutter mechanism by either automatically or manually defocusing the uncooled infrared sensor to defocus the scene incident upon the FPA. The defocused scene then presents a more or less uniform scene to each of the pixels of the FPA which can again be assumed to be approximately 300° K and can be used to perform the calibration as discussed above. One advantage of using the non-focused scene as the source of an image for the calibration is that the uncooled IR sensor can be provided without the shutter mechanism which contributes to the overall weight of the sensor. Thus, where the uncooled IR sensor weight is an issue, the sensor can be provided without a shutter mechanism and still be calibrated.

Referring again to FIGS. 1 and 4, the display processor 110 also includes an FPA integration time controller 66 which allows the integration time and the frame rate of the uncooled IR sensor 104 to be variable and programmable. For example, the display processor can be programmed with control bits provided, for example, by the host computer 103 (see FIG. 1) to control a horizontal sync pulse (HSYNC) provided by the display processor to the FPA processor 108, which in turn, varies the FPA integration time. For example, it may be desirable to operate the uncooled infrared sensor at a frame rate of, for example, 60 Hz to update the display quickly for fast moving images or because the uncooled IR sensor itself may be moving. For such an application, a slower frame rate may not accommodate the dynamically changing video information. In contrast, if the camera and the scene to be viewed are static, a slower frame rate and thus a longer integration time may be used. As discussed above, the signal from any detector within the FPA 102 may be read out by corresponding column circuitry 96 and row select registers 94. The signal from each detector may be, for example, provided to an integration capacitor. The integration capacitor integrates the signal output by the associated detector. The length of time that the integration capacitor may integrate this signal can be varied by circuitry such as disclosed in pending U.S. application Ser. No. 08/914,703, entitled Digital Offset Corrector, herein expressly incorporated by reference. In particular, the integration time is the amount of time that the HSYNC pulse supplied by the display processor to the FPA assembly is not asserted. Thus, the pulse width of the HSYNC pulse can be varied to accomplish this variable integration time. An advantage of this variable integration time is that the uncooled infrared sensor can then be operated in greatly varying dynamic scenes or environments.

FIG. 6 illustrates a schematic block diagram of the equalization controller 58 of FIG. 4. As discussed above, the equalization controller provides level control and gain control to the previously corrected data on line 57 and transforms the previously corrected data into a word size suitable for display on the display 112 (See FIG. 1). It is to be understood that for the present invention "level control" is defined as correcting the digital video signal to set a mean value of the video signal to a desired level such as, for example, a value of "0". It is to be understood that the level control and thus the mean value can be automatically or manually adjusted, as discussed above, and that the mean value can be any value and it is not intended to be limited to "0". It is also to be understood that gain control is defined by the present invention as the mapping of an intensity of the pixel signal information with a certain gain factor to achieve an output quantized image that is consistent with a word size format suitable to be displayed on the display. In one embodiment of the equalization controller of the present invention the corrected data input signal is a 14-bit signal and an output of the equalization controller is compressed to an 8-bit signal suitable for display. The uncooled IR sensor 104 of the invention receives energy with a very high dynamic range, and quantizes the received energy into corrected data from the FPA 102 at, for example, a 14-bit quantization level. However, for a real-time display of such an IR image, the digital data may need to be mapped from its original resolution to an 8-bit version for display. Thus, the equalization controller acts to truncate the input signal and squeeze the input signal into an 8-bit display format.

As will be discussed in greater detail below, the equalization controller 58 includes both histogram and plateau equalization so that the mapping of the original data is not linear. In particular, the sky or the ground are typically points of interest for a scene to be viewed by the uncooled IR sensor 104 of the invention. However, the data points in between may not necessarily be of interest. Therefore, it is ideal to apply a large gain to the points of interest and to apply very little or no gain to the areas that are not of interest, so that the areas of interest are displayed and the areas that are not of interest are not. Accordingly, it is desired to optimize the transfer function applied to the video data to be output to the display. This is accomplished by the equalization controller of the present invention.

Referring to FIG. 6, the 14-bit digital corrected data on line 200 is truncated to 11-bits. The truncated 11-bit word is provided on line 202 to a histogram generator 204. Referring to FIG. 7, the histogram generator provides on line 205, a plot of the number of pixels (on the y-axis) at a plurality of intensity values (on the x-axis). An idealized transfer function discussed above would apply all of the gain to the pixels having the intensity value within the peak (P) of the curve as illustrated in FIG. 7, and little or no gain to the pixel values having the intensity outside of this peak. It is to be appreciated that the histogram can be generated, for example, for one frame of the output video signal, or for an average of several frames, as desired. The histogram data is then output to a low-pass filter 206. The low-pass filter smoothes out any fast moving images within the histogram data so that a fast moving image does not swamp the equalized data output by the equalization controller. In other words, the low-pass filter smoothes ensures that the histogram is applied over several frames of the data.

Typically, the histogram data on line 205 is integrated via the integrator 208 illustrated in FIG. 6 to provide the transfer function to be applied to the corrected data. However, one problem with histogram equalization is that the resulting gain applied to the corrected data is applied mostly to the pixels in the main peak of the histogram and there is little room remaining to apply any gain to any other pixels of interests. This tends to result in an unsatisfactory display, where the noise in the vicinity of the histogram peak has been amplified at the expense of, for example, information in parts of the remainder of the picture with a typical levels. Accordingly, the present invention, prior to integrating the histogram data passes the histogram data on line 207 to a plateau processor 212. The plateau processor clips the peak (P) and the tails (T) of the histogram data as illustrated in FIG. 7. By clipping the peak value to an arbitrary value, the plateau processed data on line 209 may then be integrated with the integrator to output a transfer function illustrated in FIG. 8, that is de-emphasized with respect to the pixels of interest. In addition, by clipping the tails of the histogram, the integrated data will provide a fixed gain to these pixels. In other words, the clipped histogram data is fed to the integrator and the integrator integrates the histogram to provide at an output a transfer function that is de-emphasized with respect to the clipped regions of the histogram data.

The integrated transfer function data on line 211 output from the integrator has a slope and an offset value that may be stored in a slope table 214 and an offset table 216 provided in memory. The corrected data on line 201 output by the pixel substitution controller 56 (see FIG. 4) is multiplied with multiplier 216 by the slope of the gain of the transfer function provided by the slope memory on line 213, to scale the intensity of the signal to be output by the equalization controller. An offset value on line 215 is added to the scaled signal on line 217 to set the mean value of the signal to be output to, for example, a value of "0" as is illustrated in FIG. 9. The equalized signal on line 218 will be, as discussed above, compressed in dynamic range or in other words, mapped to a format suitable for display on display 112. As discussed above, if a composite color video is desired, chroma-red (Cr) and chroma-blue (Cb) data can be added to the corrected luminance only (Y) data output by the equalization controller on line 218. Alternatively, if digital video is desired or if gray-scale video is desired, the Cr and Cb data need not be added to the corrected data. As discussed above with respect to FIG. 3, the corrected video data is then supplied to the video DAC 62 to provide the output video data.

It is to be appreciated that the histogram can be computed on any number of pixels of the display that may be automatically selected or, selected by the user such as, for example, by a control word provided by the host computer 103 (see FIG. 1). It is also to be appreciated that although the description has been with respect to computing a histogram and providing plateau equalization to the histogram to yield a transfer function to be applied to the corrected data, that any transfer function may be applied to the corrected data and that according the present invention, such transfer function may be programmed by the user. Thus, an advantage of the uncooled infrared sensor of the invention is that it provides flexibility in the equalization control and transfer function to be applied to the corrected data for display.

It is also to be appreciated that the above-described equalization controller can be implemented in hardware, in software, or in a combination of both. For example, in one embodiment of the equalization controller of the invention, a programmable logic device (PLD) may be used to implement the equalization controller. Alternatively, the equalization controller may be implemented for example, with a digital signal processor and appropriate software. In addition, as discussed above, the equalization controller can be either automatically controlled or user-controlled.

FIG. 10 illustrates a drawing of a portion of the FPA 102 of FIG. 1. The FPA 102 comprises a plurality of detectors 10 as discussed above. In one embodiment of the FPA 102 of the present invention, the FPA is organized as a matrix of 246 rows of the detectors by 328 columns of the detectors to yield over 80,000 individual detectors within the FPA. Referring to FIG. 1, the display processor 110 may process, for example, the center 320×240 detector signals and supply coarse offset values on line 86 to each of the 328×240 sensors. Referring to FIG. 2, each row ($R_1$, $R_2$, $R_3$, $R_4$, $R_5$ . . . ) in the FPA is addressed using a dynamic row select register 104 and each column ($C_1$, $C_2$, $C_3$, $C_4$, $C_5$, $C_6$, $C_7$) within the FPA is addressed using column circuitry 200 that addresses any particular column. Thus the combination of the column circuitry and the row select registers allow any detector within the FPA to be addressed.

One problem with the FPA and associated circuitry as illustrated in FIG. 2, is that noise exists and tends to be correlated between the columns or rows. A user may see the correlated noise on the display and this correlated noise may produce a distorted image to the user. For example, the user may see the correlated noise as horizontal lines for noise within a particular row or vertical stripes for noise within a particular column. According to the present invention, one way to eliminate these correlated noise effects is to average the noise for a particular row or column and to subtract the averaged value of the noise for the particular row or column from the row or column.

Typically the noise drifts between the columns and rows and the amount of drift in the noise between a row and column are typically different. For example, each column circuit may behave a bit differently from the other column circuits to provide this correlated noise between the columns. The column correlated noise, can be subtracted out by simply averaging the detectors within a single column and subtracting the average of the noise from the detectors within a single column from each detector within a column. It is to be appreciated that this average computation of the noise for each column does not need to occur for every frame of the video signal, but that the substraction of the average noise value from each detector within the column should occur for every frame of the video signal. However, it is also to be understood that the computation of the average noise for each column can occur for every frame of the video signal and that such modification is intended.

For the rows within the FPA 102, the correlated noise between the rows tends to be the result of time varying issues. In particular, each row within the array is sampled at a particular time and the noise associated with that row is correlated to the respective time value. Therefore, there may be more drift between the rows. According to the invention, an average of the correlated noise for each row can be determined and subtracted from each detector within each row such as described above for each column. Because the row correlated noise occurs typically more rapidly, this calculation should be done for each frame of the video signal and subtracted from each pixel within the row for each frame.

One problem with subtracting the average signal from the row or column is that using an average value of noise of a row or a column when there is a hot spot in the row or column such as, for example, when there is a hot target in the row or column that will distort the average calculation and may actually exacerbate the noise problem that the eye tends to see on the display. The present invention solves this problem with one embodiment by spatially masking the FPA 102 to provide a masked area 70 and an unmasked area, as illustrated in FIG. 11, and sampling pixels within either rows or columns or both of the spatially masked area of the focal plane array. The FPA has been spatially masked to provide an area 71 that displays the scene and to provide an area 70 that does not display the scene. Individual rows, columns, or pixels within each row or column can then be averaged within the masked area that does not display the scene to determine an average correlated row or column noise and this correlated row or column noise can be subtracted from each of the associated row and column pixels within the area 71 that displays the scene.

In an alternate embodiment of the present invention, the individual detectors within either or both of the rows and columns can be sampled during a blanking interval where the signals from the individual detectors are not used. For example, rows 243-246 and columns 1-328, can be sampled during the blanking interval to determine an average row and column correlated noise that can be subtracted from the detectors of the remainder of the FPA. With either of these embodiments, no signal from any target is present within the signal used to determine the average correlated noise and therefore no target will disturb the subtraction of the correlated noise.

It is to be appreciated that the spacial windowing of the FPA can be encompassed by any method known to those of skill in the art to limit the field or view of the system such as, for example, by opening and closing the shutter as discussed above, by zooming in and zooming out with the adjustable optics, and by limiting the part of the focal plane array that is mapped to the display, as discussed above, to for example, a center ⅕th of the plurality of detectors. By limiting the field of view or by "windowing of the array", this portion of the array is essentially being blown up on the display and the remainder of the array is essentially not used. Therefore, the pixels within the rows and columns of the remaining array can be used to determine the average row and column noise that can be subtracted from the portion of the array that is used to provide the image for the display.

FIG. 12 is a side elevation view of an embodiment of a detector device 10 according to the present invention. This embodiment of the detector device 10 has an elevated microbridge detector level 11 and a lower level 12. It is to be understood that for the present specification a microbridge is any structure that is suspended above any surface. The lower level 12 may include a semiconductor substrate 13 having fabricated thereon components of the ROIC (See FIG. 2) 15. It is to be appreciated that numerous components such as for example diodes, FET's, bus lines, connections, contact pads, and the like can be fabricated using conventional fabrication technology and that such components are intended. For example, an electronic ROIC for a detector or an array of detectors such as disclosed in co-pending U.S. patent application Ser. No. 08/521,266 filed on Aug. 30, 1995, herein incorporated by reference, can be disposed in the semiconductor substrate 13 and is intended.

The components of the ROIC are coated with a protective layer of silicone nitride 16 which protects the ROIC from contamination. The elevated microbridge detector level 11 includes a silicone nitride layer 20, a resistive layer 21, a silicone nitride layer 22 disposed above the silicone nitride layer 20 and the resistive layer 21, and an optional IR absorbing layer 23 disposed over the silicone nitride layer 22. Downwardly extending silicone nitride layers 20' and 22', provide sloping support walls for legs 38, 40 (not illustrated) that support the elevated microbridge detector level 11.

This embodiment also may include a thin film layer 18 of reflective material deposited on the lower level 12, to provide a cavity 26 between the elevated microbridge detector level 11 and the lower level 12. A vertical distance d, between the reflective layer 18 and the upper microbridge detector level 11, is chosen so that incident energy passing through layers 20, 21, 22 and 23 (if provided) is reflected by layer 18 upwardly and has constructive interference properties with the IR energy initially incident on the upper microbridge detector level 11. In particular, the distance d is chosen to be substantially a quarter of a wavelength of a wavelength band of operation of the detector device, so that a phase of the reflected energy is coincident with a phase of the incident IR energy on the upper microbridge detector level. The resistive layer 21 and the optional IR absorbing layer 23 make up an active area 32 (not illustrated) of the detector. The active area absorbs the incident IR radiation and converts the absorbed IR radiation into heat. A resulting temperature change of the active area is sensed by measuring a change of resistance of the active area, which is a function of the temperature change.

It is to be understood that for this specification the pixel collecting area is defined as the area over which the detector device absorbs energy that is incident onto the detector device. It is also to be understood that the active area 32 is defined as the total area that includes either one or both of an IR absorbing layer 23 and the resistive layer 21 that makeup the active area of the detector. In addition, it is to be understood that the pixel area or pitch is the area containing the detector device, or in other words the area that includes either one or both of the upper microbridge level 11 and the ROIC 15 on the lower level 12. It is further to be appreciated that the fill factor is a fraction of the pixel area that includes the active area of the detector.

A sensitivity of the detector device 10 of FIG. 12 is a function of many factors including an absorption coefficient of each material making up the active area 32 of the device over the desired wavelength band of operation, the physical structure of the detector including the cavity structure 26, a thermal isolation of the active area provided by the microbridge structure 11, and the like. For example, the cavity 26 and the microbridge structure 11 provide thermal isolation of the active area from its surrounding such as, for example, the ROIC 15 on the substrate 13, so as to obtain higher isolation than if the active area were disposed on the top surface 14 of the semiconductor substrate 13. The microbridge structure 11 of FIG. 12 also provides for a larger fill factor than a single level detector device disposed with the substrate 13.

A thickness t of all of the layers 20, 21, 22, 23 and the distance d between the upper level 11 and the reflecting layer 18 may be chosen to achieve peak absorption over the desired operating wavelength band. More specifically, the thickness of layers 20-23 may be chosen to optimize a thermal mass of the microbridge level 11 to achieve peak absorption over the desired operating wavelength band, and the distance d may be chosen to achieve constructive interference between any energy not initially absorbed by the active area 32 that is reflected from layer 18, and the IR energy initially incident on the upper microbridge level 11.

FIG. 13 is a side elevation view of another embodiment of a detector device 100 according to the present invention. This embodiment of the detector device 100 also has an elevated microbridge detector 11 and a lower level 12. The lower level 12 may also include the ROIC 15 within the semiconductor substrate 13 as discussed above.

According to this embodiment of the detector 100 illustrated in FIG. 13, the detector device has a reflective concentrator 34 between the microbridge level 11 and the lower level 12. The reflective concentrator concentrates incoming IR radiation not initially detected by active area 32 back onto the active area. Preferably, the reflective concentrator 34 has a pixel collecting area having a dimension on a side $l_1$ in a range of 16-24 μm (for optical wavelengths in a range of 8 to 12 μm) and the active area has a length on a side $l_2$ of about 5 μm. The optical concentrator 34 acts to create the pixel collecting area of the detector device that is greater than the area of the active area.

FIG. 14 is a top plan view of the elevated microdetector level 11 of the detector device of FIG. 13. This drawing is shown as though the active area 32 is transparent to illustrate connections of the active area 32 to metal leg interconnects 38 and 40. In a preferred embodiment, the metal leg interconnects connect to a top surface of the active area at respective sides 39, 41 of the active area. However, it is to be appreciated that connections to any portion of the active area are possible and are intended.

The concentrator 34 of this embodiment of the detector 100 is shaped to provide the distance d between the upper microbridge 11 and a bottom of the concentrator 34, and so that the overall shape of the concentrator provides constructive interference properties between energy not initially absorbed by active area 32 and reflected by concentrator 34, and the energy initially incident on active area 32. Bridge layer 42 may be chosen to reflect little radiation and generally to transmit a substantial percentage of the incident IR radiation through to the concentrator 34, which in turn concentrates the incident IR radiation back onto the active area 32 to provide the increased pixel collection area. The metal interconnects 38 and 40 are connected to the active area 32 at the respective sides 39 and 41 of the active area 32 and provide a detected signal to the ROIC 15 at the lower level 12. The detected signal corresponds to the sensed change in resistance of the active area 32. The metal interconnects 38 and 40 are constructed and arranged so as to continue down sloped walls 46 of the concentrator 34 to the lower level 12 and make electrical contact with, for example, via holes 190 that connect to contact pads 43 and 44 disposed on the lower level.

For each of the embodiments of the detector device described above, there is a need to reduce the size of the detector device and in particular, the size of the active area 32 of the detector device, while maintaining an absorption sensitivity and while maintaining a thermal time constant ($t_c$) to within a desired operating range. In particular, in a preferred embodiment of the uncooled IR sensor 104 of the present invention, the time constant is to be in a range of 5 to 20 milliseconds for an IR wavelength band of operation in a range of 8-12 μm. The lower limit of 5 milliseconds is a function of the frame rate of the IR sensor and the noise of the sensor, and the upper limit is a function of a need to see fast moving scenery and a threshold above which an eye will tend to see blurring of the displayed infrared signal. Referring to Equation (1), it is known to one of skill in the art that the time constant ($t_c$) of the detector device is equal to the thermal capacitance (C) of the detector device divided by the thermal conductance (G) of the detector device.

$$t_c = \frac{C}{G} \qquad (1)$$

The thermal capacitance of the detector device is proportional to the size of the active area of the detector device. In particular, the thermal conductance is, as will be discussed in greater detail below, inversely proportional to a length (l) of the conductive legs (see 38, 40 in FIG. 4) coupling the active area 32 on the microbridge level 11 to the substrate on the lower level 12. As the active area of the detector device is reduced, the thermal capacitance goes down and thus the thermal time constant $t_c$ also goes down. In addition, when the size of the active area is reduced the absorption sensitivity of the detector device goes down. Thus, there is a tradeoff with each of the thermal time constant and the sensitivity of the detector device, and the size of the detector device. The present invention seeks to reduce the pitch of the device including the size of the active area of the detector device while maintaining the thermal time constant to within the desired operating range and the sensitivity of a larger detector device.

One way to maintain the thermal time constant $t_c$ to within the desired operating range while decreasing the size of the active area is to increase the length (l) of the legs between the microbridge level 11 and the semiconductor substrate 12, by an amount proportional to the decrease in the size of the active area, to maintain the desired time constant. The length of the legs for this embodiment can be increased by winding the legs around the reduced active area in the space given up by the reduced active area. In addition, the sensitivity of the larger detector device may be accomplished by the reflective concentrator 18, 34 that enhances absorption of the incident energy with the smaller active area thereby maintaining an optical sensitivity of larger active area devices.

The thermal conductance (G) of the legs is determined as shown in the following equation:

$$G = \frac{(K)(w)(t)}{l} \quad (2)$$

where G is the thermal conductance of the detector device; K is the thermal conductivity of the material used to provide the active area 32 and the conductive legs 38, 40; between the microbridge level 11 and the substrate; w is a width of the legs; t is a thickness of the material forming the legs and the active area, and l is the length of the legs between the active area 32 and the contact pads on the substrate 13. In order to fabricate detector devices of these dimensions, the width w and the thickness t of the legs are typically fabricated to a certain size limited by the processing technology and also by the need to be able to support the upper microbridge level 11.

FIGS. 15(a), (b), (c) illustrate three different embodiments and methods of fabricating the conductive legs 38, 40 of detector 10 (see FIG. 12) and detector 100 (see FIGS. 13-14) according to the present invention. In FIG. 15(a), M1 is a mask used to form the leg metal conductor (LMET) between the upper microbridge level 11 and the substrate 12. In addition, M2 represents a mask that is used to form a bridge or supporting layer on which the LMET will reside. As will be discussed in greater detail below, typically the LMET may be made from any of titanium-tungsten (TiW), vanadium oxide ($V_2O_3$), Nichrome (NiCr), or platinum. A problem with the structure and process for fabricating the conductive legs and bridge layer between the microbridge level and the substrate as illustrated in FIG. 15(a), is that the process limits the leg width w of the conductive legs.

Referring now to FIG. 16, there are illustrated some of the process steps for forming the conductive legs illustrated in FIG. 15(a). In particular, as will be discussed in greater detail below, one step of the process of forming the detector devices discussed above is to provide a protective layer 16 above the semiconductor substrate 13. Deposited above the protective layer is a silicone nitride (SiNi) layer 20 (step A). The leg metal layer 21 such as, for example, NiCr is then deposited on the SiNi layer (step B). The leg metal layer is then masked with the mask M1 (see FIG. 15(a)) and etched to form the leg metal pattern 38 (step C). An additional SiNi passivation layer 23 may then be deposited on top of the existing structure (step D). The structure is then masked via mask pattern M2 and etched to form the leg and bridge structure illustrated in FIG. 15(a) (step E).

It is to be appreciated that for this application, the minimum leg width w is defined by the greater of the LMET width and the width of the bridge supporting the LMET (see FIG. 15(a). The above-described process results in a minimum leg width of about 3.5 microns, wherein the LMET width is approximately 1.5 microns. The leg width w determines the thermal conductance of the connector device as discussed above with respect to Equation (2). Accordingly, it is the goal of the present invention to be able to use the same processing equipment and to change the leg width w and/or thickness to provide the detector device with a better thermal conductivity G.

One embodiment of the present invention as is illustrated in FIG. 15(b) uses a method as will now be described to reduce the leg width w to yield a better thermal conductivity G which is used to offset a decrease in the size or pitch of the detector device. According to this embodiment, the detector device of the present invention can be made smaller (a smaller pitch), while maintaining the thermal time constant within the desired operating range discussed above and while maintaining a sensitivity of a larger detector device, using existing fabrication equipment technology.

FIG. 15(b) illustrates this embodiment of a leg structure according to the present invention. It is to be appreciated that for this specification, this embodiment will be called the "co-aligned" leg structure. FIG. 17 illustrates the fabrication process for the co-aligned leg structure. Steps A and B for the co-aligned leg structure are the same as described above with respect to FIG. 16, except that instead of using NiCr as the leg 38 metal (LMET), TiW is preferably used and deposited in step B. Mask M1 is used to pattern and etch the TiW to a width W1 that is wider than the final LMET width w, as illustrated in FIG. 15(b) (step C). As discussed above with respect to step D of FIG. 16, a protective layer of SiNi is then deposited above the patterned TiW leg structure 38, as illustrated in FIG. 17 (step D). Mask M2 is then used to pattern and etch both the SiNi layer 23 and the edges 28 of the TiW leg metal pattern to yield the structure illustrated in FIG. 15(b). One disadvantage of this structure is that the SiNi layer 23 does not cover the sides of the LMET. However this method and structure provide an overall narrower leg width was compared to the structure of FIG. 15(a). In particular, for this embodiment, the leg width w may be reduced to approximately 1.5 microns.

Referring now to FIG. 15(c), there is illustrated another embodiment of a leg structure according to the present invention. It is to be appreciated that this embodiment of the leg structure will be termed a "self-aligned" leg structure. The self-aligned leg structure has substantially the same leg width was the co-aligned leg structure illustrated in FIG. 15(b). However, the self-aligned leg structure has a reduced thickness t as compared to the previously described leg structures. Referring to Equation 2 above, a reduced thickness t of the leg structure also yields a reduced thermal conductance G of the detector device. FIG. 18 illustrates the process for fabricating the self-aligned leg structure. Steps A through D are the same as discussed above with respect to the embodiment of FIG. 15(a) and illustrated in FIG. 16. The SiNi layer 23 is then masked and etched so that all nitride 16, 23 is removed from the above and around the LMET, as illustrated in step E.

The detector devices 10, 100 of the present invention can be made with the leg structures of FIGS. 15(a), (b), (c) as discussed above, to provide a reduced sized detector device having an improved sensitivity. The leg structure illustrated in FIG. 15(a) when incorporated into the legs 38, 40 of the detector 10 of FIG. 12 and having a pitch size of 48 μm typically has a minimum temperature resolution on the order of 60° mK; whereas, the same detector device fabricated with the co-aligned leg structure illustrated in FIG. 15(b) may achieve minimum temperature resolution on the order of approximately 30° mK; moreover, the same detector device fabricated with and the self-aligned leg structure illustrated in FIG. 15(c) may achieve on the order of approximately 20° mK.

The detector structures 10, 100 of the present invention may be fabricated using existing processing techniques. More specifically, for either of the detector device embodiments, the ROIC 15 may be fabricated at the surface 14 of the substrate 13 using a standard IC process. The layer of dielectric 16, such as for example silicon nitride, may then be deposited on the IC 15 and the lower level 12.

The embodiment of the detector device 10 illustrated in FIG. 12 may be fabricated with the steps now described. Following deposit of the dielectric layer 16, a thin film layer 18 of reflective material, such as a metal film like Pt or Au, may be deposited. A layer of phos-glass or other easily soluble material 180 in the range of, for example, about 1-2 microns thick may be deposited and sloped walls may be formed in the easily soluble material. As discussed above, the layer of easily soluble material may be chosen so that the distance d between the reflective layer 18 and the upper level 11 of the microbridge structure has constructive interference properties so that enhanced absorption is achieved over, for example, the 8-14 micron IR wavelength range. The layer of SiNi 20 may be deposited on top of this structure and on the sloped walls to form the sloped walls 20'. The resistive film layer 21 that makes up the active area of the device may be deposited. It is to be appreciated that the resistive film layer can be any of the materials discussed above. The leg connections 38, 40 (not illustrated) down to the substrate are then formed according to any of the leg embodiments described above; this step includes the step of providing the SiNi passivation layer 22, 22' above the layers 21 and 20 and above the legs 38, 40 on the sloped sidewalls 20'. A thin film metal absorbing coating 23 may optionally be deposited on top of the upper microbridge level. Slots or windows (not illustrated) are then opened within the SiNi areas to provide access to the easily soluble phos-glass layer 180 beneath the SiNi layers 20, 22. The phos-glass is then dissolved from beneath the upper bridge level 11 to provide the detector structure having any one of the above-described leg structures.

Referring to FIG. 19, the steps for fabricating the detector structure 100 illustrated in FIGS. 13-14 will now be described. After the dielectric 16 has been deposited, the shape of the concentrator 34 is then fabricated in either the dielectric layer 16 or in an additional dielectric layer (not illustrated) deposited on top of the dielectric layer 16. The sloped side walls 46 of the concentrator 34 can be fabricated using standard sloped dry etch techniques of the dielectric. The shape and the depth d of the concentrator depend on the specifics of the cavity structure and detector device structure that is being fabricated.

A surface 35 of the reflective concentrator 34 is then passivated with a second dielectric layer 170, such as for example silicon nitride, that will not be etched by a subsequent etching step to remove a sacrificial layer 180 such as, phos-glass, that is to be deposited on top of the concentrator as will be discussed infra. At least one via contact opening 190 is then provided in the second dielectric layer 170 by masking the second dielectric layer and etching via the contact opening through each of the second dielectric layer and the first dielectric layer down to respective contact pads 43, 44 on the substrate level 12 (See FIG. 14), or in other words down to the ROIC 15. A thin film layer of reflective material 200, such as, for example, metal film Pt or Au is then deposited on the second dielectric layer to form the reflective surface of the concentrator 34 and to provide electrical connection from the electrical concentrator 34 to the contact pads 43, 44 of the IC 15. It is to be appreciated that the thin film layer of reflective material is removed outside of the pixel area so that a plurality of detector devices 100 can be provided that are electrically isolated from one another.

The sacrificial layer 180 of undoped glass, phos-glass, silicon dioxide, or other easily soluble material is then deposited on the reflective surface 200 of the concentrator to fill the reflective concentrator and to provide a substantially flat surface 192. It is to be appreciated that the concentrator filled with the soluble material can include a third layer of passivation (not illustrated) disposed above the thin film metal of the reflective concentrator, if so desired. As discussed above, the depth d between the lower most point of the reflective concentrator 34 and the microbridge level 11 is provided so that incident electromagnetic radiation reflected by the concentrator 34 is reflected toward the microbridge level 11 and more specifically the active area 32, and has constructive interference properties with the electromagnetic radiation incident on the active area 32. An advantage of the concentrator 34 is that the sensitivity of the detector device 100 is increased to provide a pixel collecting area that is larger than the area of the active area 32 of the detector device.

The various layers of the active area 32 are now deposited on the substantially flat microbridge surface 11. In particular, a first supporting layer 20, such as for example silicon nitride, is deposited on the substantially flat surface of the microbridge level 11. A resistive film layer 21 having a high thermal coefficient of resistance (TCR), such as for example any of TiW, NiCr and VO$_x$, is then deposited on the first supporting layer to form the active area 32. The resistive film layer is then masked and etched in a pattern to form at least a part of the active area 32, and the leg structures 38, 40 between the resistive layer 21 and reflective metal 200, described above, using any of the leg structures described and illustrated above. The resistive film outside of the active area 32 is also etched away. A thin film absorbing layer 23 such as, for example, silicon nitride or a thin metal, may optionally be deposited on top of the resistive film layer if needed to increase absorption efficiency of the detector device 100.

The thin film absorbing layer 23, the resistive film layer 21, and the first supporting layer 20 are then masked to define the shape of the active area 32. The slots or windows may then be opened within the SiNi areas outside of the active area, and etched down to the sacrificial layer 180 filling the reflective concentrator 34 to substantially expose the sacrificial layer. The sacrificial layer is then dissolved using a selected etching process that removes the sacrificial layer without removing the layer of the active area and the leg metal connections to the reflective concentrator 34 so that the active area 32 is suspended over the concentrator 34, is thermally isolated from the lower substrate level 12 and electrically connected to the substrate level 12 by the metal interconnects 38, 40 and the vias 190.

An advantage of the embodiment 100 of the detector of FIGS. 13-14 is that the concentrator 34 can be provided between the active area 32 and the substrate level 12 using conventional processing techniques. In addition, it is to be appreciated that another advantage of the detector embodiment 100 is that the metal interconnects 38, 40 connecting the resistive film layer 21 of the active area 32 and the integrated circuit 15 on the substrate level 12 are formed through the reflective concentrator 34, eliminating any need to use space outside of the reflective concentrator to provide the metal interconnects.

FIG. 20 illustrates a photo of the detector device 10 according to the present invention. In FIG. 20, there is illustrated a mesa point (MP) which connects the legs 38, 40 down to the ROIC 15 in the semiconductor substrate 13. The MP contact 190 ultimately contributes to an overall size or pitch of the detector device and thus to the pixel size within the FPA 102 of such detector devices. It can be seen that the MP contact is shaped like a basket, wherein a top of the basket is within the area dedicated to providing the detector device and a bottom of the basket is coupled to the substrate 13 (see FIGS. 13-14). A problem with this MP contact structure, as is illustrated in FIG. 20, is a percentage of the area that may be used to form the detector device is occupied or lost by the top of MP contact. Accordingly, one embodiment of the detector device 10 of the present invention is modified so that the MP contact via is inverted and so that the smaller dimension of the MP contact is within the area used to provide the detector device and the larger opening of the MP contact is coupled to the semiconductor substrate.

FIG. 21 illustrates a cross-sectional view of the inverted MP contact via 188. The inverted MP contact via, as discussed above, provides a connection between the conductive legs 38, 40 coupled to the resistive layer 22, and the contact pads 43, 44 on the semiconductor substrate 13. An advantage of this inverted MP contact is that more area is available to provide the detector device. Therefore, the pitch of the detector device 10 using the MP contact can be reduced, for example, from a 46 micron pitch to, for example, approximately a 28 micron pitch. This allows the detector device 10 of the present invention to be used not only with a video standard, necessitating an FPA 102 having approximately 328×240 pixels which was achievable with the detector device having a 46 μm pitch, but also to be used with, for example, a high definition TV (HDTV) standard which typically requires the FPA of detectors having on the order of 640×480 detectors. Thus, an advantage of this embodiment of the detector having an inverted MP contact is that the number of detectors can be increased by approximately four times and the FPA can have approximately four times the number of pixels.

The embodiment of the detector 10 having the inverted MP contact via 188 illustrated in FIG. 21 is fabricated with the steps now described with reference to FIG. 22. During fabrication of the ROIC 15 (see FIG. 12), a metal contact pad 43 is deposited on the semiconductor substrate 13. The metal can be, for example, platinum or NiCr. The metal may be planarized and a protective layer of dielectric 16, such as SiNi may be deposited on the metal contact pad and the ROIC (step A). The protective dielectric layer is then patterned with a mask and photo resist 17 and a hole 24 etched through the dielectric layer down to the metal contact pad for a connection to the metal contact pad (step B). A layer of metal 19 is then deposited over the protective dielectric layer and through the hole 24 down to the contact pad. The layer of metal may be for example, platinum or Nichrome (step C). A layer of dielectric 25 may then be deposited to fill the hole 24 making the connection down to the contact pad and the layer of dielectric may be planarized to be consistent with the top of the metal layer 19 (step D). It is to be appreciated that the dielectric can be, for example, either an oxide or a nitride and that no dielectric may be necessary if the dimensions of the contact hole are small compared to the operating wave length of the detector. Another layer of dielectric 27 such as, for example, oxide or nitride may then be deposited having a thickness that is to be a thickness of the inverted MP contact (step E).

The layer of dielectric 27 may then be patterned and covered with a photo resist layer 29 and etched to form a mesa dielectric 30 (step F). It is to be appreciated that although not illustrated in FIG. 22, the mesa dielectric 30 can also be located over the via hole 24 down to the metal contact pad 43 if the base of the MP contact, (the larger dimension of the MP contact) is larger than the diameter of the via hole down to the metal contact 43. A layer of metal 31 may then be deposited over the substrate to fill in the via hole 24 and to form the MP contact 188 (step G). Both metal layers 19, 31 may then be patterned with a photo resist by a mask and etched to define the contact from the contact pad 43 to the top of the MP contact 188 (step H). It is to be appreciated that at this point the reflector 18 (not illustrated) such as described above with respect to FIG. 12 may also patterned and etched.

As discussed above with respect to FIG. 12, a layer of phos-glass 180 or other easily soluble material having a thickness in the range of, for example, 1-2 microns is then deposited on the substrate 13 (step I). The thickness of the layer 180 may be chosen to be in a range of approximately one quarter of a wavelength of the operating wavelength band and sloped walls may be formed in the easily soluble material, as discussed above. A layer of nitride 20 such as, for example, SiNi may then be deposited on top of this structure and on the slope walls to form the sloped walls 20' (step I). As discussed above, the resistive film layer 21 such as, for example, $VO_x$ that makes up the active area 32 of the device 10 may then be deposited on top of the nitride layer (step J). It is to be appreciated that as discussed above, the resistive film layer can be any of the materials discussed above such as, for example, the co-aligned leg structure and the self-aligned leg structure.

The various leg connections discussed above from the active area 32 down to the top of the inverted MP contact 188, may then be formed. In particular, the layer of nitride 20 is masked, resist 33 is deposited and the nitride 20 is etched to form hole 36 above the inverted MP contact 188 (step K). Another layer of nitride 8 (not illustrated) such as, for example, SiNi may then be deposited, patterned with a photo resist layer 37 and etched to form holes 45, 47 in the SiNi layer above the inverted MP contact and above the resistive film layer (step L). A metal layer (LMET) such as, for example, Nichrome or TiW may then be deposited over the nitride layer 8 and through the holes 45, 47 to contact the resistive film layer 21 and the top of MP contact 188 through the holes in the nitride layer (step M). The leg metal layer 9 is then patterned and etched according to any of the above described processes for providing any of the above-described leg metal structures such as, for example, the self-aligned leg metal structure to form the legs 38, 40 having the dimensions described above (step N).

An additional layer of nitride 22 such as, for example, SiNi may then be deposited over the structure (step O). It is to be appreciated that although not illustrated in the FIG. 22, an additional thin film metal absorbing layer 23 (see FIG. 12) may be optionally deposited on top of the active area 32 on the upper microbridge level. Slots or windows are then opened within the SiNi layer 20, 8, and 22 to provide access to the easily soluble phos-glass layer 180 beneath the SiNi layers 20, 8 and 22 (step P). The phos-glass 180 is then removed from beneath the upper bridge level 11 to provide the detector structure 10 having any one of the above-described leg metal structures 38, 40 and the inverted MP contact down to the contact pad 43.

According to another embodiment of the uncooled infrared sensor 104 (see FIG. 1) of the present invention, any of the above-described detector devices 10 can be placed in the FPA 102 and configured as shown in FIG. 23 to share a single contact such as, preferably, the inverted MP contact 188 between two of the detector devices. This provides an additional space saving within the FPA. It is to be understood that this embodiment of the FPA sharing a single contact between two detector devices will be termed a "single-contact per pixel" design. In order to provide a single contact per pixel FPA, circuitry may be provided within the ROIC 15 (see FIG. 1) that switches between each of the detectors associated with each shared contact. Access to any of the column circuitry 92 discussed above (see FIG. 2) through any shared contact may go through for example, a multiplexer (not illustrated) disposed within the ROIC that performs this switching function. An advantage of this embodiment of the FPA is that it minimizes the is effect of either contact 188, 190 defects or the conductor leg defects; without such circuitry, for example, an entire column may not be usable when there is a single defect within a column of the FPA. In contrast, the single contact per pixel design FPA reduces the amount of space required in the FPA and allows any contact defect to be limited to a particular pair of detectors that share the contact.

FIG. 24 illustrates another embodiment of a FPA 102 using another embodiment of a leg design 38', 40' that can be used with any of the above-described detector devices 10. It is to be understood that this embodiment will be referred to as the "folded leg" design. In this embodiment, the legs 38', 40' from the upper bridge level 11 (see FIG. 12) down to, for example, the MP contact 188 discussed above are folded to maintain a desired leg length l, so as to provide the thermal isolation, the desired time constant $t_c$ and to provide a better fill factor. In particular, the folded legs 38', 40' permit an aspect ratio L/W of the active area 32 to be greater. It is to be understood that the aspect ratio of the active area is the length L divided by the width W of the active area. The folded legs 38', 40' of this embodiment allow the active area to be shaped such as, for example, as illustrated in FIG. 24 in the form of rectangle, which has about a 2-to-1 aspect ratio. In contrast, the above-described embodiments of detectors 10, 100 have been illustrated with approximately 1-to-1 aspect ratio for the active area 32, or, in other words, approximately a square shaped active area. The increased aspect ratio allows the resistance of the detector device to be increased by a factor of two. An advantage of increasing the resistance of the detector is that the sensitivity of the detector device is increased proportionally to the increased resistance. Therefore, for example, by increasing the aspect ratio by two, the sensitivity of this embodiment detector device 10 of the uncooled IR sensor can be doubled.

In still another embodiment of any of the detector devices 10, 100 described above, an overall operating band width or wavelength band of operation of the detector device can be increased, for example, by adding an additional layer of, for example, $VO_x$ to the active area 32 of the detector device. FIG. 25 illustrates a graph of an Absorptance(%) versus wavelength (in μm) of the above-described detector device 10 (see FIG. 12) without the added layer of $VO_x$ 72 and with the added layer $VO_x$ 73. It can be seen from FIG. 25 that with the additional layer of $VO_x$, the wavelength band of operation is increased from, for example, approximately 8 to 14 microns as illustrated for curve 72, to approximately 4-14 microns as illustrated for curve 73. This increased wavelength band of operation may allow any of the uncooled IR sensor devices to be used, for example, over two wavelength bands of operation. In particular, the uncooled IR sensor may be used, for example, in threat warning applications to provide a higher probability of detection and reduced false alarm rates by using the uncooled IR sensor over two separate and distinct wavelength ranges of operation such as, for example, 10 to 14 μm and 4 to 8 μm. Such operation of the device 104 helps to eliminate a problem called contrast inversion which typically results when various targets that have different temperatures and emissivities have the same radiant emittence in a spectral band of operation. Therefore, an advantage of this embodiment of the uncooled IR sensor including the wider band detector device is that it can be used over such separate wavelength bands of operation to improve performance by reducing false alarms and providing a higher probability of detection.

Any of the above described detector devices can be placed in an array thereby forming the FPA 102 (see, for example, FIG. 10). It is to be understood that any of the microbridge detector devices discussed above can be used in the FPA of FIG. 10. In one embodiment of the present invention, an array of such detectors includes 480 detector devices disposed in rows along the y direction by 640 detectors disposed in a columns along the x direction, wherein each detector or pixel device covers an area or pitch of about 28 microns on a side. The semiconductor array operates over the IR wavelength range of 8-14 μm, and has an IR sensitivity of at least 80%.

As discussed above with respect to FIG. 1, the FPA 102 can be used in an uncooled infrared sensor 104 such as is illustrated in FIG. 1. The uncooled IR sensor provides a two-dimensional, real-time display of an image for an operator of the uncooled IR sensor to view. For example, in an preferred embodiment of the uncooled IR sensor of the present invention, the uncooled IR sensor is configured to operate over at least one IR wavelength band of interest. With the uncooled IR sensor of the present invention, the operator can view thermal signatures of objects and/or scenery under conditions where the human eye would not necessarily be able to see the objects and/or scenery. For example, the uncooled IR sensor may be used at night, in the day without washout conditions, in the presence of smoke, in degraded weather conditions and the like. One embodiment of an uncooled IR sensor of the present invention is a head mounted imaging system 120 as illustrated in FIGS. 26a, 26b and 26c. FIG. 26a illustrates a helmet mounted configuration of the head mounted uncooled IR sensor, and FIG. 26b illustrates a goggle configuration of the head mounted uncooled IR sensor, and 26c is an enlarged view of the uncooled IR sensor by itself.

FIG. 27 illustrates a block diagram of the head mounted uncooled IR sensor 120 of FIGS. 26a, 26b and 26c. It is to be appreciated that parts similar to the uncooled IR sensor illustrated in FIG. 1 have been identified with similar reference numbers and any description of these parts is not repeated here. With the head mounted imaging system of FIG. 27, an electromagnetic signal may be focused by the optics 106 onto the focal plane array 102. The focal plane array 102 may be temperature stabilized as discussed above, with the aid of temperature stabilizing circuitry 124 contained within the FPA assembly. The focal plane array 102 may convert the focussed signals into sensed signals and may output the plurality of the sensed signals to the focal plane array processor 108. The focal plane array processor may amplify and digitize each of the plurality of sensed signals with a preamplifier and analog-to-digital converter 126, and may output the plurality of processed signals to the display processor 110. The focal plane array processor may also include a programmable logic device (PLD) 128 that processes the plurality of processed signals to correct any offsets or gain differences between the plurality of processed signals, to eliminate any bad signal data and to equalize the data, as discussed above. It is to be appreciated that these functions may be done with any combination of hardware and software, as discussed above, and such modification is intended. The display processor may reformat the corrected signals and convert the corrected signals to an analog signal via the digital-to-analog converter 130, so that the analog signal is in a format suitable for display. The display processor 110 may also include a symbology generator 125 for providing symbols on the display. The display driver 132 may then output the analog signal to the display 112 for display to the user.

As discussed above, the controller 114 may provide automatic and/or manual control of the display processor 110 to provide automatic and/or manual adjustment of the uncooled IR sensor 104 and of various display parameters. The controller of the head mounted system 120 may include switches 115 in a control panel, and a microprocessor 117. In addition, the supply electronics 116 may include batteries 119, or a connector for external power 121, as well as power conditioning circuitry 123.

In a preferred embodiment of the head mounted system 120, the focal plane array 102 may be operated in at least one IR wavelength band, for example over the 8-14 μm range. In addition, the display 112 may be either a one-eye or two-eye display for the system user, and may be adjusted with the aid of the controller 114. In the preferred embodiment, the focal plane array processor 108 and the display 112 may be mounted in the helmet or within the face-mounted goggles. In addition, the display processor 110, the controller 114, and the supply 116 may be provided in a unit that can be vest mounted. However, it is to be appreciated that any variation known to one of skill in the art, such as for example, mounting each of the above in the helmet or goggles, is contemplated and intended to be within the scope of the present invention.

An advantage of the head-mounted imaging system 120 of the present invention is that it is a self-contained, portable unit having a reduced size, weight and power consumption. In particular, the focal plane array 102 does not require cooling, or mechanical scanners or choppers as required by prior art devices. In addition, the preferred embodiment of the head-mounted system may not include a shutter (see FIG. 1) and instead, may use the manual or automatic optics and defocused scene to calibrate the sensor, as discussed above. The head mounted system may operate in darkness, in the daytime without washout conditions in contrast to prior art devices that use an image intensifier tube, can penetrate smoke, and the like. Thus, for the reasons discussed above with respect to the detector device and the focal plane array, the head mounted system has an improved reliability and sensitivity as compared to prior art devices.

Another embodiment of an uncooled IR sensor of the present invention is a hand-held imaging system such as is illustrated in FIGS. 28*a*, 28*b* and 28*c*. The hand-held imaging system may be a monocular system 134 such as illustrated in FIG. 28*a* or a binocular system 136 such as illustrated in FIGS. 28*b* and 28*c*. It is to be appreciated that parts similar to the uncooled sensor of FIG. 1 are labeled with similar reference numbers, and any description of these elements is not repeated. The monocular system of FIG. 28*a* may include a window 127 having an optical filter 122 disposed in front of the IR optics 106, and a focus ring 129 that focuses the incident electromagnetic radiation onto the IR optics. In addition, the display 112 may include an eye piece 131 which acts in combination with a CRT or FPD 133 to provide the display. The eye piece display 112 may also have a diopter adjustment 135, and a focus knob 137, as known to one of skill in the art. In a preferred embodiment of the hand-held imaging system of FIGS. 28*a*, 28*b* and 28*c*, the supply electronics 116 may be a battery, and the focal plane array may operate over at least one IR wavelength range to yield a long range IR telescope or binoculars that can be used in darkness, in daylight, to penetrate smoke, and the like. The long range telescope and binoculars are self-contained units having a reduced side, weight and power consumption, while providing an increased reliability and sensitivity.

A further embodiment of an uncooled IR sensor of the present invention is a weapon sight 140, such as is illustrated in FIGS. 29*a*-29*b*. FIG. 29*a* illustrates a top view of the weapon sight according to the present invention, and FIG. 29*b* illustrates a block diagram of the weapon sight. It is to be appreciated that parts similar to the uncooled IR sensor of FIG. 1 are identified with similar reference numbers, and any description thereof is not repeated. The weapon sight may also include a cover 139 that covers the lens 106, a focus ring 129 for adjusting the focus of the focused signals from the lens 106 onto the focal plane array 102, a compass 141, and a global positioning system (GPS) antenna 143. The display processor 110 may include additional electronics for processing the GPS signal and the compass information. In a preferred embodiment of the weapon sight of FIGS. 29*a*-29*b*, the optical lens 106 may also include a filter, the supply electronics 116 may be batteries, and the display 112 may include the eye piece, a CRT or FPD 133, and a focus adjustment knob 135. The preferred embodiment may be operated in at least one desired IR wavelength band of interest to provide a long-range weapon sight, such as a rifle mount, that can be used to penetrate darkness, to penetrate smoke, can be used in the daytime, and the like. The weapon sight 140 may be a self-contained unit having a reduced size, weight, and power consumption, while providing an increased reliability and sensitivity.

Still another embodiment of an uncooled IR sensor of the present invention is a miniature camera/recorder (hereinafter a "camcorder") such as is illustrated in FIGS. 30*a*-30*b*. FIG. 30*a* illustrates a cross-sectional view of the camcorder, and FIG. 30*b* is a block diagram of the camcorder. It is to be appreciated that parts similar to the uncooled IR sensor of FIG. 1 are identified with similar reference numbers, and any description thereof is not repeated. The camcorder may include a recorder 152 for recording signals on a suitable recording medium 154. It is to be appreciated that the recording medium can be any recording medium known to one of ordinary skill in the art such as, for example, a magnetic recording tape of a VHS, 8 mm, or BETA format. In a preferred embodiment of the camcorder, the display 112 may include a view finder 145 as well as a CRT or FPD 133. In addition, in the preferred embodiment the supply electronics 116 may be a rechargeable battery pack, and the controller 114 may include control knobs 147 and electronics for rewinding, fast forwarding, and playing back the recording medium. The camcorder may be used in at least one IR wavelength band of interest to provide a long-range camcorder that can be used at night, in the daytime, to penetrate smoke or inclement weather, and the like. In addition, the camcorder may be a self-contained unit having a reduced size, weight and power consumption and also having an increased reliability and sensitivity.

Yet another embodiment of an uncooled IR sensor of the present invention is a microscope 160 such as is illustrated in FIGS. 31*a*-31*b*. FIG. 31*a* illustrates a side elevational view of the microscope and FIG. 31*b* illustrates an operational block diagram of the microscope. It is to be appreciated that parts similar to the uncooled IR sensor of FIG. 1 are identified with similar reference numbers and that any description thereof is not repeated. The microscope may include a microscope base 153 having a position adjuster 155, and a specimen or integrated circuit mask 151 which is backlit by a light source 149, as is known to those of skill in the art. In a preferred embodiment of the microscope, the display 112 may include a CRT or FPD 133, the controller 114 may include manual control knobs 147 and the optics 106 may include a front surface mirror 157. The microscope can be used over at least one IR wavelength band of interest, for example, from 8-12 μm, with the aid of filter 159 to provide multi-spectral images with the microscope.

Still, another embodiment of an uncooled IR Sensor of the present invention is the imaging radiometer/spectrometer such as is illustrated in FIGS. 32*a*-32*b*. FIG. 32*a* illustrates a cross-sectional view of the imaging radiometer/spectrometer 171, and FIG. 32*b* illustrates a block diagram of the imaging radiometer/spectrometer. It is to be appreciated that parts similar to the uncooled IR sensor of FIG. 1 are identified with similar reference numbers and any description thereof is not repeated. In the imaging radiometer/spectrometer, the lens 106 can be either one of a spectral-splitting lens 172, which may be used to provide a spectrometer, and an imaging lens 174 that may be used to provide the radiometer. The imaging radiometer may be used to measure a temperature of a scene on which the radiometer is focused, and the spectrometer may be used to measure an energy or power emitted by the scene as a function of the wavelength at which the scene is emitting the electromagnetic signal.

The radiometer/spectrometer may also include a lens mount 161 for mounting either of the spectral-splitting lens 172 and the imaging lens 174, and a tripod mount 163 for mounting the radiometer/spectrometer to a tripod. In the preferred embodiment of the radiometer/spectrometer, the display 112 may include a CRT or FPD, the controller 114 may include manual control knobs 147, and the supply electronics may include rechargeable batteries 164 as well as a 110 volt AC connector 165. The radiometer/spectrometer can be used in at least one IR wavelength band of interest at night, in the daytime without washout conditions, to penetrate smoke, and to penetrate inclement weather. The radiometer/spectrometer is a self-contained unit having a reduced size, weight and power consumption while also having an increased reliability and sensitivity.

As discussed above, any of the uncooled IR sensors have the capability of seeing through smoke which is often impervious to the human eye. Accordingly, one application of any of the above-described uncooled IR sensors is for use in fire fighting. The uncooled IR sensor 104 (see FIG. 1) of the present invention offers the fire fighter the ability to enter a smoke filled building and see through the smoke, through doorways, the fire location, and the like to locate fire victims under circumstances where the fire fighter might normally not have any visibility. For example, the fire fighter may use the head mounted embodiment of the uncooled IR sensor of the present invention as discussed above and illustrated in FIGS. 26a, 26b and 26c.

One problem that may result from using any of the above-described uncooled IR sensors for the fire fighting application is that the equipment may be exposed to intense heat such as is encountered in fire fighting and other hot environments, and the resulting change in the operating ambient temperature may obscure the actual signal information of interest. Overheating of the sensor may also reduce the operating lifetime of the uncooled IR sensor. Accordingly, the housing of any of the above-described uncooled IR sensors when to be used in hot environments, may be made of fire resistant materials and/or cold shielded, as discussed above, so that the sensor can continue to operate in such high temperature environments. One example of a fire resistant housing may include a housing having double walls with the region between the double walls of the housing containing an insulated material. The insulating material may slow the transfer of heat from an outer wall of the double walls to an inner wall of the double walls of the housing. Another embodiment of a housing may include a heat sink 175 such as illustrated in FIG. 3 and known to those of skill in the art, disposed within the FPA assembly 90 that helps to prevent the electronics from over-heating. Still another embodiment may include a material which undergoes a phase change from, for example, a solid to a liquid or a liquid to a gas to a function of temperature. A housing made of such phase change material may reach a certain temperature threshold, and the housing may begin to go through the phase change and absorb heat from, for example, the electronics and to thereby retarding additional temperature rising of the electronics, and thereby extending the operating life of the uncooled IR sensor. The phase change material may also be provided within any of the above-described uncooled IR sensors as an insert module that is thermally connected to the electronics to be protected and that is either removable or permanently affixed to such electronics. For example, the phase change material may be attached or made part of the removable battery so that it can be replaced with a fresh battery and a new phase change insert when, for example, the battery is to be replaced.

One advantage of using any of the above-described uncooled IR sensors for the fire fighting application is that the sensor can be used to detect hot regions and may present a colorized display, as opposed to a black and white display, image of any hot regions observed with the sensor to the operator. For example, a specified color can be is provided for any region above a specified temperature. This feature may be used, for example, to indicate that a certain object is about to combust. In addition, another advantage of using the above described uncooled IR sensors for the fire fighting application is that the detector devices described above are DC coupled and therefore can be mapped to a display for example with the equalization controller 58 (see FIG. 4), as discussed above, to provide both a positive and a negative temperature dynamic range that may be viewed with the sensor. In particular, because the sensor is DC coupled, the above-described sensors allows a viewer to simultaneously view hot objects and cold objects within a same scene, as may be necessary, for example, for a fire fighter to move within a smoked filled room without running into hot objects such as for, for example, a fire, or a wall or a ceiling behind which there is a fire, or to find cold or warm objects such as, for example, an unconscious fire victim. Further another advantage of the uncooled sensor is that the uncooled IR sensors may automatically adjust, as described above, the operating point or temperature of the sensor to compensate for increases in background or scene temperature thereby enabling further increases in the operating temperature dynamic range of the uncooled IR sensor. Furthermore, the automatic or a mechanical iris such as, for example, the electronic shutter or the manually focusable optics may further help to reduce the amount of optical energy incident on the FPA and to thereby enable a broader dynamic range of signals to be processed with the uncooled IR sensors without saturating the uncooled IR sensor. Moreover, the uncooled IR sensors have the ability to adjust the integration time of the FPA assembly as described above to, for example, less than 16.6 milliseconds or in other words so the system may operate at a 60 Hz frame rate. The short integration time may be a way to reduce the amount of incident energy on the FPA and to extend the operating dynamic range of the uncooled IR sensors for such an environment. Still another advantage of using the above described uncooled IR sensors for this application may be that the sensor allows hands-off operation and adjustment, either automatically or manually, of the displayed signal to present an optimum image to the fire fighter.

Another application for which any of the above-described uncooled IR sensors may be used is for border surveillance of, for example, the U.S.-Mexico border. In particular, FIG. 33 illustrates a border surveillance system 177 according to an embodiment of the present invention. The border surveillance system may have a plurality of uncooled IR sensors 199, mounted on poles ($P_1$, $P_2$, $P_3$ . . . ) and interfaced to, for example, a command post 178 to monitor the border 179 for any human, or vehicular passage across the border. It is to be understood that although in FIG. 33 three sensors are illustrated, it is contemplated that many more sensors may be disposed along the border. Each sensor may be provided on a pole to provide the sensor at a certain altitude and to obtain a certain field of view ($FOV_1$, $FOV_2$, $FOV_3$ . . . ) with each sensor. As illustrated in this FIG. 33, the sensors may be disposed so that their fields of view overlap and so as to supply redundant information with each sensor. It is to be appreciated that although the border as shown in FIG. 33 is illustrated as the U.S.-Mexico border, the border surveillance system may be used at any border and the sensors need not be disposed directly at the border but can be disposed anywhere such an application of this system is desired.

Each sensor may be coupled via cabling 181 to command post 178. The command post may have a plurality of displays 183, 185 and 187 that may display any of humans, vehicles and the like and the location at which they may be crossing the border. Any of the sensor signals can be reviewed on the displays, for example, by National Guard or Border Patrol personnel.

One advantage to using any of the above-described uncooled IR sensors for this application is that the sensors can be calibrated to detect when a person at a temperature of, for example, approximately 98° is within the field of view of the sensor. In particular, referring to FIG. 34, each sensor may be provided with a processor 186 that searches for a human target at such a temperature. If a person crosses within the FOV of any of the plurality of sensors, an alarm signal 178 may be provided by the sensor to the command center 178. In particular, each sensor may have a memory including a matched filter 189 of a typical thermal signature of a human being. The matched filter 189 patterns are correlated to the image resulting within the sensor display pixels, and is used to identify the portions of the array display that highly correlate to a human target. A similar matched filter can be disposed within the sensor for other expected images such as, for example, vehicles 191 and animals 193. This matched filter information is useful for is statistical optimization of the sensors and so as to prevent any false alarms. The sensor may also include a video processor 195 that include components of either or both of the FPA processor 108 and the display processor 110, discussed above. The sensors, after identifying a target, send the alarm signal on line 187 and video information on line 194 to the command center which displays the target on the display 183, 185 and 187, thereby identifying the object and the particular location along the border where the target has crossed the border. The information can then be used in whatever manner desired by the Border Patrol such as, for example, to dispatch a team to the location to prevent illegal immigrants from crossing the border. It is to be appreciated that the command center can be located at a command post along the border, at a remote location, or even tied to the Internet for remote monitoring and so that the information can be monitored by any of a plurality of end users.

FIG. 35 illustrates one embodiment of an uncooled IR sensor 199 disposed on a pole P1 as discuss above. The sensor may include automatically controlled zoomable optics 106 that may be controlled remotely, for example, by a computer or automatically via the automatic zoom as discussed above. In addition, the sensor preferably includes an all weather encasement 196.

In one embodiment of the uncooled IR sensor 199 of the border surveillance system 177 of this invention, the sensor is calibrated and focused so that a person may take up one pixel of resolution. It is to be appreciated that a person can be imaged or detected with less than one pixel of resolution or with a plurality of pixels of resolution and that such modifications are intended. Accordingly, in this embodiment where the FPA 102 has an array of 328×246 pixels or detectors, the area that can be viewed with the sensor may cover about 327 people in the horizontal dimension along the border for a single uncooled IR sensor. If a typical person is approximately 1½ feet wide, then the width dimension that each sensor may cover is about 500 feet along the border. Accordingly, at least 10 sensors may be needed for every mile along the border. However, since the average person is approximately 6 feet high and since the FPA may also be 246 pixels in height, in reality only the height dimension need be monitored. Therefore, by using the height dimension for sensing an image, the number of sensors required along the border may be reduced by a factor of approximately four. Moreover, this factor can be reduced even more such as, for example, by a factor of two if any redundancy is removed so that the sensors no longer overlap their fields of view. Accordingly, a minimum number of sensors along a 1,000 mile border may be on the order of approximately 1,250 sensors. It is to be appreciated that any number of sensors may be used including a greater number or a lesser number depending upon the resolution and coverage desired and such modifications are intended.

In the preferred embodiment of the border surveillance system of the invention, each sensor should be spaced apart at such a distance that the overall system is able to detect that there is a person or a vehicle crossing the border at a given location and prevent a false alarm due to, for example, an animal crossing the border. The range for which a sensor is to be used determines its resolution. Accordingly, the number of cameras may be chosen to ensure that the resolution equals or exceeds the desired resolution at the border. Alternatively, the preferred embodiment may also introduce distortion into the optics so that the FOV is the same remotely from the camera as it is at the camera. Still another manner for varying the resolution achievable with each sensor 199 is to vary the pixel sizes along the width of the FPA, wherein they are greater in the middle of the array and smaller at the edges of the array. In order to satisfy the Nyquist criteria, it is preferred that at least 0.75 cycles per object are covered, so that 1.5 pixels are dedicated to each object. However, more cycles and thus less pixels can be used for an object standing still.

Still another application for any of the above-identified uncooled IR sensors may be to view the "limb", or in other words, the earth's atmosphere, from an orbiting satellite looking tangentially to the earth's surface, or above the earth's surface as illustrated in FIG. 36. A limb sounder, as is known to those of skill in the art is used to detect gas constituents such as, for example, CO, at known distances from the sensor thereby creating a picture of the gas contents at a particular depth from the sensor. In particular, the limb sounder looks with tangential scans 220, 222, 224, 226 as the satellite on which the limb sounder is mounted orbits the earth. FIG. 36 illustrates limb sounding with the satellite at three different orbital positions 221, 223, 225. The sensor can be operated in a manner such that a one time instance a frame is captured by the sensor for a measurement at a particular depth from the sensor. As the satellite moves around the earth in orbit and a right fraction of a second later, another frame is then captured. The next row or column of the FPA then views the same limb sample as was previously viewed in the prior frame, and the samples can be added and averaged to provide an averaged signal. The limb sounder may be used, for example, by a weather satellite to determine how much ozone is at the earth's surface, or how much $CO_2$ is created from, for example, by burning the rain forest in South America, and the like. An advantage to using any of the above-identified uncooled IR sensors in this application is that the sensing is done in the IR wavelength range. In addition, because the sensor need not be cooled, less space and power constraints are required with the uncooled IR sensors of the present invention. In addition, the atmosphere also provides natural cooling of the sensors thereby improving their performance.

FIG. 37 illustrates a block diagram of a uncooled IR sensor 230 that may be used for limb sounding. It is to be appreciated that parts similar to the uncooled IR sensor 104 of FIG. 1 are given like reference numerals and that any discussion with respect to these parts is eliminated. The sensor may include, a steering mirror 231 that is moved by motor 232 to focus the FOV of the sensor that is presented to optics 106 and the FPA 103. The steering mirror may provide various views such as a limb view wherein the device is being used as a sounder, and a space view wherein the device is looking at space to be used as a cold body for calibration. In addition, the sensor may include a black body calibrator 235 that presents a uniform scene to the sensor optics and FPA so the sensor can be calibrated, as discussed above. The sensor can also be placed in the black body viewing position in certain orbit positions to protect the optical filters and detectors when the sun would be within the limb view. Thus the steering mirror 231 provides several functions including: periodic on board calibration of a black body, space viewing, viewing over the poles off the velocity vector and fast response rejection of a direct view of the sun. The sensor may also include a band pass filter assembly 236 which is preferably a filter wheel that spins at a constant velocity under control of motor 237 so as to provide measurement of a plurality of narrow vertical resolution cells ng a same field of view.

The band-pass filter wheel may provide four optical channels, two $CO_2$ temperature channels, one ozone channel and one window channel. It may consist of four multi-layer interference filters on a germanium substrate mounted in the filter wheel. The sensor may view the limb through the filters, with an immediately time-adjacent view of the black body calibrator through the same filter, so as to track the drift of the sensor.

The sensor may also include the control electronics 114 and the signal processing electronics 102, 110 as discussed above with respect to FIG. 1. The signal processing electronics perform offset, gain, and correction as discussed above. The control electronics sample housekeeping data and provide closed-loop control of the steering mirror, an aperture cover door 238, the filter wheel 236 and motors 232, 237. The thermal electric cooler 34 provides temperature control to the FPA and to the band-pass filter assembly for accurate calibration and for accurate measurements.

In one embodiment of the limb sounder 230 of the present invention, a fully baffled 3-element optical system provides viewing of the limb from 10 km below the earth's surface to a 60 km altitude above the earth's surface. This view is taken with the FPA having 245 columns of detectors and 327 rows of detectors to yield a total focal plane array size of 11.33 mm by 15.1 mm. An image size can be narrowed on the FPA to provide 188 pixels of resolution in azimuth by 3 pixels of resolution in elevation, or in other words a total picture image size of 8.7 mm by 2.43 mm. The filter wheel may be rotated at a rate of 75 revolution-per-minute (RPM). The filter may be temperature controlled to within 1° K. The FPA sensor produces a single video of 14-bit words at 60 Hz. The words from a contiguous region of the focal plane are typically combined to provide a subtended limb viewing area typically 250 km wide by 4 km high.

The limb sounding sensor of the present invention thereby provides good ozone profiles at an affordable cost and at a low weight. In particular, the limb sensor embodiment includes provisions for on-board calibration, signal processing of the FPA output and steering of the field of view to obtain 100% earth coverage.

Having thus described several particular embodiments of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the following claims and the equivalents thereto.

What is claimed is:

1. A microbridge detector, comprising:
   a semiconductor substrate;
   a microbridge disposed above the semiconductor substrate, the microbridge comprising an active area and a pixel collection area, the pixel collection area being an area of the microbridge that receives energy that is conveyed to the active area, wherein the microbridge detector is constructed and arranged such that, for incident IR radiation normal to the microbridge, the active area is smaller than the pixel collection area;
   downwardly extending leg portions which are a continuation of the microbridge and which support the microbridge above the semiconductor substrate so that a thermal isolation gap exists between the microbridge and the semiconductor substrate; and
   electrically conductive paths included within said downwardly extending leg portions connecting the active area to the semiconductor substrate.

2. The microbridge detector of claim 1, wherein the active area further comprises an infrared (IR) absorbing layer.

3. The microbridge detector of claim 2, wherein the active area is configured to absorb incident IR radiation and convert the absorbed IR radiation into heat.

4. The microbridge detector of claim 1, wherein the active area does not comprise an IR absorbing layer.

5. The microbridge detector of claim 1, wherein the active area is configured to change resistance in response to a change in temperature.

6. The microbridge detector of claim 1, further comprising a reflector, disposed between the active area and the substrate, the reflector being configured to reflect radiation towards the active area to enhance an absorption efficiency of the detector.

7. The microbridge detector of claim 1, wherein the active area is patterned with alternating absorption regions and transmissive windows.

8. The microbridge detector of claim 1, wherein each of the pixel collecting area and active area has a length, and wherein the length of the pixel collecting area is greater than or equal to twice the length of the active area.

9. The microbridge detector of claim 1, wherein the electrically conductive paths have a length such that a thermal time constant of the microbridge detector is substantially the same as that of a microbridge detector having an active area substantially equal to the pixel collection area of the microbridge detector.

10. A microbridge detector, comprising:
    a semiconductor substrate;
    a microbridge disposed above the semiconductor substrate, the microbridge comprising an active area and a pixel collection area, the pixel collection area being an area of the microbridge that receives energy that is conveyed to the active area, and wherein the microbridge detector is constructed and arranged such that, for incident IR radiation normal to the microbridge, the active area is smaller than the pixel collection area;
    downwardly extending leg portions which are a continuation of the microbridge and which support the microbridge above the semiconductor substrate so that a thermal isolation gap exists between the microbridge and the semiconductor substrate; and electrically conductive paths connecting the active area to the semiconductor substrate.

11. The microbridge detector of claim 10, wherein the active area further comprises an IR absorbing layer.

12. The microbridge detector of claim 11, wherein the active area is configured to absorb incident IR radiation and convert the absorbed IR radiation into heat.

13. The microbridge detector of claim 10, wherein the active area does not comprise an IR absorbing layer.

14. The microbridge detector of claim 10, wherein the active area is configured to change resistance in response to a change in temperature.

15. A microbridge detector, comprising:

a semiconductor substrate;

a microbridge disposed above the semiconductor substrate, the microbridge comprising an active area and a pixel collection area, the pixel collection area being an area of the microbridge that receives energy that is conveyed to the active area, and wherein the microbridge detector is constructed and arranged such that, for incident IR radiation normal to the microbridge, the active area is smaller than the pixel collection area;

downwardly extending leg portions which are a continuation of the microbridge; and electrically conductive paths included within said downwardly extending leg portions connecting the active area to the semiconductor substrate.

16. The microbridge detector of claim 15, wherein the active area further comprises an IR absorbing layer.

17. The microbridge detector of claim 16, wherein the active area is configured to absorb incident IR radiation and convert the absorbed IR radiation into heat.

18. The microbridge detector of claim 15, wherein the active area does not comprise an IR absorbing layer.

19. The microbridge detector of claim 15, wherein the active area is configured to change resistance in response to a change in temperature.

* * * * *